US012733286B2

(12) United States Patent
Iwata et al.

(10) Patent No.: US 12,733,286 B2
(45) Date of Patent: Sep. 8, 2026

(54) PHOTOELECTRIC CONVERSION APPARATUS, PHOTOELECTRIC CONVERSION SYSTEM, AND MOBILE BODY

(71) Applicant: CANON KABUSHIKI KAISHA, Tokyo (JP)

(72) Inventors: Junji Iwata, Tokyo (JP); Kazuhiro Morimoto, Kanagawa (JP); Yu Maehashi, Tokyo (JP); Yoshiyuki Hayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 494 days.

(21) Appl. No.: 18/356,954

(22) Filed: Jul. 21, 2023

(65) Prior Publication Data

US 2023/0369373 A1 Nov. 16, 2023

Related U.S. Application Data

(63) Continuation of application No. PCT/JP2022/001046, filed on Jan. 14, 2022.

(30) Foreign Application Priority Data

Jan. 22, 2021 (JP) ................................ 2021-008439
Jan. 5, 2022 (JP) ................................ 2022-000316

(51) Int. Cl.

| | |
|---|---|
| ***H10F 39/00*** | (2025.01) |
| ***H04N 25/705*** | (2023.01) |
| ***H04N 25/75*** | (2023.01) |
| ***H10F 30/225*** | (2025.01) |

(52) U.S. Cl.
CPC ......... *H10F 39/811* (2025.01); *H04N 25/705* (2023.01); *H10F 30/225* (2025.01); *H04N 25/75* (2023.01)

(58) Field of Classification Search
CPC ....... H04N 25/773; H04N 25/79; H10F 39/12
See application file for complete search history.

(56) References Cited

U.S. PATENT DOCUMENTS

| | | | | |
|---|---|---|---|---|
| 2015/0115131 | A1 | 4/2015 | Webster | |
| 2018/0270405 | A1* | 9/2018 | Ota | H10F 77/959 |
| 2018/0286910 | A1* | 10/2018 | Kobayashi | H10F 39/802 |
| 2021/0314516 | A1* | 10/2021 | Yonemoto | H10F 39/12 |

FOREIGN PATENT DOCUMENTS

| | | | |
|---|---|---|---|
| JP | 2013232647 | A | 11/2013 |
| JP | 2014107448 | A | 6/2014 |
| JP | 2020115575 | A | 7/2020 |

(Continued)

*Primary Examiner* — William B Partridge
*Assistant Examiner* — Felix B Andrews
(74) *Attorney, Agent, or Firm* — Canon U.S.A., Inc. IP Division

(57) ABSTRACT

An apparatus includes a first substrate having a plurality of avalanche diodes, a second substrate having a plurality of pixel circuits, and a third substrate having a signal processing circuit. The second substrate and the third substrate are stacked in such a manner that a third wiring structure is provided between two semiconductor layers of the second substrate and the third substrate. The apparatus includes first through-hole wiring going through the semiconductor layer of the third substrate.

16 Claims, 48 Drawing Sheets

(56) References Cited

FOREIGN PATENT DOCUMENTS

| | | | | | |
|---|---|---|---|---|---|
| JP | 2020141122 | A | | 9/2020 | |
| JP | 2021002542 | A | | 1/2021 | |
| WO | 2011077580 | A1 | | 6/2011 | |
| WO | 2018186197 | A1 | | 10/2018 | |
| WO | WO-2018186192 | A1 | * | 10/2018 | ............ H04N 25/70 |
| WO | 2019146723 | A1 | | 8/2019 | |
| WO | 2020045122 | A1 | | 3/2020 | |

* cited by examiner

FIG. 6A
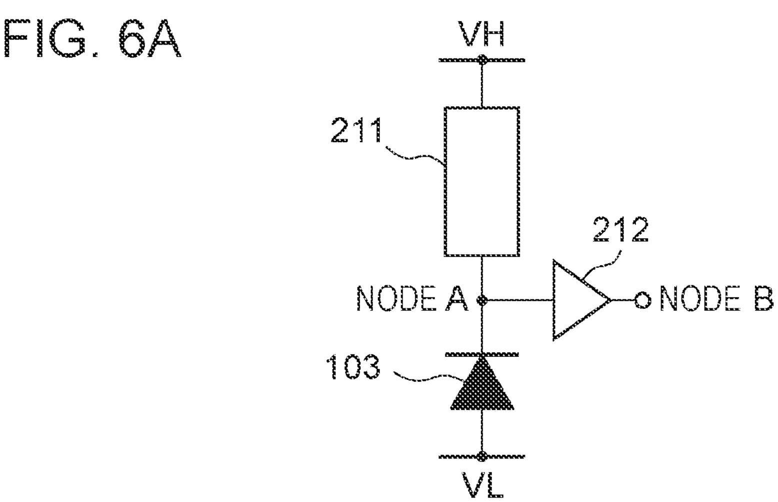
FIG. 6B
FIG. 6C
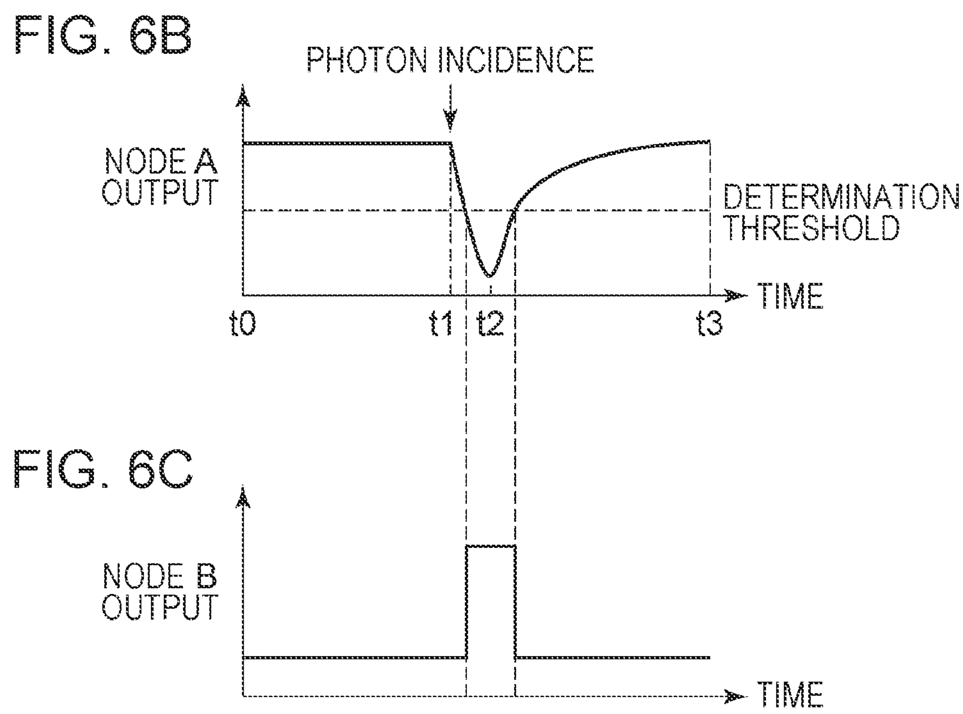

CONDUCTOR CONTAINING ALUMINUM AS ITS CHIEF CONSTITUENT
CONDUCTOR CONTAINING TUNGSTEN AS ITS CHIEF CONSTITUENT
CONDUCTOR CONTAINING COPPER AS ITS CHIEF CONSTITUENT
1010
1020
2020
2010
2030
3020
3010
3030
1040
2040
2022
2021
2011
2012
1032
1011
1012
1013
1014
1015
1031
4300
M1
M2
M3
M4
5040
5050
4031
3011
3012
3022
3021
5120
5110
5030
5070
5031
1110
1120
2120
2110
2130
3120
3110
1100
2100
3100
P2
P5
P3
P4

12
13
1010
1020
1022b
1023b
1040b
2040b
2020
2023b
2022b
2010
2030
3020
3010
3030
5130
351
352
5140
5010
251
5040
252
5050
353
2023a
2022a
2040a
1040a
2021a
4031
3011
3012
5120
1032
1011
1012
2011
2012
1013
5110
3022
3021
1022a
1023a
354
1021a
5140
5030
253
1014
1015
5140
5020
355
1031
1110
1120
2120
2110
2130
3120
3110
1100
2100
3100

11200
11201
11202
11203
DIAPHRAGM
11204
PHOTOELECTRIC CONVERSION APPARATUS
11205
SIGNAL PROCESSING UNIT
11206
BUFFER MEMORY UNIT
11207
TIMING GENERATION UNIT
11208
OVERALL CONTROL AND CALCULATION UNIT
11209
EXTERNAL I/F UNIT
COMPUTER
11210
STORAGE MEDIUM CONTROL I/F UNIT
11211
STORAGE MEDIUM 13003
13131
13110, 13112
13132
13133
13100
13101
13102
13121
13134
CCU
LIGHT SOURCE DEVICE
INPUT DEVICE
TREATMENT TOOL CONTROL DEVICE
13136
13135
13203
13137
13138

PHOTOELECTRIC CONVERSION APPARATUS, PHOTOELECTRIC CONVERSION SYSTEM, AND MOBILE BODY

CROSS-REFERENCE TO RELATED APPLICATIONS

This application is a Continuation of International Patent Application No. PCT/JP2022/001046, filed Jan. 14, 2022, which claims the benefit of Japanese Patent Application No. 2021-008439, filed Jan. 22, 2021, and Japanese Patent Application No. 2022-000316, filed Jan. 5, 2022, both of which are hereby incorporated by reference herein in their entirety.

TECHNICAL FIELD

The present invention relates to a photoelectric conversion apparatus, a photoelectric conversion system, and a mobile body.

BACKGROUND ART

A photoelectric conversion apparatus known in the art includes a pixel array configured such that pixels including a plurality of avalanche diodes (hereinafter abbreviated as APD) are arranged in a two-dimensional array layout in a plan view. In each pixel, due to applying of a reverse bias voltage to a P-N junction diode, an optical charge arising from a single photon causes avalanche multiplication. There are at least two modes in APD operation. One is a Geiger mode, a mode of operation in which a potential difference between the anode and the cathode is greater than a breakdown voltage when a reverse bias voltage is supplied. The other is a linear mode, a mode of operation in which the potential difference between the anode and the cathode is close to or below the breakdown voltage. An APD configured to be operated in the Geiger mode is called an SPAD (Single Photon Avalanche Diode).

FIG. 3B of PTL 1 discloses a photoelectric conversion apparatus in which first, second, and third substrates are stacked in layers, the first substrate includes an SPAD array, the second substrate includes a counter, and the third substrate includes a storage.

CITATION LIST

Patent Literature

PTL 1 Specification of U.S. Patent Laid-Open No. 2015/0115131

Though PTL 1 discloses a photoelectric conversion apparatus in which first, second, and third substrates are stacked in layers, no consideration is given therein to a wiring structure for electric connection between the second substrate and the third substrate.

SUMMARY OF INVENTION

In view of this, the present disclosure aims to propose a specific configuration of a photoelectric conversion apparatus that includes three or more substrates including avalanche diodes. A photoelectric conversion apparatus according to the present invention includes: a first substrate that includes a first semiconductor layer and a first wiring structure, the first semiconductor layer including a plurality of photoelectric conversion units; a second substrate that includes a second semiconductor layer and a second wiring structure, the second semiconductor layer including a plurality of pixel circuits provided in such a way as to correspond to the plurality of photoelectric conversion units; a third substrate that includes a third semiconductor layer and a third wiring structure, the third semiconductor layer including a signal processing circuit configured to process signals outputted from the plurality of pixel circuits; and first through-hole wiring going through the third semiconductor layer; wherein each of the plurality of photoelectric conversion units includes an avalanche diode; the first substrate and the second substrate are stacked such that the first wiring structure and the second wiring structure are provided between the first semiconductor layer and the second semiconductor layer, the second substrate and the third substrate are stacked such that the third wiring structure is provided between the second semiconductor layer and the third semiconductor layer.

Further features of the present invention will become apparent from the following description of exemplary embodiments with reference to the attached drawings.

BRIEF DESCRIPTION OF DRAWINGS

FIG. 6A is a diagram for explaining a relationship between operation of an APD and an output signal.

FIG. 6B is a diagram for explaining a relationship between operation of an APD and an output signal.

FIG. 6C is a diagram for explaining a relationship between operation of an APD and an output signal.

FIG. 7 is a schematic view of an electric connection relationship between the first substrate and the second substrate according to a first embodiment.

FIG. 9 is a schematic view of an electric connection relationship between the third substrate and another substrate, etc. according to the first embodiment.

FIG. 14 is a cross-sectional view of a photoelectric conversion apparatus according to a second embodiment.

FIG. 15 is a cross-sectional view of a photoelectric conversion apparatus according to a third embodiment.

FIG. 19 is a cross-sectional view of a photoelectric conversion apparatus according to a seventh embodiment.

FIG. 22 is a cross-sectional view of a photoelectric conversion apparatus according to a tenth embodiment.

FIG. 26 is a schematic view of an electric connection relationship between the first substrate and the second substrate according to a twelfth embodiment.

FIG. 29 is a cross-sectional view of a photoelectric conversion apparatus according to the twelfth embodiment.

FIG. 30 is a schematic view of an electric connection relationship between the second substrate and the third substrate according to a thirteenth embodiment.

FIG. 31 is a schematic view of an electric connection relationship between the third substrate and another substrate, etc. according to the thirteenth embodiment.

FIG. 32 is a cross-sectional view of a photoelectric conversion apparatus according to the thirteenth embodiment.

FIG. 33 is a cross-sectional view of a photoelectric conversion apparatus according to a fourteenth embodiment.

FIG. 34 is a cross-sectional view of a photoelectric conversion apparatus according to the fourteenth embodiment.

DESCRIPTION OF EMBODIMENTS

Figure 1:
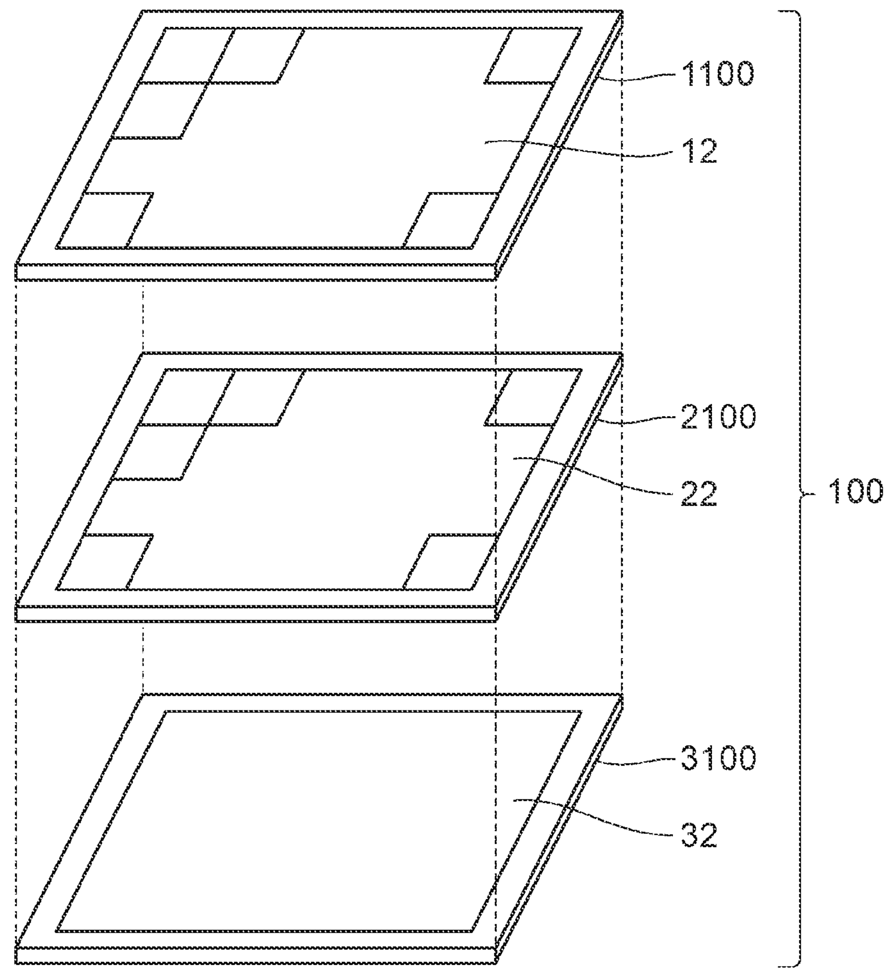
FIG. 1 is a block diagram of a photoelectric conversion apparatus.

The embodiments described below are intended to explain the technical concept of the present invention specifically, and shall not be construed to limit the scope of the present invention. The sizes of members illustrated in the drawings, and positional relationships between them, are sometimes exaggerated for the purpose of making the description clearer. In the description below, the same reference numerals will be assigned to the same components, and an explanation thereof may be omitted.

The embodiments described below relate to a photoelectric conversion apparatus that includes an SPAD (Single Photon Avalanche Diode) configured to count the number of photons incident on its avalanche diode. The photoelectric conversion apparatus includes at least an avalanche diode.

In the description below, an anode of an avalanche diode has a fixed potential, and a signal is taken out from its cathode side. Therefore, a semiconductor region of a first conductivity type whose majority carriers are charges of the same conductivity type as that of signal charges is an N-type semiconductor region, and a semiconductor region of a second conductivity type is a P-type semiconductor region. The present invention holds also in a case where a cathode of an avalanche diode has a fixed potential and a signal is taken out from its anode side. In this case, a semiconductor region of a first conductivity type whose majority carriers are charges of the same conductivity type as that of signal charges is a P-type semiconductor region, and a semiconductor region of a second conductivity type is an N-type semiconductor region. Though a case where a fixed potential is set at one of nodes of an avalanche diode will be described below, potentials at both of the nodes may fluctuate.

In this specification, a plan view means a view taken in a direction perpendicular to a light-incident surface of a semiconductor layer. A cross-sectional view means a view taken at a plane perpendicular to a light-incident surface of a semiconductor layer. In a case where a light-incident surface of a semiconductor layer has irregularities when viewed microscopically, the term “plan view” is defined based on the light-incident surface of the semiconductor layer viewed macroscopically.

First Embodiment

FIG. 1 is an overall view of a photoelectric conversion apparatus 100. A first substrate 1100, also called a sensor chip, has a pixel area 12 where pixels having photoelectric conversion units are arranged in a two-dimensional layout. A peripheral area 13 is provided between the pixel area 12 and a chip edge portion of the photoelectric conversion apparatus 100. A second substrate 2100, also called a pixel circuit chip, has a pixel circuit area 22 where pixel circuits configured to process signals from the photoelectric conversion units are provided. A third substrate 3100, also called a signal processing chip, has a signal processing circuit area 32 where signal processing circuits configured to process signals from the pixel circuits are provided. The photoelectric conversion apparatus 100 is made up of the first substrate 1100, the second substrate 2100, and the third substrate 3100 that are stacked in layers.

First Substrate

Figure 2:
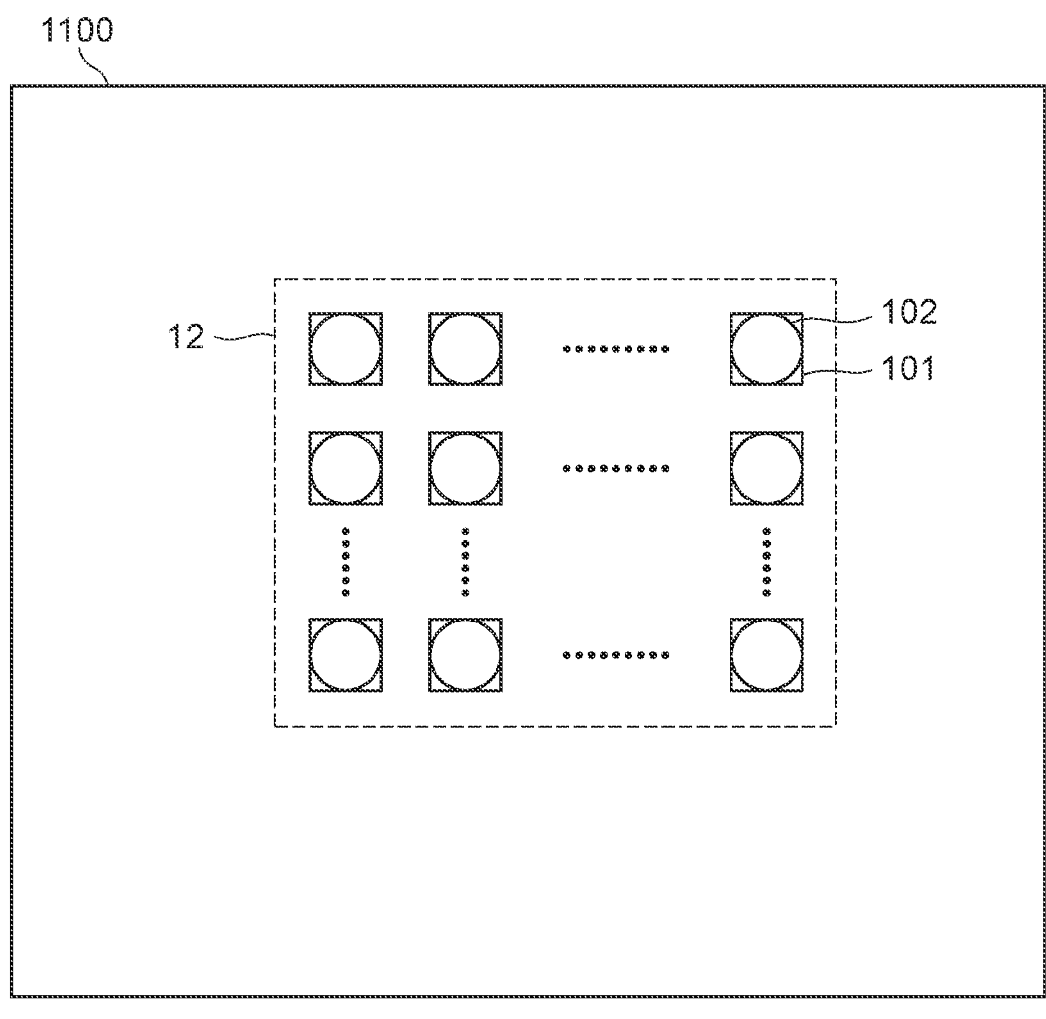
FIG. 2 is a block diagram of functions of a first substrate.

FIG. 2 is a configuration diagram of the first substrate 1100. On the first substrate, the pixel area 12, at which pixels 101 having photoelectric conversion units 102 including avalanche photodiodes (hereinafter abbreviated as "APD") are arranged in a two-dimensional layout, is provided. The array of the pixels 101 in the pixel area 12 may be one-dimensional. A detailed explanation of the photoelectric conversion units 102 will be given later.

The pixel 101 is, typically, a pixel for forming an image, but does not necessarily have to form an image when used for TOF (Time of Flight). That is, the pixel 101 may be an element for measuring time at which light arrives and measuring an amount of the light.

Second Substrate

Figure 3:
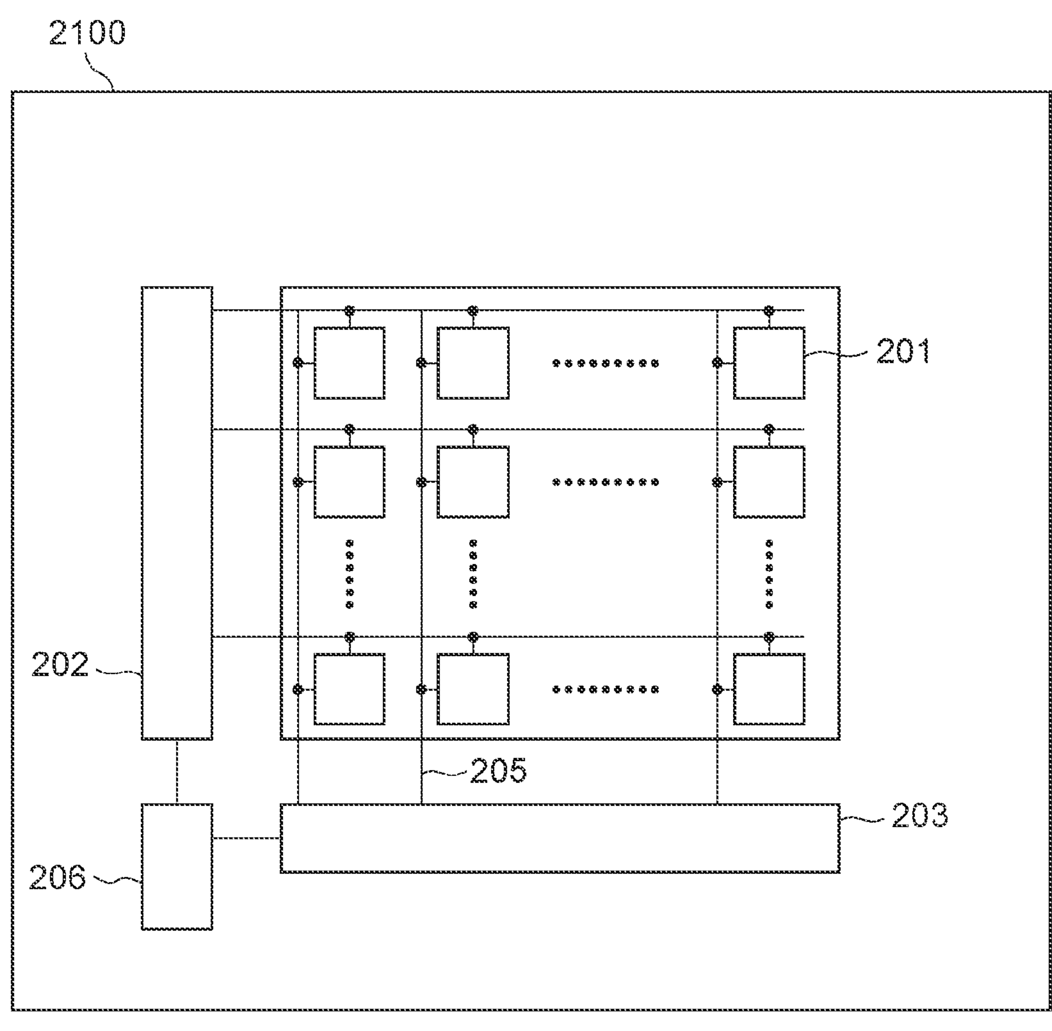
FIG. 3 is a block diagram of functions of a second substrate.

FIG. 3 is a configuration diagram of the second substrate 2100. The second substrate 2100 includes pixel circuit units 201 configured to process charges obtained through photoelectric conversion by the photoelectric conversion units 102, a control pulse generation unit 206, a horizontal scanning circuit unit 203, signal lines 205, and a vertical scanning circuit unit 202. The pixel circuit area 22 illustrated in FIG. 1 is an area where at least the pixel circuit units 201 are provided.

The photoelectric conversion units 102 illustrated in FIG. 2 are electrically connected to the pixel circuit units 201 illustrated in FIG. 3 via connection wiring provided individually for the pixels.

The vertical scanning circuit unit 202 receives a control pulse supplied from the control pulse generation unit 206, and supplies the control pulse to each of the pixels. A logical circuit such as a shift register or an address decoder is used for the vertical scanning circuit unit 202.

A signal outputted from the photoelectric conversion unit 102 of each of the pixels is processed by the pixel circuit unit 201.

A counter, a memory, and the like are provided in the pixel circuit unit 201. A digital value is stored in the memory.

For the purpose of performing a signal readout from the memory of each of the pixels in which a digital signal is stored, the horizontal scanning circuit unit 203 inputs a control pulse for sequential column selection into the pixel circuit units 201.

A signal is outputted from the pixel circuit unit 201 of the pixel selected by the vertical scanning circuit unit 202 to the signal line 205 of the selected column.

In FIGS. 2 and 3, for each one pixel 101, one pixel circuit unit 201 is provided correspondingly. However, the pixel circuit units 201 may be configured such that, for example, one pixel circuit unit 201 is shared by a plurality of pixels 101, and signal processing is performed sequentially. This makes it possible to make the pixel circuit area 22 more space-saving.

Third Substrate

Figure 4:
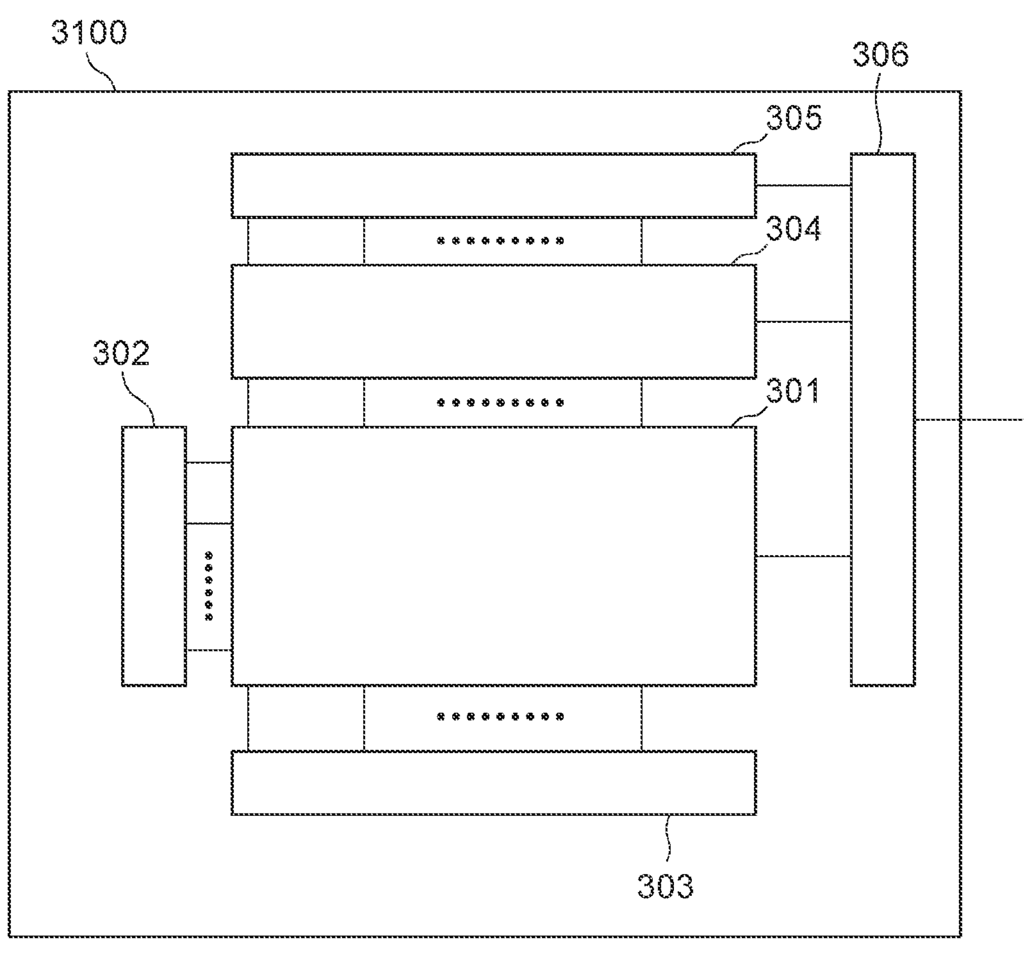
FIG. 4 is a block diagram of functions of a third substrate.

FIG. 4 is a configuration diagram of the third substrate 3100. The third substrate 3100 includes a memory 301, a first signal processing unit 304, a second signal processing unit 305, and control circuit units 302 and 303.

The memory 301 stores, for example, image data, etc. outputted from the horizontal scanning circuit unit 203. The memory 301 is, for example, an SRAM (Static Random Access Memory) or a DRAM.

The control circuit units 302 and 303 control writing information into, and reading information out of, the memory 301.

The first signal processing unit 304 performs various kinds of signal processing on image data read out of the memory 301 (the image data that is the target of processing). For example, if the image data that is the target of processing is a color image, the first signal processing unit 304 converts the format of this image data into a YUV format, an RGB format, or the like.

The first signal processing unit 304 performs processing such as, for example, denoising or white balance adjustment on the image data that is the target of processing, as needed. Besides this processing, the first signal processing unit 304 performs, on the image data that is the target of processing, various kinds of signal processing that are required for the second signal processing unit 305 to process this image data (referred to also as "pre-processing").

In a case where the photoelectric conversion apparatus 100 is used also as a distance measurement apparatus, the first signal processing unit 304 functions also as, for example, a ranging processing unit. For example, based on information obtained from a TDC circuit (Time to Digital Converter) that will be described later, the first signal processing unit 304 generates a histogram, performs a distance computation, and outputs the result to the second signal processing unit 305. The horizontal axis of the histogram represents bins regarding time, and the vertical axis thereof represents frequency in each bin. The frequency is the number of times of receiving light during predetermined photoreception time. In the histogram, a count based on reflected light and a count based on ambient light are contained in a mixed manner. Therefore, the count of reflected-light component and the count of ambient-light component are separated from each other by setting a predetermined threshold. The distance between the distance measurement apparatus and the measurement target object is calculated from light arrival time corresponding to the reflected-light component.

The first signal processing unit 304 is capable of generating three-dimensional distance image data, based on the calculated distance. The three-dimensional distance image data can be generated from information obtained at the ranging processing unit alone; alternatively, the three-dimensional distance image data may be generated by adding computation data acquired by the ranging processing unit to image data of a two-dimensional plane.

The second signal processing unit 305 is, for example, a DSP (Digital Signal Processor). The second signal processing unit 305, by running a program stored in the memory 301, functions as a processing unit configured to perform various kinds of processing using a trained model created through machine learning. For example, the trained model is created through machine learning utilizing a deep neural network (DNN). This kind of trained model is also called a neural network calculation model.

This trained model may be designed based on parameters generated by inputting, into a predetermined machine learning model, training data in which input signals corresponding to outputs from the pixel area 12 and labels for the input signals are associated with each other. The predetermined machine learning model may be a learning model utilizing a multilayer neural network. This kind of trained model is also called a multilayer neural network model.

For example, the second signal processing unit 305 performs computation processing that is based on the trained model stored in the memory 301. The result obtained by performing this computation processing (computation result) is outputted to the memory 301 and the like.

The computation result contains image data obtained by performing the computation processing using the trained model, and various kinds of information (metadata) obtained from the image data. A memory controller configured to control accesses to a memory 15 may be built in a DSP 14.

The image data that is the target of processing by the second signal processing unit 305 may be image data read out from the pixel area 12 as usually done, or may be size-reduced image data obtained by pixel decimation of the image data. It may be image data read out in a smaller data size than usual by performing a pixel-decimated readout from the pixel area 12.

The image data that is the target of processing by the second signal processing unit 305 may be three-dimensional distance image data. With three-dimensional distance information data, thanks to a larger amount of information than two-dimensional image data, it is possible to recognize an object with a higher precision and acquire object position information with a higher precision.

As described above, the memory 301 stores the image data outputted from the horizontal scanning circuit unit 203, the image data having been subjected to signal processing at the first signal processing unit 304, the computation result obtained at the second signal processing unit 305, and the like, when needed. The memory 301 further stores an algorithm for the trained model to be run by the second signal processing unit 305.

The second signal processing unit 305 is capable of learning a training model by changing the weights of various parameters in a training model by using training data, and capable of changing a training model to be used, among a plurality of training models having been prepared in advance, depending on the content of computation processing. In addition, the second signal processing unit 305 is capable of acquiring a trained model from an external apparatus and then performing the computation processing described above.

In the example illustrated in FIG. 4, the memory 301, the first signal processing unit 304, and the second signal processing unit 305 are arranged in this order. However, as described above, the memory 301 stores information outputted from, and information inputted into, the first signal processing unit 304 and the second signal processing unit 305. Therefore, the memory 301 may be provided between the first signal processing unit 304 and the second signal processing unit 305. Alternatively, the second signal processing unit 305 may be provided between the memory 301 and the first signal processing unit 304.

An output unit 306 outputs the image data outputted from the second signal processing unit 305 and the image data and the computation result stored in the memory 301.

The image data and the computation result outputted from the output unit 306 are inputted into an application processor (not illustrated) configured to perform processing for display, user interface, and the like. The application processor is, for example, configured using a CPU (Central Processing Unit) or the like, and runs an operating system, various kinds of application software, and the like. The application processor may have a function of a GPU (Graphics Processing Unit), a baseband processor, or the like. The application processor performs various kinds of processing on the inputted image data and the inputted computation result as needed, performs display to the user, and performs transmission to an external cloud server via a predetermined network.

Various kinds of network, for example, the Internet, a wired LAN (Local Area Network) or a wireless LAN, a mobile communications network, Bluetooth®, and the like can be used as the network. The transmission destination of the image data and the computation result is not limited to a cloud server. It may be a server that operates alone, a file server that archives various kinds of data, or various kinds of information processing apparatus (system) that has a communication function, for example, a communication terminal such as a mobile phone.

APD and Pixel Circuit

Figure 5:
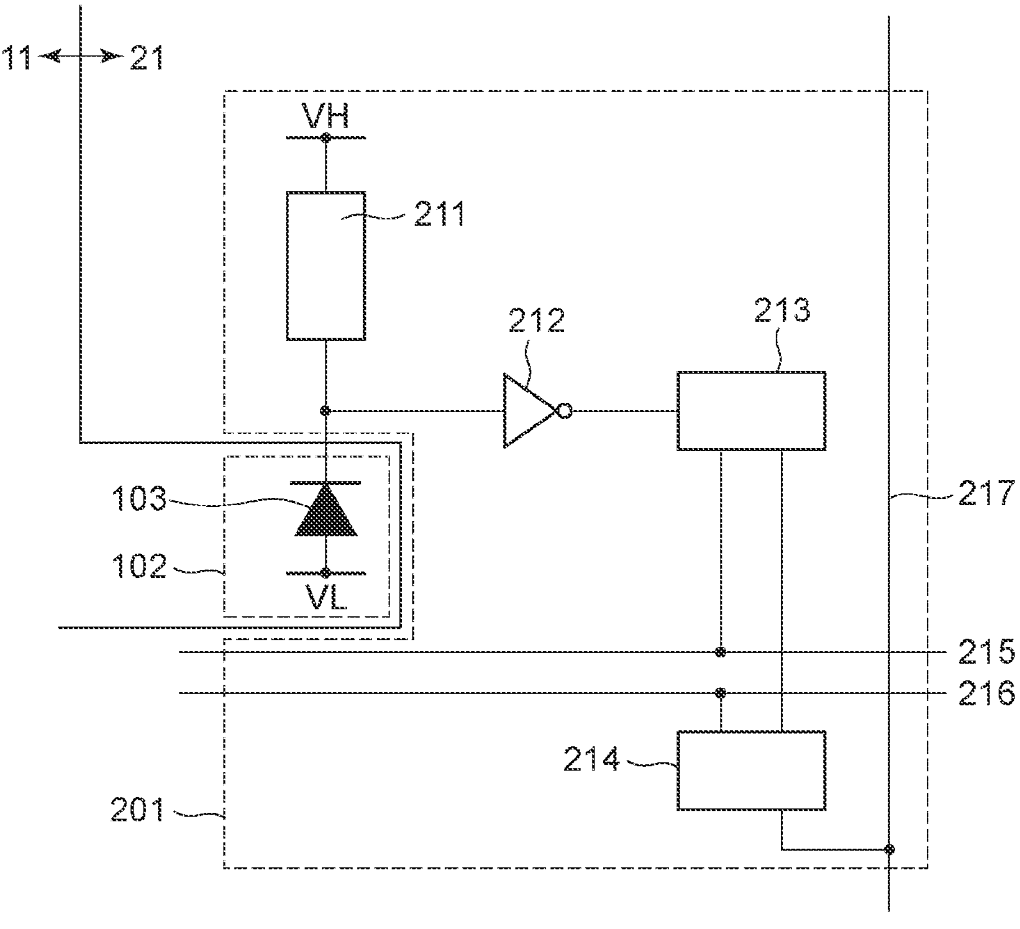
FIG. 5 is a circuit diagram of a pixel and a function block diagram thereof.

FIG. 5 is a diagram for explaining in more details the block diagram having been described with reference to FIGS. 2 and 3.

In FIG. 2, the photoelectric conversion units 102 having APDs 103 are provided on the first substrate 1100, and other members are provided on the second substrate 2100.

An APD 103 generates charge pairs through photoelectric conversion when light enters. A voltage VL (first voltage) is supplied to an anode of the APD 103. A voltage VH (second voltage), which is higher than the voltage VL supplied to the anode, is supplied to a cathode of the APD 103.

A reverse bias voltage that causes the APD 103 to perform an avalanche multiplication operation is supplied to the anode and cathode thereof. Supplying such a voltage gives rise to avalanche multiplication of charges generated by incident light, resulting in generating an avalanche current.

A mode of operation in which a potential difference between the anode and the cathode is greater than a breakdown voltage, when a reverse bias voltage is supplied, is called a Geiger mode. A mode of operation in which the potential difference between the anode and the cathode is close to or below the breakdown voltage is called a linear mode. An APD configured to be operated in the Geiger mode is called an SPAD. For example, the voltage VL (first voltage) is −30V, and the voltage VH (second voltage) is 1 V. In this case, for example, the potential difference between 0 V, which is a ground voltage, and the voltage VL (first voltage) is greater than the potential difference between the ground voltage and the voltage VH (second voltage). For this reason, in some instances the voltage VL (first voltage) is referred to as a “high” voltage.

A quenching element 211 is connected to a power source configured to supply the voltage VH and to the APD 103. The quenching element 211 has a function of replacing a change in an avalanche current generated at the APD 103 with a voltage signal. The quenching element 211 functions as a load circuit (quenching circuit) when signal multiplication is caused due to the avalanche multiplication and has a role of suppressing the voltage supplied to the APD 103, thereby suppressing the avalanche multiplication (called a quenching operation).

A signal processing unit 210 includes a waveform shaping unit 212, a circuit 213 (counter circuit), and a selection circuit 214. In this specification, it is sufficient as long as the signal processing unit 210 includes at least any of the waveform shaping unit 212, the circuit 213 (counter circuit), and the selection circuit 214.

The waveform shaping unit 212 shapes a change in potential of the cathode of the APD 103 obtained during photon detection, and outputs a pulse signal. For example, an inverter circuit is used as the waveform shaping unit 212. Although FIG. 5 illustrates an example in which a single inverter is used as the waveform shaping unit 212, a circuit in which plural inverters are connected in series may be used, or any other circuit having a waveform shaping effect may be used.

The circuit 213 (counter circuit) counts the pulse signals outputted from the waveform shaping unit 212, and retains a count value. Furthermore, when a control pulse pRES is supplied via a drive line 215, a signal retained in the circuit 213 (counter circuit) is reset. The circuits 213 (counter circuits) provided individually for the pixels will tend to make a circuit scale large; therefore, some of them may be provided on the third substrate 3100, instead of providing all of them on the second substrate 2100 only.

The selection circuit 214 receives a control pulse pSEL supplied from the vertical scanning circuit unit 202 illustrated in FIG. 3 via a drive line 216 illustrated in FIG. 5, and performs switching between electric connection and disconnection of the circuit 213 (counter circuit) and a signal line 217. The selection circuit 214 includes, for example, a buffer circuit for outputting a signal.

In a case where the quenching element 211 is configured using, for example, a MOS transistor, a pulse having a clock cycle may be applied to a gate of the MOS transistor. In this case, a pulse having a predetermined clock cycle is inputted to the gate of the transistor constituting the quenching element 211 from a PLL (Phase Locked Loop) circuit that is not illustrated. Assuming that the quenching element 211 has a PMOS configuration, the quenching element 211 is in an OFF state when the pulse supplied from the PLL circuit is in a high level. In this case, since a reverse bias is not applied to the APD 103, it is in a non-detection mode. On the other hand, when the pulse supplied from the PLL circuit is in a low level, the quenching element 211 is in an ON state, and a reverse bias is applied to the APD 103, resulting in a detection mode (standby mode). Since this clock pulse from the PLL circuit has a predetermined cycle, forced resetting of an output signal is executed each time a clock period in the cycle elapses. For this reason, a photon count for one pulse is one, and, even under high-brightness conditions, it is possible to generate signals whose number corresponds to the number of photons incident thereon. The PLL circuit is provided on any of, or on a plurality of, the first substrate 1100, the second substrate 2100, and the third substrate 3100.

A switch such as a transistor may be provided between the quenching element 211 and the APD 103 or between the photoelectric conversion unit 102 and the signal processing unit 210 to switch the electrical connection. Similarly, the supply of the voltage VH or the voltage VL to the photoelectric conversion unit 102 may be electrically switched using a switch such as a transistor.

In the above description, a configuration of using the circuit 213 as a counter circuit is disclosed. However, the circuit 213 may be a time-to-digital conversion circuit (Time to Digital Converter, hereinafter abbreviated as a "TDC" circuit) operating as a time measurement circuit, instead of a counter circuit. This makes it possible to configure the photoelectric conversion apparatus 100 that acquires pulse detection timing.

When configured so, the timing of generation of a pulse signal outputted from the waveform shaping unit 212 is converted into a digital signal by the TDC circuit 213. For measuring the timing of the pulse signal, a control pulse pREF (reference signal) is supplied to the TDC circuit 213 from the vertical scanning circuit unit 202 illustrated in FIG. 3 via a drive line. The TDC circuit 213 acquires, in the form of a digital signal, a signal based on input timing of a signal outputted from each of the pixels via the waveform shaping unit 212 when the input timing is regarded as relative time with respect to the control pulse pREF.

The TDC circuit 213 includes, for example, an RS flip flop, a coarse counter, and a fine counter. The drive pulse pREF drives a light emitting unit and sets the RS flip flop. The RS flip flop is reset by a signal pulse inputted from each of the pixels. By this means, a signal that has a pulse width corresponding to the flight time of light is generated. The generated signal is counted by the coarse counter and the fine counter that have predetermined time resolutions respectively. As a result, a digital code is outputted.

The PLL circuit that generates the drive pulse pREF of the TDC circuit 213 is provided on any of, or on a plurality of, the first substrate 1100, the second substrate 2100, and the third substrate 3100. However, if there is a delay in the drive pulse pREF inputted into the TDC circuit, it will have an influence on the accuracy of information outputted from the TDC circuit 213. For this reason, it is better to provide the PLL circuit on the same substrate as the one on which the TDC circuit 213 is provided. For example, in the present embodiment, the TDC circuit 213, and the PLL circuit configured to generate the pulse to be supplied to the TDC circuit 213, are provided on the second substrate 2100.

In some instances a PLL circuit performs inputting into a circuit provided on the third substrate 3100, too. In this case, it is possible to adopt a configuration of providing, on the second substrate 2100, a PLL circuit for the TDC circuit 213, and providing, on the third substrate 3100, a PLL circuit for a circuit provided on the third substrate 3100. For example, it is conceivable to provide a single PLL circuit on the second substrate 2100 and supply a pulse signal to the circuit of the third substrate 3100 from the PLL circuit provided on the second substrate 2100. However, in this case, it follows that the pulse signal is supplied to the circuit of the third substrate 3100 from the PLL circuit provided on the second substrate 2100 via TSV wiring that connects the second substrate 2100 and the third substrate 3100. For this reason, due to the wiring capacity, etc. of the TSV wiring, there is a possibility that processing performed by the circuit of the third substrate 3100, for example, high-speed processing performed by the signal processing circuit, will be affected. To avoid this, both a PLL circuit for the second substrate 2100 and a PLL circuit for the third substrate 3100 may be provided respectively thereon.

In the example illustrated in FIG. 5, the TDC circuit 213 is provided for each one pixel. However, as will be described later, the TDC circuit 213 may be shared by a plurality of pixels.

Operation of APD and Output Signal

FIG. 6 is a diagram that schematically illustrates a relationship between the operation of an APD and output signals. FIG. 6A is an excerpt that illustrates only the APD 103, the quenching element 211, and the waveform shaping unit 212 illustrated in FIG. 5. Let a node A be an input side of the waveform shaping unit 212, and let a node B be an output side of the waveform shaping unit 212. FIG. 6B illustrates a change in waveform at the node A illustrated in FIG. 6A. FIG. 6C illustrates a change in waveform at the node B illustrated in FIG. 6A.

During a period between time to and time t1, a potential difference between VH and VL is applied to the APD 103 illustrated in FIG. 6A. When a photon enters at the time t1, an avalanche multiplication current flows through the quenching element 211, and the voltage of the node A drops.

When a voltage drop amount further increases and the potential difference applied to the APD 103 decreases, the avalanche multiplication in the APD 103 stops, and the voltage level of the node A does not drop beyond a certain value. Thereafter, a current compensating for the voltage drop flows to the node A from the voltage VL, and, at time t3, the potential level at the node A settles back to its original level.

At this time, a portion of the output waveform at the node A exceeding a certain threshold is waveform-shaped by the waveform shaping unit 212 and is outputted as a signal at the node B.

In the present embodiment, the memory 301, the control circuit units 302 and 303, the first signal processing unit 304, and the second signal processing unit 305 are provided on the third substrate 3100. In order to reduce the chip size of the photoelectric conversion apparatus 100, area size needs to be reduced, except for the size of the pixel area. Moreover, since an avalanche photodiode includes a pixel circuit configured to process a signal of the corresponding photoelectric conversion unit, plural photoelectric conversion units are arranged on the first substrate 1100, and plural pixel circuits are arranged on the second substrate 2100. For this reason, there is not an enough space in an area, of the second substrate 2100, overlapping with the pixel area in a plan view and, therefore, it is difficult to arrange a memory and signal processing units on the second substrate 2100. To solve this issue, in the present embodiment, the memory and the signal processing units are arranged on the third substrate 3100. The higher the ratio of the area size of the pixel area to the area size of the chip area of the photoelectric conversion apparatus in a plan view is, the greater the need to arrange the memory and the signal processing units on the third substrate 3100 is. For example, this need is remarkable when the ratio of the area size of the pixel area to the area size of the chip area of the photoelectric conversion apparatus is 0.8 or higher.

Transistors that constitute the memory and the signal processing units provided on the third substrate 3100 are formed using finer processes than transistors that constitute the pixel circuits provided on the second substrate 2100. This is because the memory and the signal processing units require a space of a larger area than the pixel circuits. For example, the thickness of a gate oxide film of a transistor provided on the third substrate 3100 is less than the thickness of a gate oxide film of a transistor provided on the second substrate 2100. Alternatively, the gate length of a transistor provided on the third substrate 3100 is less than the gate length of a transistor provided on the second substrate 2100. Alternatively, the diameter of via wiring provided in an interlayer of a wiring structure of the third substrate 3100 (third wiring structure) is less than the diameter of via wiring provided in an interlayer of a wiring structure of the second substrate 2100 (second wiring structure). Alternatively, the wiring width and the wiring-to-wiring distance of the wiring structure of the third substrate 3100 (third wiring structure) is less than the wiring width and the wiring-to-wiring distance of the wiring structure of the second substrate 2100 (second wiring structure). This relationship regarding the wiring width and the wiring-to-wiring distance is a relationship defined by comparing the narrowest wiring widths of the respective two substrates with each other or comparing the shortest wiring-to-wiring distances of the respective two substrates with each other.

Since an avalanche multiplication current flows through the quenching element 211 provided on the second substrate 2100, in a case where the quenching element 211 is configured using a MOS transistor, the gate oxide film of the MOS transistor is configured to be thick so as to enhance the element's withstanding performance. Therefore, it is possible to make the processes of pixel circuits other than the quenching element 211 finer than the processes of the quenching element 211 on the second substrate 2100. As for the device structure in a case of making the processes finer, the matters having been described above apply also to the quenching element 211 provided on the second substrate 2100 and to the transistors of other pixel circuits. For example, the thickness of the gate oxide film of the quenching element 211 (MOS transistor) of the second substrate 2100 is greater than the thickness of the gate oxide film of a transistor constituting a circuit other than the quenching element 211 of the second substrate 2100. Moreover, the thickness of the gate oxide film of a transistor constituting a circuit other than the quenching element 211 of the second substrate 2100 is greater than the thickness of the gate oxide film of a transistor of a circuit provided on the third substrate 3100.

Furthermore, the signal processing units provided on the third substrate 3100 may be processing units using so-called "non-von Neumann" semiconductor technology, not so-called "von Neumann" processing units.

Connection Relationship Between Substrates

Figure 7:
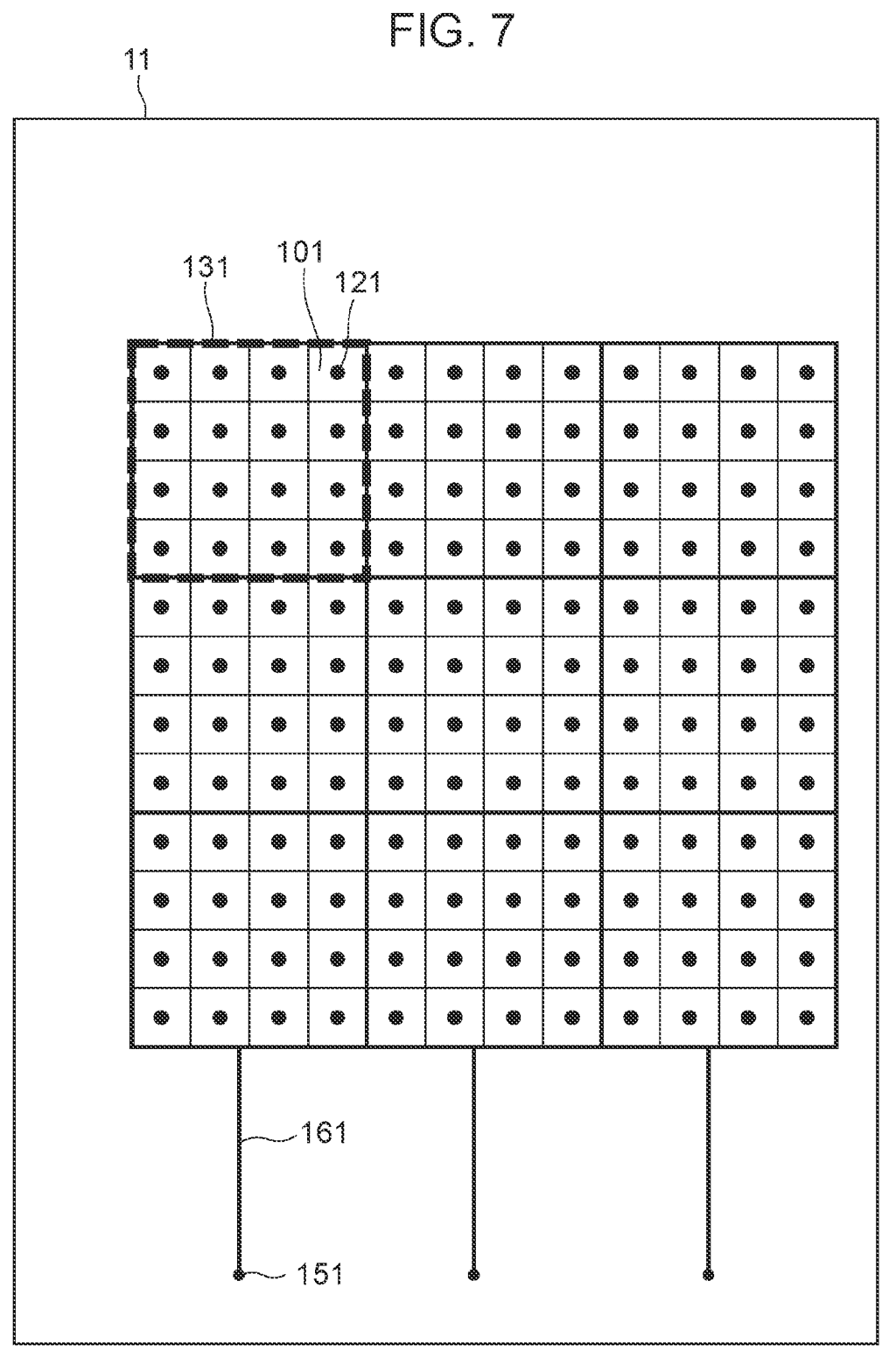
Figure 8:
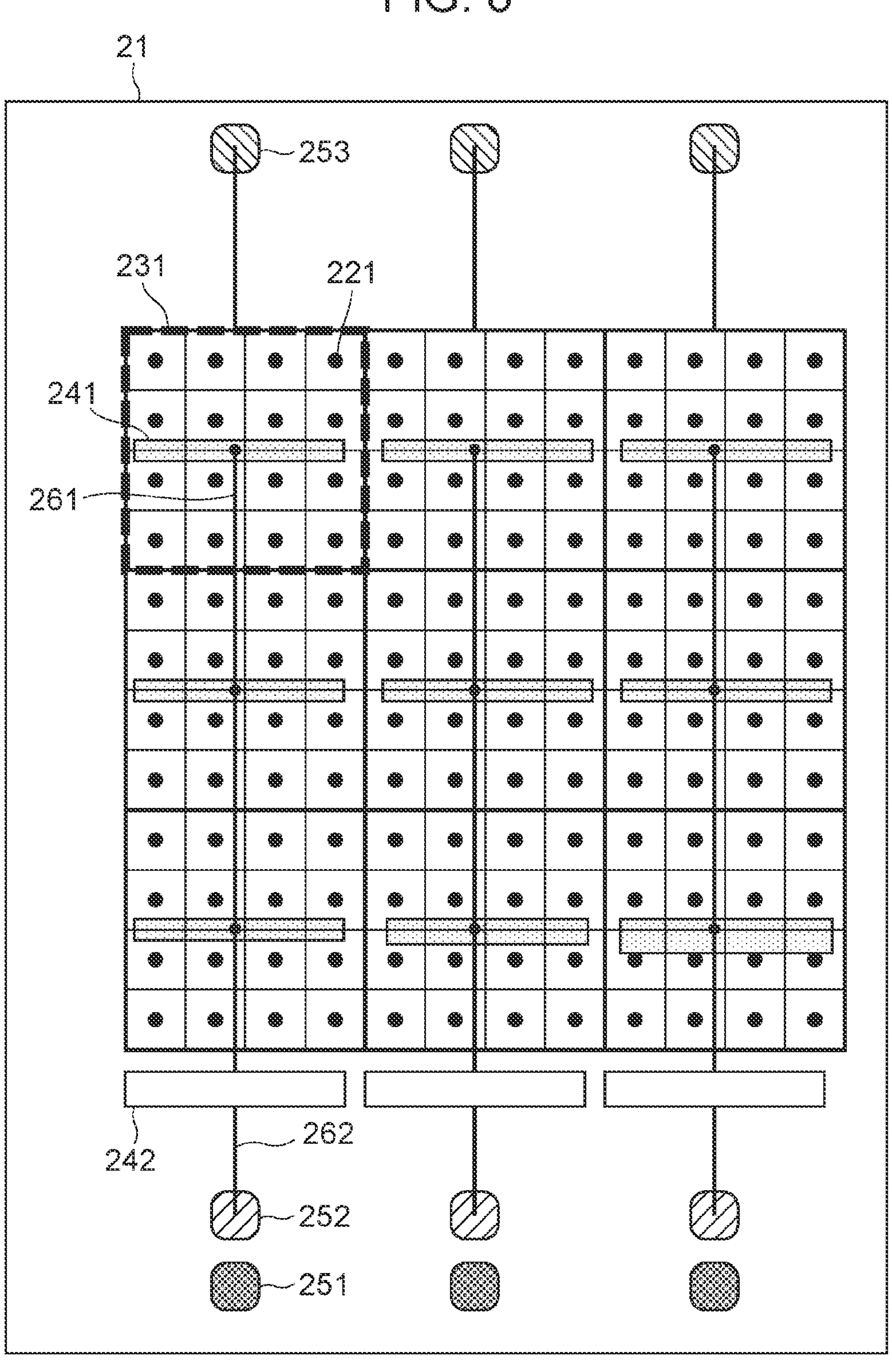
FIG. 8 is a schematic view of an electric connection relationship between the second substrate and the third substrate according to the first embodiment.
Figure 9:
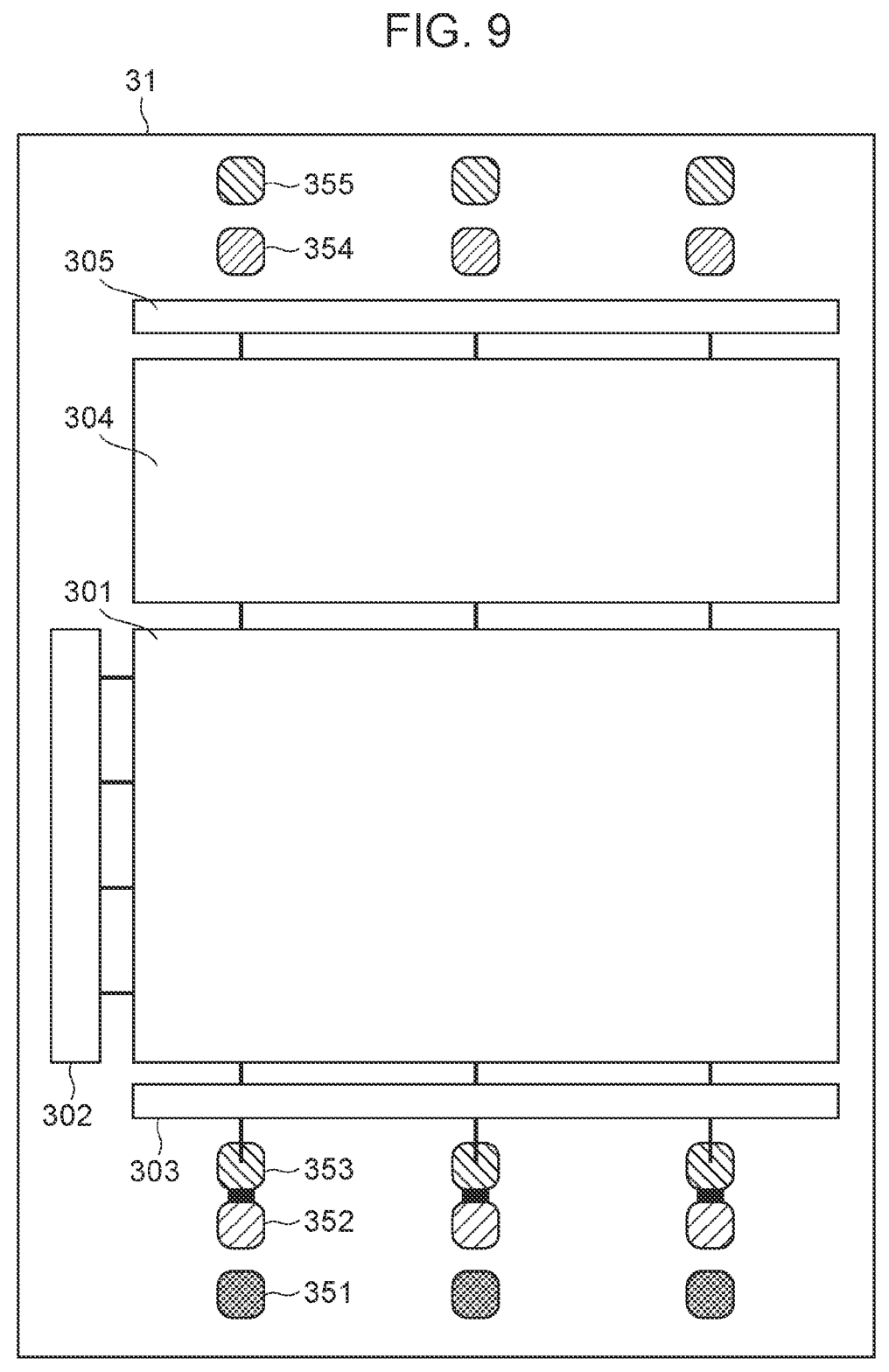
Figure 10:
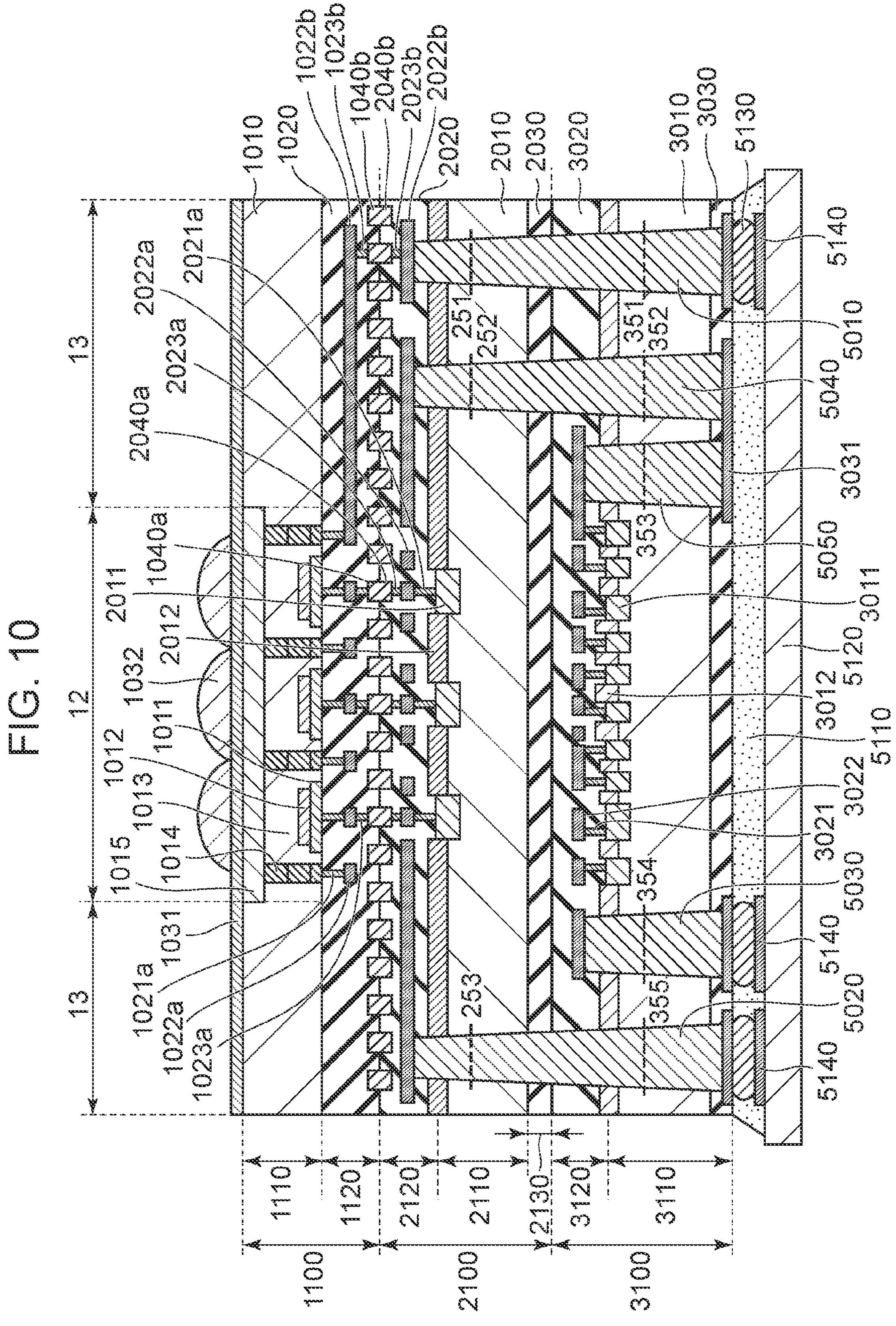
FIG. 10 is a cross-sectional view of a photoelectric conversion apparatus according to the first embodiment.

With reference to FIGS. 7 to 10, an electric connection relationship from the first to third substrates will now be explained in detail. FIGS. 7 to 9 are plan views illustrating the first to third substrates respectively. FIG. 10 is a cross-sectional view of the photoelectric conversion apparatus 100 including the first to third substrates stacked in layers.

Cross-sectional View of Photoelectric Conversion Apparatus

FIG. 10 is a cross-sectional view of the photoelectric conversion apparatus 100. Light enters from the top side of FIG. 10.

As viewed from the light-incident-surface side, the first substrate 1100, the second substrate 2100, and the third substrate 3100 form layers in this order.

The first substrate 1100 is made up of a semiconductor layer 1110 of the first substrate (first semiconductor layer) and a wiring structure 1120 of the first substrate (first wiring structure).

The second substrate 2100 is made up of a semiconductor layer 2110 of the second substrate (second semiconductor layer), a wiring structure 2120 of the second substrate (second wiring structure), and a connection layer 2130 for connection between the second wiring structure 2120 and a wiring structure 3120 of the third substrate (third wiring structure).

The third substrate 3100 includes a semiconductor layer 3110 of the third substrate (third semiconductor layer) and the third wiring structure 3120.

The first substrate 1100 and the second substrate 2100 are bonded to each other such that the first wiring structure 1120 and the second wiring structure 2120 face each other. The second substrate 2100 and the third substrate 3100 are bonded to each other such that the second semiconductor layer 2110 and the third wiring structure 3120 face each other, with the connection layer 2130 interposed therebetween.

A package substrate 5120 is disposed on the opposite side in relation to the light-incident-surface side of the third substrate 3100, with an insulating bonding region 5110 interposed therebetween.

A first semiconductor region 1011 of a first conductivity type and a second semiconductor region 1012 of a second conductivity type are provided in the first semiconductor layer 1110 to form a P-N junction and configure the APD 103 illustrated in FIG. 5.

A third semiconductor region 1013 of the second conductivity type is configured at a light-incident-surface-side position with respect to the second semiconductor region 1012. The impurity concentration of the third semiconductor region 1013 is lower than the impurity concentration of the second semiconductor region 1012.

The "impurity concentration" mentioned here means a net impurity concentration compensated by an impurity of an opposite conductivity-type impurity. That is, the "impurity concentration" refers to a NET concentration. For example, a region with a P-type additive impurity concentration higher than an N-type additive impurity concentration is a P-type semiconductor region. Conversely, a region with an N-type additive impurity concentration higher than a P-type additive impurity concentration is an N-type semiconductor region.

Each pixel is separated by a fourth semiconductor region 1014 of the second conductivity type. A fifth semiconductor region 1015 of the second conductivity type is provided at a light-incident-surface-side position with respect to the fourth semiconductor region 1014. The fifth semiconductor region 1015 is provided as a common semiconductor region shared by pixels.

The voltage VL (first voltage) illustrated in FIG. 5 is supplied to the fourth semiconductor region 1014. The voltage VH (second voltage) illustrated in FIG. 5 is supplied to the first semiconductor region 1011. Due to the voltage supplied to the fourth semiconductor region 1014 and the voltage supplied to the first semiconductor region 1011, a reverse bias voltage is supplied to the second semiconductor region 1012 and the first semiconductor region 1011. Therefore, a reverse bias voltage that causes the APD 103 to perform an avalanche multiplication operation is supplied thereto.

A pinning layer 1031 is provided at a light-incident-surface-side position with respect to the fifth semiconductor region 1015. The pinning layer 1031 is a layer provided for the purpose of dark current suppression. The pinning layer 1031 is formed using, for example, hafnium oxide ($HfO_2$). Zirconium dioxide ($ZrO_2$), tantalum oxide ($Ta_2O_5$), or the like may be used for forming the pinning layer 1031. A micro lens 1032 is provided on the pinning layer 1031 at each pixel. Though not illustrated, a color filter, a light-shielding film such as a grid for optical separation of the pixels, and the like may be provided between the micro lenses 1032 and the pinning layer 1031. Any material capable of blocking light can be used as the material of the light-shielding film. For example, tungsten (W), aluminum (A), copper (Cu), or the like can be used.

As described above, for the purpose of giving rise to avalanche multiplication, a voltage serving as a reverse bias is supplied to the fourth semiconductor region 1014 and the first semiconductor region 1011. In FIG. 10, first via wiring (contact wiring) 1021*a* of the first substrate is electrically connected to the fourth semiconductor region 1014, and wiring 1022*a* of a first wiring layer of the first substrate is electrically connected to the contact wiring 1021*a*. The wiring 1022*a* of the first wiring layer is electrically connected to wiring 1022*b*.

A suffix "a" following a reference numeral denotes wiring located in the pixel area 12, at which the photoelectric conversion units 102 are arranged. On the other hand, a suffix "b" is assigned to wiring located in an area other than the pixel area 12 or located in an area other than an area overlapping with the pixel area 12 in a plan view.

The wiring 1022*a* of the first wiring layer may be electrically connected to the wiring 1022*a* via another wiring layer. In the first wiring layer, the wiring 1022*a* and the wiring 1022*b* may be electrically connected to each other by being formed continuously/integrally.

The wiring 1022*b* is electrically connected to second via wiring 1023*b* of the first substrate. The via wiring 1023*b* is electrically connected to a junction portion 1040*b* of the first substrate. The junction portion 1040*b* of the first substrate is in contact with, and is electrically connected to, a junction portion 2040*b* of the second substrate. The junction obtained by the junction portion 1040*b* exposed in a junction surface of the first substrate and the junction portion 2040*b* exposed in a junction surface of the second substrate as described here is sometimes referred to as a metal bonding (MB) structure, or, a metal junction portion. Since copper and copper (Cu) are used in many cases for this junction, it is sometimes referred to as a Cu—Cu junction (Cu—Cu bonding).

The junction portion 2040*b* of the second substrate is electrically connected to second via wiring 2023*b* of the second substrate. The second via wiring 2023*b* is electrically connected to wiring 2022*b* of a first wiring layer of the second substrate. The wiring 2022*b* of the first wiring layer is electrically connected to through-hole wiring (hereinafter referred to as "TSV (Through Silicon Via) wiring") 5010. The TSV wiring 5010 is wiring formed through a semiconductor layer 2010 of the second substrate and a semiconductor layer 3010 of the third substrate. The TSV wiring 5010 is electrically connected to wiring 3031 of a TSV-opening-portion-side (the opposite side in relation to the light-incident-surface side) wiring layer of the third substrate. The wiring 3031 is electrically connected to an electrode 5140 via a bump 5130.

Since the voltage VL (first voltage) is supplied to the electrode 5140 electrically connected to the TSV wiring 5010, the voltage VL (first voltage) is supplied also to the fourth semiconductor region 1014 via the above-described connection wiring structure.

On the other hand, the first via wiring (contact wiring) 1021*a* of the first substrate is electrically connected to the first semiconductor region 1011, and the wiring 1022*a* of the first wiring layer of the first substrate is electrically connected to the contact wiring 1021*a*. In addition, the wiring 1022*a* of the first wiring layer is electrically connected to second via wiring 1023*a* of the first substrate. The via wiring 1023*a* is electrically connected to a junction portion 1040*a* of the first substrate. The junction portion 1040*a* of the first substrate is in contact with, and is electrically connected to, a junction portion 2040*a* of the second substrate. The junction portion 2040*a* of the second substrate is electrically connected to second via wiring 2023*a* of the second substrate. The second via wiring 2023*a* is electrically connected to wiring 2022*a* of the first wiring layer of the second substrate. The wiring 2022*a* is electrically connected to first via wiring (contact wiring) 2021*a* of the second substrate. The contact wiring 2021*a* is electrically connected to a sixth semiconductor region 2011. The sixth semiconductor region 2011 is provided in the semiconductor layer 2010 of the second substrate. Each area of the sixth semiconductor region 2011 is separated from the others by an element isolation region 2012. For example, the sixth semiconductor region 2011 is a part of the quenching element 211. More specifically, in a case where the quenching element 211 is a MOS transistor, the sixth semiconductor region 2011 is a source region or a drain region of the MOS transistor. Though not illustrated in FIG. 10, the waveform shaping unit 212, the counter circuit 213, and the selection circuit 214 are provided in the second substrate 2100.

The sixth semiconductor region 2011 is electrically connected to the wiring 2022*b* via plural pieces of wiring and semiconductor regions. The wiring 2022*b* of the first wiring layer is electrically connected to TSV wiring 5020. The TSV wiring 5020 is wiring formed through the semiconductor layer 2010 of the second substrate and the semiconductor layer 3010 of the third substrate. The TSV wiring 5020 is electrically connected to an electrode 5140 via the wiring 3031 and a bump 5130.

Since the voltage VH (second voltage) is supplied to the electrode 5140 electrically connected to the TSV wiring 5020, the voltage VH (second voltage) is supplied also to the first semiconductor region 1011 via the above-described connection wiring structure.

The voltage supplied from the TSV wiring 5020 may be configured to be supplied to pixel circuits such as the waveform shaping unit 212, the counter circuit 213, and the selection circuit 214. That is, the voltage VH (second voltage) serves as a drive voltage for circuits provided in the second substrate 2100. A drive voltage and a ground voltage are reference voltages, and the circuits are operated by the drive voltage and the ground voltage.

Furthermore, a ground voltage may be supplied via the TSV wiring 5020 to the first substrate 1100 and the second substrate 2100. However, the TSV wiring 5020 for a ground signal is another TSV wiring that is different from the TSV wiring 5020 for a drive signal and is electrically isolated therefrom, although the same figure has been used for describing them for the sake of convenience.

In the above description, an example of supplying a drive voltage for avalanche diodes provided in the first substrate 1100 and a drive voltage for pixel circuits provided in the second substrate 2100 via the same TSV wiring 5020 has been described. However, another TSV wiring that is different from the TSV wiring 5020 for avalanche diodes may be provided, and a drive voltage may be supplied via this another TSV wiring to pixel circuits provided in the second substrate 2100.

The signal line 217 illustrated in FIG. 5 corresponds to, in FIG. 10, at least a part of the contact wiring 2021, the wiring 2022*a*, and the wiring 2022*b*, and these kinds of wiring are electrically connected to TSV wiring 5040. The TSV wiring 5040 is electrically connected to TSV wiring 5050 via the wiring 3031. That is, the TSV wiring 5040, 5050 is wiring for inputting, into the third substrate 3100, signals outputted from the second substrate 2100.

A seventh semiconductor region 3011 is formed in the semiconductor layer 3010 of the third substrate illustrated in FIG. 10. Each area of the seventh semiconductor region 3011 is separated from the others by an element isolation region 3012. The seventh semiconductor region 3011 forms transistors and the like that make up the memory 301, the first signal processing unit 304, the second signal processing unit 305, and the like. Wiring 3021 of first via wiring (contact) of the third substrate is connected to the seventh semiconductor region 3011. Though not illustrated, the wiring 3021 of the first via wiring (contact) of the third substrate is connected also to the gate of transistors provided in the third substrate. The wiring 3021 is connected to wiring 3022 of a first wiring layer of the third substrate. Though FIG. 10 illustrates an example of a single wiring layer only, the number of wiring layers may be two or more.

The wiring 3022 of the first wiring layer is electrically connected to TSV wiring 5030. The TSV wiring 5030 is wiring formed through the semiconductor layer 3010 of the third substrate. The TSV wiring 5030 is electrically connected to an electrode 5140 via the wiring 3031 and a bump 5130. A drive voltage for circuits provided in the third substrate is supplied to the electrode 5140 connected to the TSV wiring 5030. The TSV wiring 5030 may be wiring via which a ground voltage is supplied to the circuits provided in the third substrate. However, the TSV wiring 5030 for a ground signal is another TSV wiring that is different from the TSV wiring 5030 for a drive signal and is electrically isolated therefrom, although the same figure has been used for describing them for the sake of convenience.

The TSV wiring 5020 is, for example, wiring via which a drive voltage for pixel circuits provided in the second substrate 2100 is supplied. Therefore, because of a large current and a voltage drop caused due to avalanche multiplication, there is a possibility that the potential of the TSV wiring 5020 might change. For this reason, if shared TSV wiring is provided for the purpose of supplying a drive voltage for the second substrate 2100 and the third substrate 3100, there is a possibility that the voltage supplied to the circuits of the third substrate 3100 might fluctuate, and this might have an influence on high-speed operation and the like. In view of this, in the present embodiment, the TSV wiring 5020 for supplying a drive voltage for the second substrate 2100 and the TSV wiring 5030 for supplying a drive voltage for the third substrate 3100 are configured separately from each other, thereby suppressing the influence on the third substrate 3100.

Though the TSV wiring 5010, 5020, 5030 is wiring to which a voltage having a predetermined voltage value is supplied from the outside, a power circuit configured to generate a voltage whose value is different from the predetermined voltage value inside the photoelectric conversion apparatus 100 may be provided. It is possible to provide the power circuit on any of, or on a plurality of, the first substrate 1100, the second substrate 2100, and the third substrate 3100.

The number of pieces of wiring for connecting wiring of the first wiring structure 1120 and wiring of the second wiring structure 2120 by way of a junction surface of the first substrate 1100 and the second substrate 2100 is defined herein as "a first connection number". The number of pieces of wiring for connecting wiring of the second wiring structure 2120 and wiring of the third wiring structure 3120 by way of a junction surface of the second substrate 2100 and the third substrate 3100 is defined herein as "a second connection number". When this definition is given, the first connection number is greater than the second connection number. Moreover, the first connection number is greater than the second connection number, even with a focus on the pixel area 12.

Connection Relationship Between First Substrate and Second Substrate

FIG. 7 schematically illustrates an electric connection relationship between the first substrate 1100 and the second substrate 2100 in a plan view. The pixels 101 having the photoelectric conversion units 102 including APDs are arranged in a two-dimensional layout.

A connection area 121 illustrated in FIG. 7 corresponds to the junction portion 1040*a* via which the first semiconductor region 1011 of each of the pixels 101 is electrically connected to the second substrate. That is, in the pixel area 12, the first substrate and the second substrate are electrically connected to each other at each of the pixels on a pixel-by-pixel basis.

Wiring 161 illustrated in FIG. 7 corresponds to the wiring 1022*b* illustrated in FIG. 10. A connection area 151 is wiring corresponding to the junction portion 1040*b* that is electrically connected to the wiring 1022*b* illustrated in FIG. 10.

The reference numeral 131 shown in FIG. 7 denotes a unit (a block) in which a predetermined circuit provided on the second substrate is shared by a plurality of pixels 101. For example, the predetermined circuit is a TDC circuit provided on the first substrate. That is, as illustrated in FIG. 8, which will be described below, in the example illustrated in FIG. 7, pixels of a four-times-four matrix, sixteen pixels in total, share one TDC circuit. With this structure, it is possible to reduce the size of areas occupied by TDC circuits in the second substrate. Moreover, it is possible to reduce variation in signal timing in blocks. For example, the TDC circuits are arranged at the center of blocks in the second substrate, and wire routing from each pixel circuit is designed equally. This makes it possible to reduce variation in signal timing arising from wiring layout differences.

There are at least two schemes for sharing one TDC circuit by pixels of a four-times-four matrix, sixteen pixels in total.

A first scheme is to use pixels of a four-times-four matrix for imaging as one ranging pixel. Since a TDC circuit is large in circuit scale, for example, when many small pixels are arranged, it is difficult to arrange TDC circuits individually for the respective pixels. Therefore, a scheme of sharing one TDC circuit by a plurality of pixels can be adopted. In particular, when used for ranging, unlike a photoelectric conversion apparatus for imaging use, there is no need to use every pixel, and in some instances there is no problem in adopting a scheme of putting signals of a plurality of pixels together into one and outputting it. In this case, a scheme of sharing one TDC circuit by a plurality of pixels is effective. Moreover, for an avalanche diode, there exists dead time till recharging after one photon enters. Even if the next photon enters the same pixel during the dead time, it is impossible to detect it in the form of a signal. For this reason, configuring pixels of a four-times-four matrix as one ranging pixel makes it possible to reduce count losses caused by the dead time, as compared with when one ranging pixel is made up of one pixel only. However, if this scheme is adopted, it is impossible to identify from which one of the pixels the signal has been outputted.

A second scheme is to input, from each of pixels of a four-times-four matrix, address information of said each pixel into a TDC circuit, together with an output signal from a photoelectric conversion unit, and process it. With this method, unless light enters a plurality of pixels simultaneously, it is possible to identify an output from which one of the pixels the acquired light arrival time corresponds to.

Connection Relationship Between Second Substrate and Third Substrate

FIG. 8 schematically illustrates an electric connection relationship between the second substrate 2100 and the third substrate 3100 in a plan view. In FIG. 8, the vertical scanning circuit unit 202, the horizontal scanning circuit unit 203, and the control pulse generation unit 206 having been described with reference to FIG. 3 are omitted.

A connection area 221 illustrated in FIG. 8 corresponds to the junction portion 2040*a* that is in junction with the junction portion 1040*a* illustrated in FIG. 10. A circuit 241 is, for example, a TDC circuit, and one circuit is provided for each of blocks 231. In the example illustrated in FIG. 8, since signals outputted from sixteen pixels are processed by one circuit 241, one circuit 241 is provided for each one block 231. Plural circuits 241 provided on each column of blocks are connected via wiring 261. Each of the circuits 241 is provided for the corresponding block 231. A first circuit 241 corresponding to a first block 231 is provided in such a way as to overlap with the first block 231 in a plan view. This layout makes it possible to reduce a signal propagation delay because of a shorter physical distance from a plurality of photoelectric conversion units belonging to the first block 231 to the first circuit 241 configured to process output signals from these photoelectric conversion units. Therefore, it is possible to reduce variation in timing of processing signals among a plurality of pixels belonging to each block.

In addition, in FIG. 8, a DFE 242 is provided correspondingly for each of the columns of blocks, and each of the DFEs 242 is connected to the wiring 261. An output from the DFE 242 is inputted into the third substrate 3100 via TSV wiring 252 (the TSV wiring 5040 illustrated in FIG. 10). As described here, in the second substrate 2100, the DFE 242 is the last signal processing circuit and outputs a signal to the third substrate 3100. Therefore, providing the DFE 242 on the side where the TSV wiring 252 (5040), via which the second substrate 2100 is connected to the third substrate 3100, is provided is advantageous for efficient wire routing. That is, in a case where the TSV wiring via which the second substrate 2100 is connected to the third substrate 3100 is provided in a predetermined direction with respect to the pixel area in a plan view, the DFE 242 is also provided in the predetermined direction with respect to the pixel area. Specifically, in FIG. 8, the predetermined direction is toward the bottom of the sheet of FIG. 8 with respect to the pixel area.

Moreover, in the present embodiment, the DFE 242 is provided in the second substrate 2100, and the DFE 242 is not provided in the third substrate 3100. Therefore, it follows that the DFE 242 is provided between the circuit 241 (TDC circuit), which is a part of the pixel circuit, and the TSV wiring 252 (5040). If the pixel circuit is connected to the TSV wiring 252 (5040) and if the TDC circuit is provided downstream thereof, capacitance added to the pixel circuit increases. Therefore, a signal propagation delay occurs, which might result in variation in signal processing. In view of this, the DFE 242 is provided between the TDC circuit and the TSV wiring 252 (5040), thereby suppressing the problem described above.

In FIG. 8, TSV wiring 251 (the TSV wiring 5010 illustrated in FIG. 10) of the second substrate 2100 is wiring via which the voltage VL is supplied to the APDs 103. TSV wiring 253 (the TSV wiring 5020 illustrated in FIG. 10) of the second substrate 2100 is wiring via which a drive voltage is supplied to the second substrate 2100.

Connection Relationship Between Third Substrate and Other Members

FIG. 9 schematically illustrates an electric connection relationship between the third substrate 3100 and the outside of the semiconductor device, the second substrate 2100, and the first substrate 1100 in a plan view.

In FIG. 9, the memory 301, the control circuit units 302 and 303, the first signal processing unit 304, and the second signal processing unit 305 that are illustrated in FIG. 4 are illustrated.

At a top part of FIG. 9, TSV wiring 354 (the TSV wiring 5030 illustrated in FIG. 10) and TSV wiring 355 (the TSV wiring 5020 illustrated in FIG. 10) are illustrated. At a bottom part of FIG. 9, TSV wiring 352 (the TSV wiring 5030 illustrated in FIG. 10), TSV wiring 353 (the TSV wiring 5020 illustrated in FIG. 10), and TSV wiring 351 (the TSV wiring 5030 illustrated in FIG. 10) are illustrated.

Referring back to FIG. 10, the junction portion 1040*a* and the junction portion 1040*b* of the first substrate include a plurality of junction portions not electrically connected to the first semiconductor region 1011 of the first substrate 1100 or to a semiconductor region constituting a circuit of the second substrate 2100. These junction portions are provided for the purpose of strengthening the bonding of the first substrate 1100 and the second substrate 2100 to each other. These junction portions may be electrically floating or electrically connected to either a drive voltage or a ground voltage.

Manufacturing Method

FIGS. 11 to 13B are diagrams for explaining a method of manufacturing a photoelectric conversion apparatus 1000 according to the first embodiment.

Figure 11:
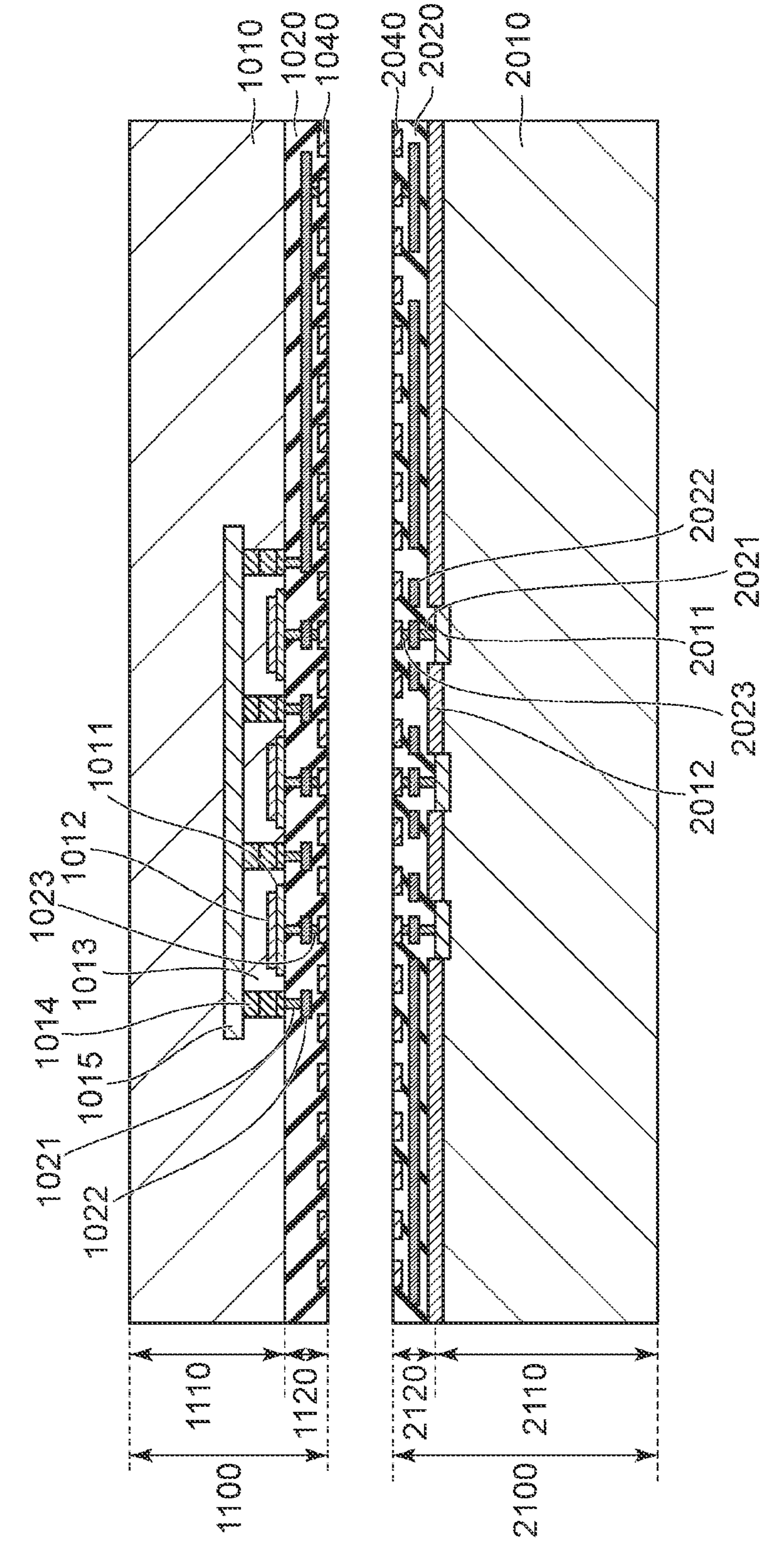
FIG. 11 is a diagram illustrating a step of manufacturing the photoelectric conversion apparatus according to the first embodiment.

FIG. 11 is a diagram illustrating a step of bonding the first substrate 1100 and the second substrate 2100 to each other. Specifically, the first substrate 1100 and the second substrate 2100 are stacked in layers such that the wiring structure 1120 of the first substrate (first wiring structure) and the wiring structure 2120 of the second substrate (second wiring structure) are provided between the first semiconductor layer 1010 and the second semiconductor layer 2010. In this step, the junction portion 1040 of the first substrate and the junction portion 2040 of the second substrate are joined to each other to become a metal junction portion.

Figure 12:
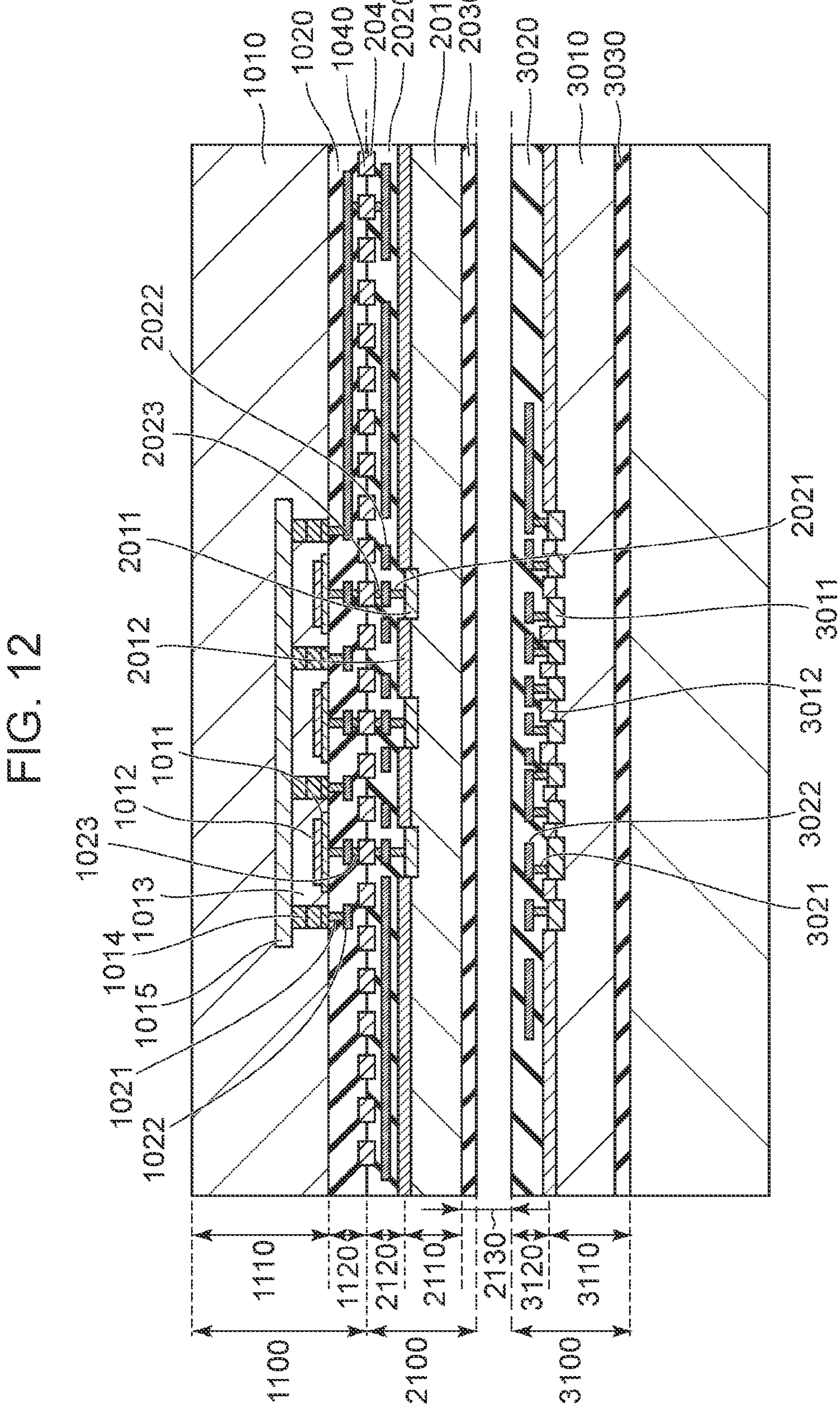
FIG. 12 is a diagram illustrating a step of manufacturing the photoelectric conversion apparatus according to the first embodiment.

FIG. 12 is a diagram illustrating a step of, after the stacking of the first substrate 1100 and the second substrate 2100, the third substrate 3100 is stacked on these substrates. Specifically, the third substrate is stacked such that the wiring structure 3020 (third wiring structure) thereof is provided between the second semiconductor layer 2010 and the third semiconductor layer 3010.

Before the stacking of the third substrate 3100, the second semiconductor layer 2010 of the second substrate 2100 is made thinner through a thinning step. In addition, after the step of making the second semiconductor layer 2010 thinner, an insulation layer 2030 is provided. The insulation layer 2030 is a layer made of, for example, silicon oxide. Thereafter, as illustrated in FIG. 12, the third substrate 3100 is stacked on a stacked body made up of the first substrate 1100 and the second substrate 2100.

Figure 13A:
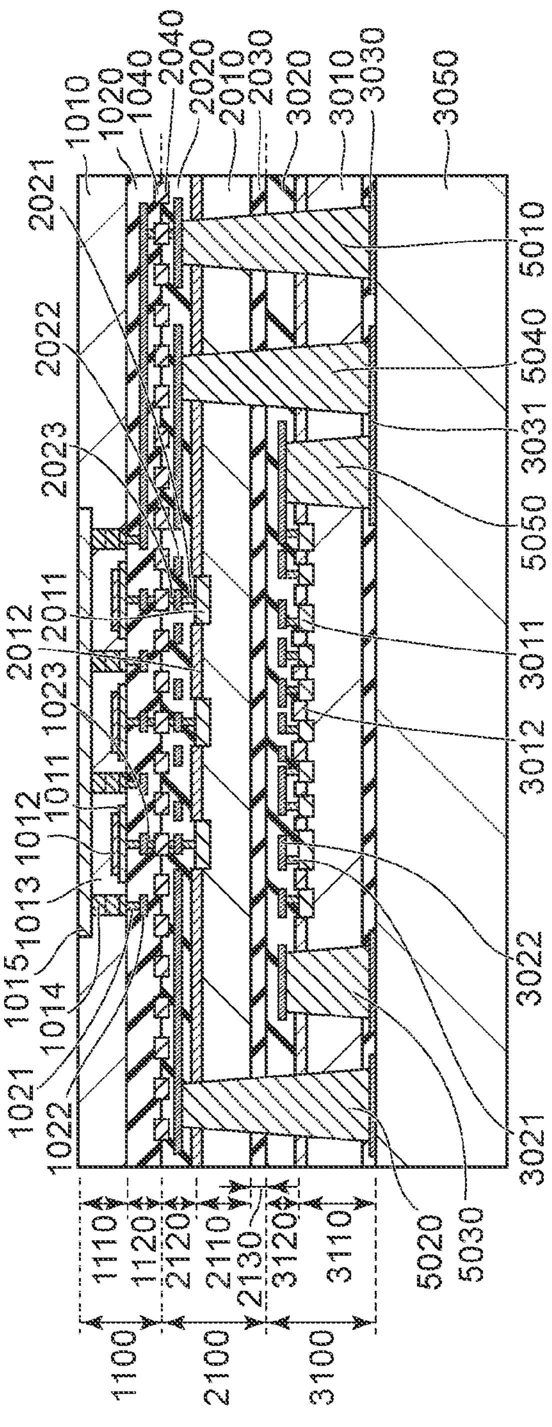
FIG. 13A is a diagram illustrating a step of manufacturing the photoelectric conversion apparatus according to the first embodiment.

FIG. 13A is a diagram illustrating a wiring step of providing TSVs and a thinning step of making the first substrate thinner. Specifically, the TSV wiring 5010 to 5050 and the like are formed, and a supporting substrate 3050 for the third substrate is provided on the third-semiconductor-layer-side 3010 surface (back surface) of the third substrate 3100. Next, a thinning step of making the first semiconductor layer 1010 of the first substrate 1100 thinner from the light-incident-surface side (back-surface side) is performed. The supporting substrate 3050 is a substrate needed in this step of making the first semiconductor layer 1010 thinner.

Figure 13B:
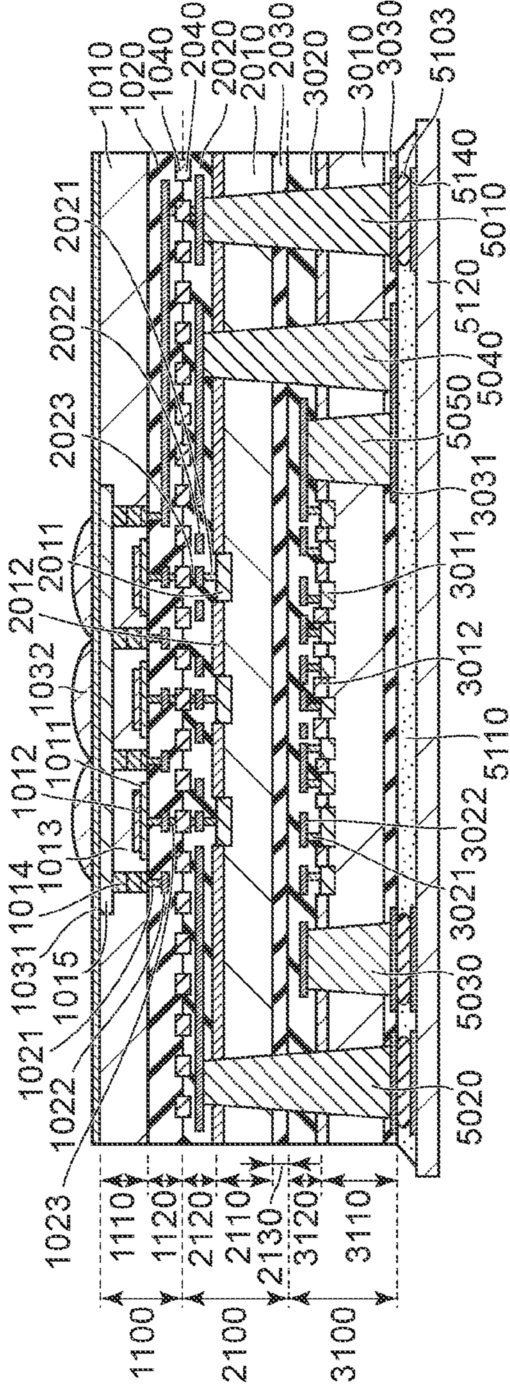
FIG. 13B is a diagram illustrating a step of manufacturing the photoelectric conversion apparatus according to the first embodiment.

FIG. 13B is a diagram illustrating a wafer step and a mounting step of the latter half of the process. Specifically, first, the pinning layer 1031 and the micro lenses 1032 are provided. Next, the supporting substrate 3050 for the third substrate is removed. This finishes the wafer step. Finally, as the mounting step, the package substrate 5120 is mounted, with the bumps 5130 and the insulating bonding region 5110 sandwiched therebetween.

The thickness of the first substrate 1100, in which pixels are provided, is about one-fifth to one-tenth of the thickness of the second substrate 2100 and the thickness of the third substrate 3100. This is because the thickness of the first semiconductor layer 1110 is reduced to 2 to 10 μm or so through the thinning step mentioned above in accordance with the wavelength of light of photoelectric conversion. The thickness of the second substrate 2100 and the thickness of the third substrate 3100 are determined depending on elements provided in the respective substrates; for example, in a case where a DRAM is provided as a memory in the third substrate 3100, the third substrate 3100 is configured to have a thickness of 50 to 100 μm or so. The same holds true for a case where a processing circuit other than a memory is provided in the third substrate. The number of layers of wiring provided in the wiring structure 1120 of the first substrate 1100 is smaller than the number of layers of wiring provided in a wiring structure of a substrate in which a memory or a processing circuit is provided. Both of the number of layers of wiring provided in the wiring structure 1120 of the first substrate 1100 and the number of layers of wiring provided in a wiring structure of a substrate in which a memory or a processing circuit is provided are five to ten or so. In each wiring structure, wiring that differs in terms of a chief constituent from one wiring layer to another may be provided. The chief constituent is, for example, aluminum, copper, tungsten, or the like. For example, the chief constituent of one of six wiring layers may be aluminum, and the chief constituent of the other five layers may be copper. Moreover, the chief constituent contained in the largest number of wiring layers in one wiring structure may be different from the chief constituent contained in the largest number of wiring layers in another wiring structure. For example, the chief constituent contained in the largest number of wiring layers in the wiring structure 1120 of the first substrate 1100 may be copper, whereas the chief constituent contained in the largest number of wiring layers in the wiring structure 2120 of the second substrate 2100 may be aluminum.

Second Embodiment

Figure 14:
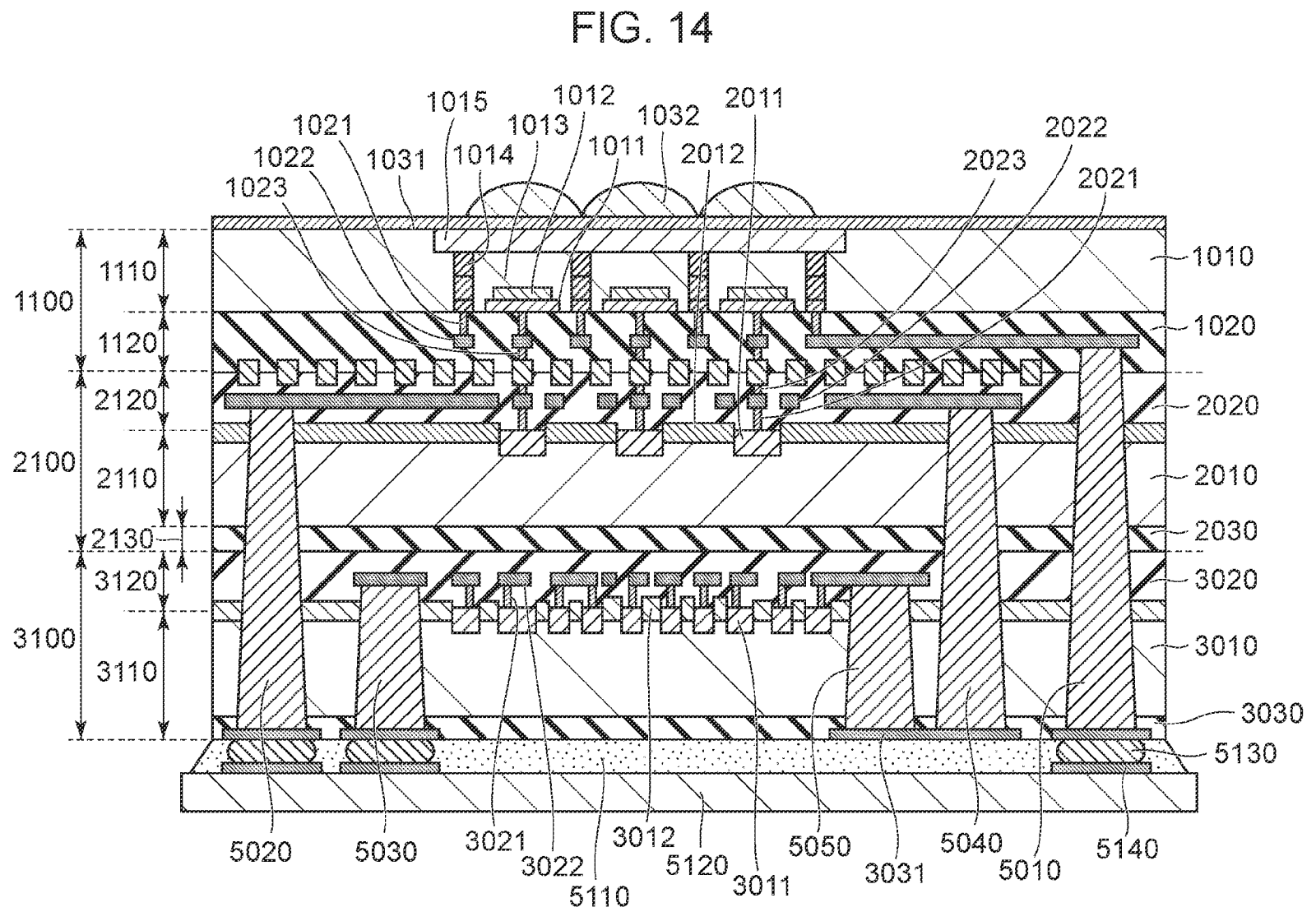

A second embodiment is illustrated in FIG. 14. The second embodiment is different from the first embodiment in terms of contact with the wiring structure 1120 of the first substrate.

That is, the TSV wiring 5010 is in contact with the wiring structure 2120 of the second substrate in the first embodiment as illustrated in FIG. 10, whereas the TSV wiring 5010 extends through the wiring structure 2120 of the second substrate and is in contact with the wiring structure 1120 of the first substrate in the second embodiment. Moreover, the TSV wiring 5010 transmits supplied voltage not via metal bonding provided in the wiring structure 1120 of the first substrate and the wiring structure 2120 of the second substrate.

The voltage VL supplied to the TSV wiring 5010 is a voltage that is supplied to the fourth semiconductor region 1014 and is high. In addition, circuits to which fine processes are applied can be provided in the signal processing unit 210 provided in the second substrate 2100. Therefore, it is possible to supply the voltage directly to the fourth semiconductor region 1014 via the TSV wiring 5010 without going through wiring provided in the wiring layers of the wiring structure 2120 of the second substrate. By this means, it is possible to reduce the possibility of damaging the circuits to which fine processes are applied and which are provided in the second substrate 2100.

Third Embodiment

Figure 15:
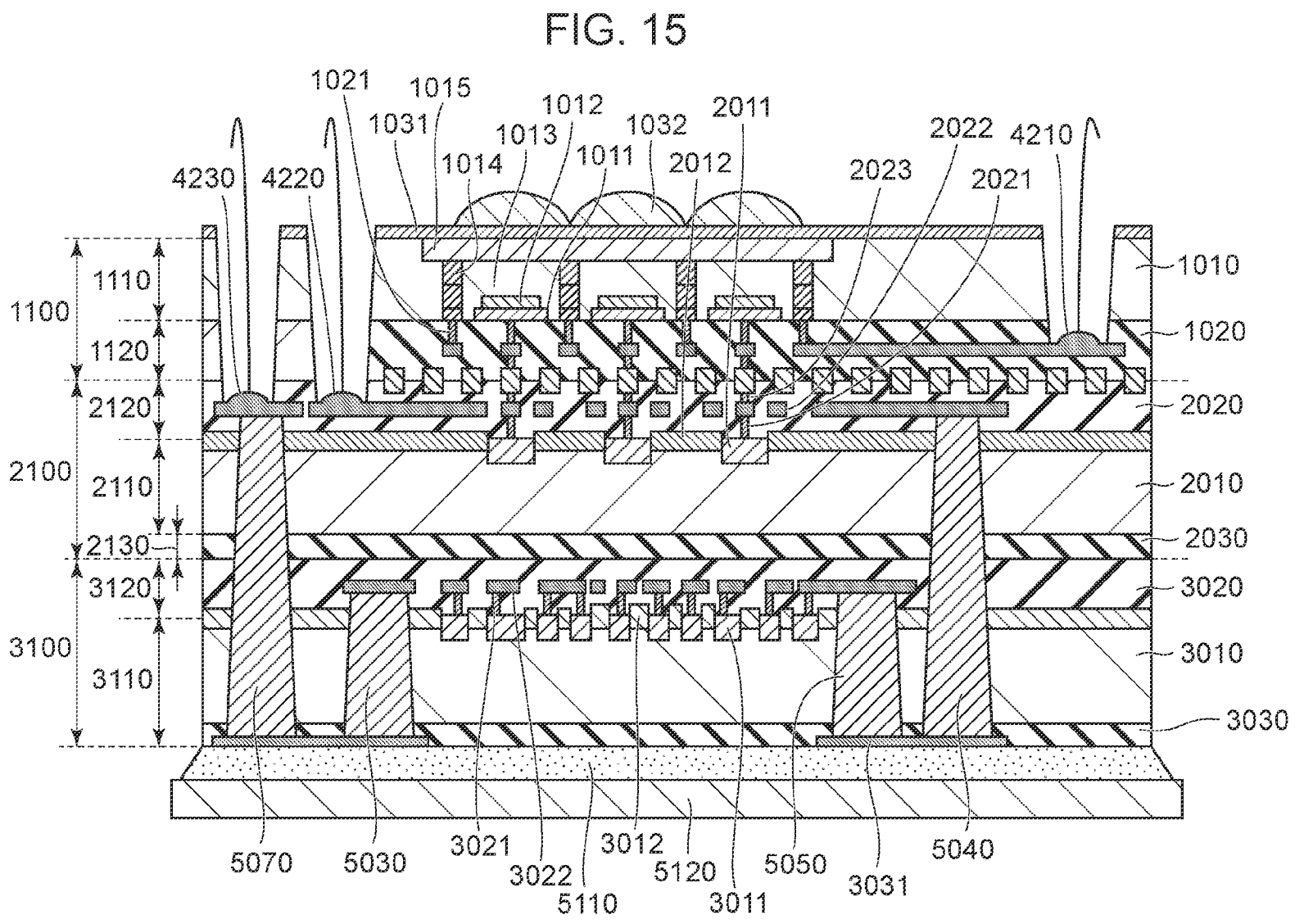

A third embodiment is illustrated in FIG. 15. The third embodiment is different from the first embodiment and the second embodiment in that electrodes that are electrically connected to the outside are provided on the light-incident side.

That is, in the first embodiment and the second embodiment, the electrode 5140, which is provided in the opposite-side surface (second surface) in relation to the light-incident surface (first surface), is an electrode that is electrically connected to the outside. By contrast, in the third embodiment, electrodes 4210, 4220, and 4230, which are provided on the light-incident side, are electrodes that are electrically connected to the outside. The electrodes 4210 to 4230 are also called "pad electrode".

As described above, the voltage VL supplied to the fourth semiconductor region 1014 is a high voltage, and circuits to which fine processes are applied are provided in the second substrate 2100. Therefore, by adopting a configuration in which a voltage supplied from the electrode 4210 is supplied to the first substrate 1100 only as illustrated in FIG. 15, it is possible to avoid a high voltage from being applied to the circuits to which fine processes are applied and are provided in the second substrate 2100.

Moreover, in FIG. 15, the electrode 4220 via which a drive voltage for the second substrate 2100 is supplied from the outside is provided in a wiring layer of the wiring structure 2120. In some instances a circuit needed for high-speed operation is provided in the second substrate 2100. A case where a drive voltage is supplied to wiring layers of the wiring structure 2120 of the second substrate via the wiring structure 1120 of the first substrate is defined here as a first case. A case where the voltage is supplied to the wiring structure 2120 of the second substrate directly is defined as a second case. The length of wiring from the electrode connected to the outside to the circuits provided in the second substrate 2100 in the second case is less than said length in the first case. As the wiring length increases, because of a signal propagation delay, there is a possibility that the operation of a circuit needed for high-speed operation might be slower. In view of this, in the present embodiment, the electrode 4220 via which a drive voltage for the second substrate 2100 is supplied from the outside is provided in a wiring layer of the wiring structure 2120.

Furthermore, in FIG. 15, the electrode 4230 via which a drive voltage for the third substrate 3100 is supplied from the outside is provided in a wiring layer of the wiring structure 2120 of the second substrate. The electrode 4230 is electrically connected to TSV wiring 5070 via the wiring layer of the wiring structure 2120 of the second substrate. The TSV wiring 5070 illustrated in FIG. 15 is wiring corresponding to the TSV wiring 5030 illustrated in FIG. 10. However, the TSV wiring 5070 illustrated in FIG. 15 extends through the semiconductor layer 2010 of the second substrate, the wiring structure 3120 of the third substrate, and the semiconductor layer 3010 of the third substrate and is electrically connected to the TSV wiring 5030.

Fourth Embodiment

Figure 16:
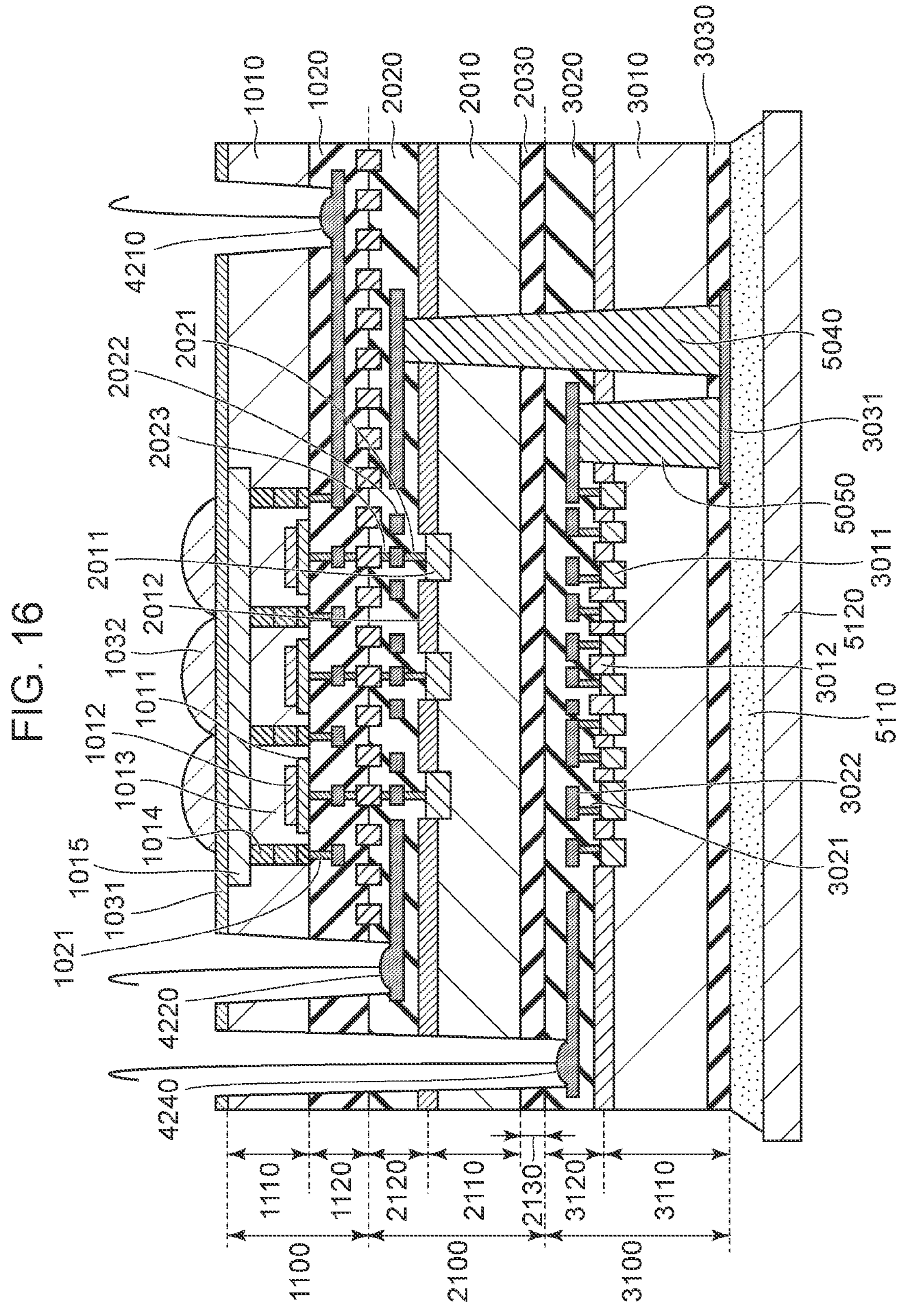
FIG. 16 is a cross-sectional view of a photoelectric conversion apparatus according to a fourth embodiment.

A fourth embodiment is illustrated in FIG. 16. The fourth embodiment is different from the third embodiment in that an electrode which is electrically connected to the outside and via which a drive voltage is supplied to circuits of the third substrate 3100 is provided in the wiring structure 3120 of the third substrate.

In some instances a circuit needed for high-speed operation is provided in the third substrate 3100, too. In view of this, an electrode 4240, via which a drive voltage for the third substrate 3100 is supplied from the outside, can be provided in the wiring structure 3120 of the third substrate as illustrated in FIG. 16. With this structure, it is possible to make the wiring from the electrode 4240, to which the drive voltage is supplied from the outside, to the circuits provided in the third substrate 3100 shorter, and it is possible to reduce the possibility of a delay in the operation of circuits needed for high-speed operation.

When the electrodes 4210, 4220, and 4240 illustrated in FIG. 16 are formed, it is necessary to provide pad openings by etching an interlayer insulation film, etc., that is a part of a wiring structure or a silicon substrate. Since wiring layers with which the three electrodes are in contact are wiring layers different from one another in height level, opening steps the number of which corresponds to the number of the pad openings are needed.

Fifth Embodiment

Figure 17:
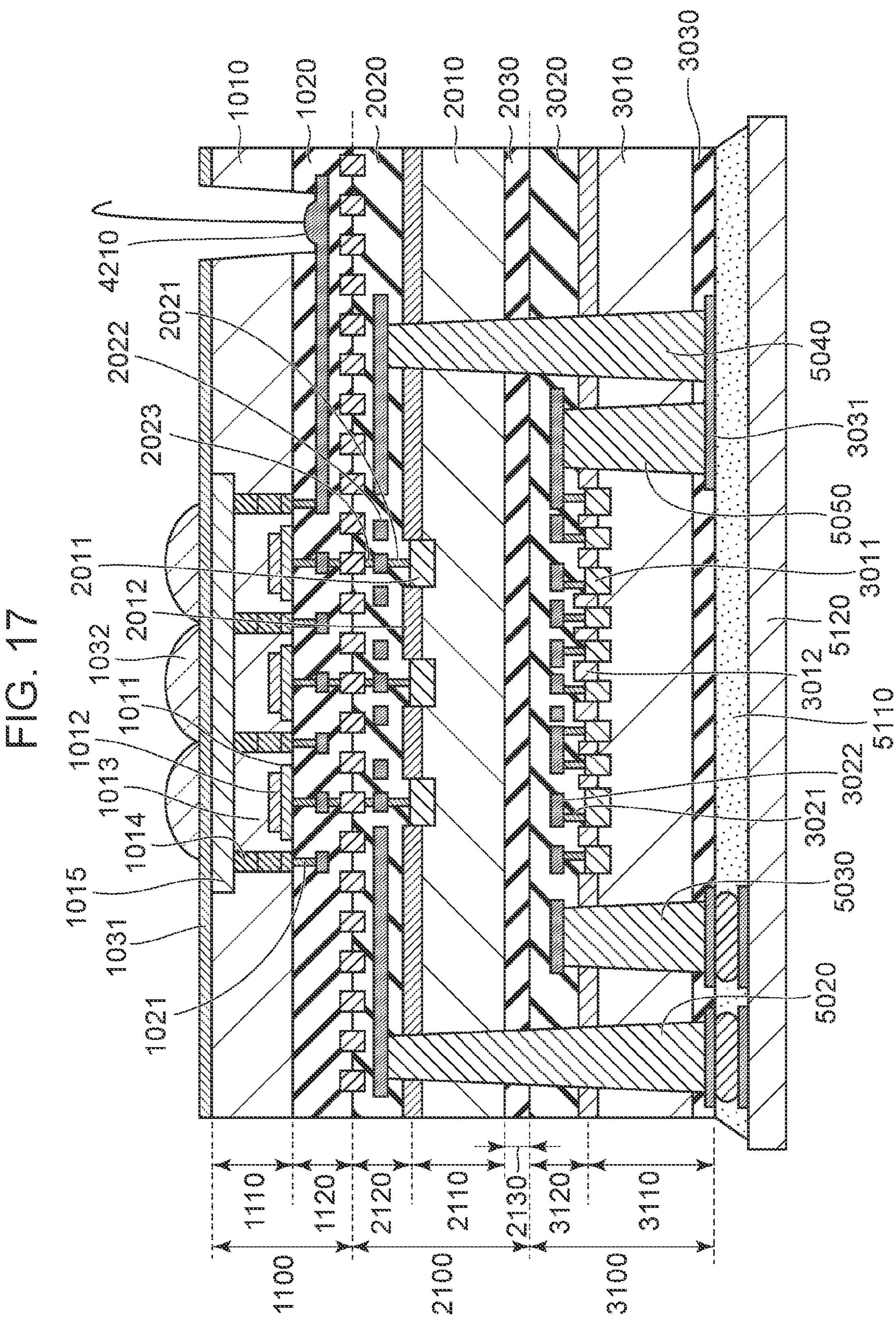
FIG. 17 is a cross-sectional view of a photoelectric conversion apparatus according to a fifth embodiment.

A fifth embodiment is illustrated in FIG. 17. The fifth embodiment is different from the first embodiment and the second embodiment in that an electrode which is electrically connected to the outside and via which a voltage is supplied to the fourth semiconductor region 1014 of the first substrate 1100 is routed out from the light-irradiation-surface side.

That is, in the first embodiment having been described with reference to FIG. 10 and the second embodiment having been described with reference to FIG. 14, all of the electrodes that are electrically connected to the outside are routed out from the opposite-side surface (second surface) in relation to the light-incident surface (first surface). However, for the purpose of suppressing a decrease in reliability, it is desirable to supply, not via the second substrate 2100 and the third substrate 3100, a voltage to high-voltage wiring for supply the first substrate 1100. For this reason, in FIG. 17, the electrode 4210 is provided on a wiring layer of the wiring structure 1120 of the first substrate, and a high voltage is not supplied to the second substrate 2100 nor to the third substrate 3100.

Sixth Embodiment

Figure 18:
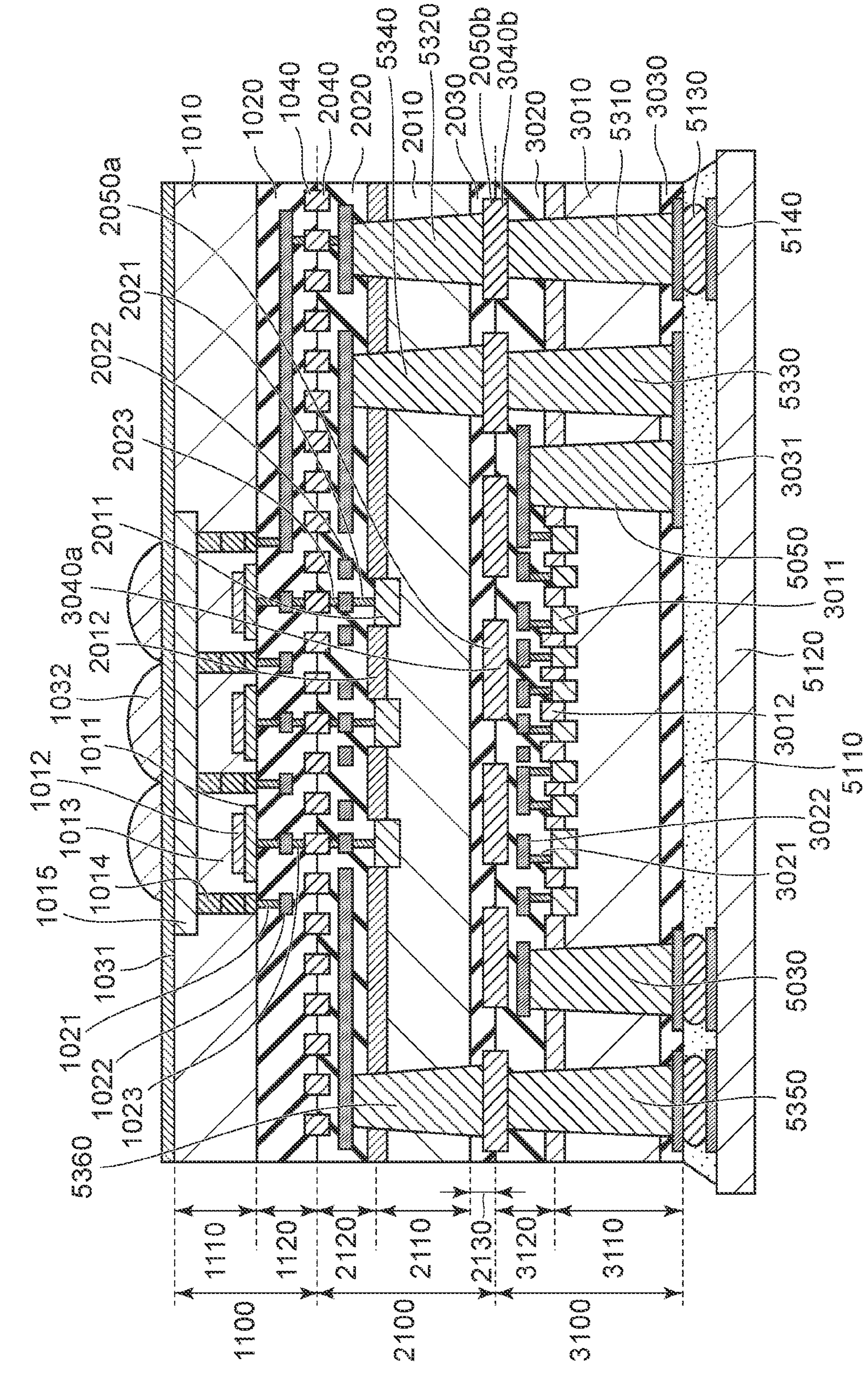
FIG. 18 is a cross-sectional view of a photoelectric conversion apparatus according to a sixth embodiment.

A sixth embodiment is illustrated in FIG. 18. The sixth embodiment is different from the first embodiment in that the wiring structure of the second substrate and the wiring structure of the third substrate have a metal bonding structure.

That is, in FIG. 10, the electrode 5140 is connected to the wiring layer of the wiring structure 2120 of the second substrate by using a single piece of TSV wiring 5010. By contrast, in FIG. 18, the electrode 5140 is connected to the wiring layer of the wiring structure 2120 of the second substrate by using TSV wiring that has a two-tiered structure including two pieces of TSV wiring 5310 and 5320. In addition, a metal bonding structure made up of a junction portion **2050*b* of the second substrate and a junction portion 3040*b* of the third substrate joined to each other is provided between the TSV wiring 5310 and the TSV wiring 5320**.

Moreover, in FIG. 18, the TSV wiring 5040 illustrated in FIG. 10 is also replaced with TSV wiring that has a two-tiered structure including TSV wiring 5330 and TSV wiring 5340. In addition, a metal bonding structure is provided between the TSV wiring 5330 and the TSV wiring 5340.

Furthermore, in FIG. 18, the TSV wiring 5020 illustrated in FIG. 10 is also replaced with TSV wiring that has a two-tiered structure including TSV wiring 5350 and the TSV wiring 5360. In addition, a metal bonding structure is provided between the TSV wiring 5350 and the TSV wiring 5360.

The above-described structure illustrated in FIG. 18 makes it unnecessary to provide TSV wiring that extends through both the semiconductor layer 2010 of the second substrate and the semiconductor layer 3010 of the third substrate.

In addition, a metal bonding structure made up of a junction portion 2050*a* of the second substrate and a junction portion 3040*a* of the third substrate joined to each other is provided at the pixel area. This metal bonding structure need not constitute a part of the circuits provided in the substrates. By this means, it is possible to increase the bonding strength of the second substrate 2100 and the third substrate 3100.

Seventh Embodiment

Figure 19:
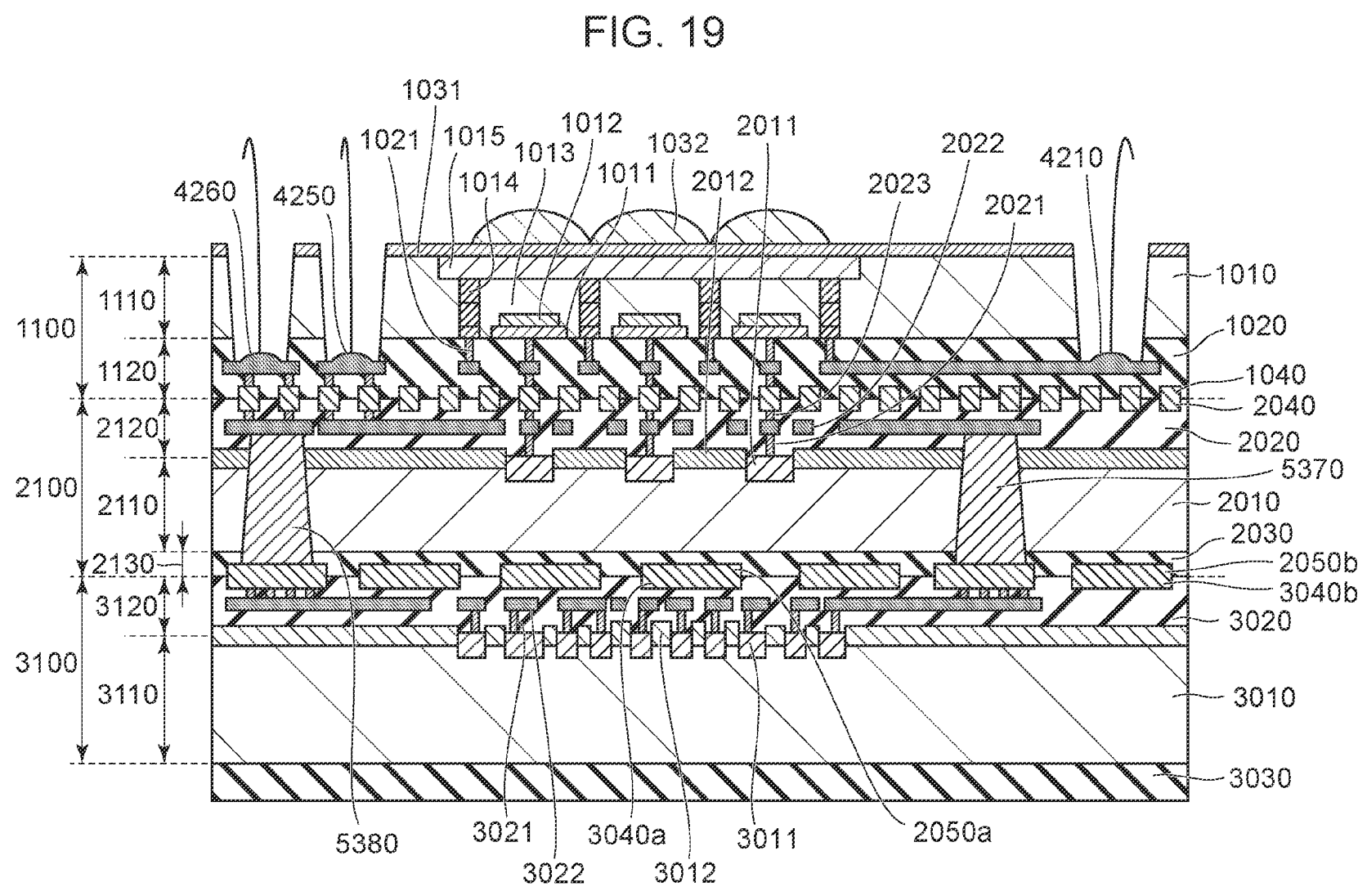

A seventh embodiment is illustrated in FIG. 19. The seventh embodiment is different from the third embodiment illustrated in FIG. 15 in that the second substrate and the third substrate are electrically connected to each other via a metal bonding structure. Moreover, the seventh embodiment is different from the sixth embodiment illustrated in FIG. 18 in that electrodes connected to the outside are provided on the light-incident-surface (first surface) side.

As illustrated in FIG. 19, the junction portion 2050*b* of the second substrate and the junction portion 3040*b* of the third substrate are provided; therefore, in FIG. 19, the TSV wiring 5050 and the TSV wiring 5040 that are illustrated in FIG. 15 are functionally integrated into a single piece of TSV wiring 5370. Though the TSV wiring 5040 extends through both the semiconductor layer 2010 of the second substrate and the semiconductor layer 3010 of the third substrate in FIG. 15, the structure according to the seventh embodiment makes such both-through TSV wiring unnecessary.

In addition, in FIG. 19, the TSV wiring 5030 and the TSV wiring 5070 that are illustrated in FIG. 15 are functionally integrated into a single piece of TSV wiring 5380. Though the TSV wiring 5070 extends through both the semiconductor layer 2010 of the second substrate and the semiconductor layer 3010 of the third substrate in FIG. 15, the structure according to the seventh embodiment makes such both-through TSV wiring unnecessary.

Furthermore, the wiring via which a drive voltage is supplied to the circuits provided in the second substrate is electrically connected to the wiring layer of the wiring structure 1120 of the first substrate via the junction portion 1040*b* of the first substrate and the junction portion 2040*b* of the second substrate. An electrode 4250 is provided on this wiring layer. The electrode 4250 serves as a pad portion for electric connection to the outside.

In addition, the wiring via which a drive voltage is supplied to the circuits provided in the third substrate is electrically connected to the wiring layer of the wiring structure 1120 of the first substrate via the junction portion 2050*b* of the second substrate and the junction portion 3040*b* of the third substrate. An electrode 4260 is provided on this wiring layer. The electrode 4260 serves as a pad portion for electric connection to the outside.

As described above, the electrode 4210, the electrode 4250, and the electrode 4260 are provided in such a way as to be in contact with the same wiring layer of the wiring structure 1120 of the first substrate. For this reason, pad openings formed when forming these electrodes have substantially the same depth. Therefore, as compared with the example illustrated in FIG. 15, it is easier to execute the process of the wiring step.

Eighth Embodiment

Figure 20:
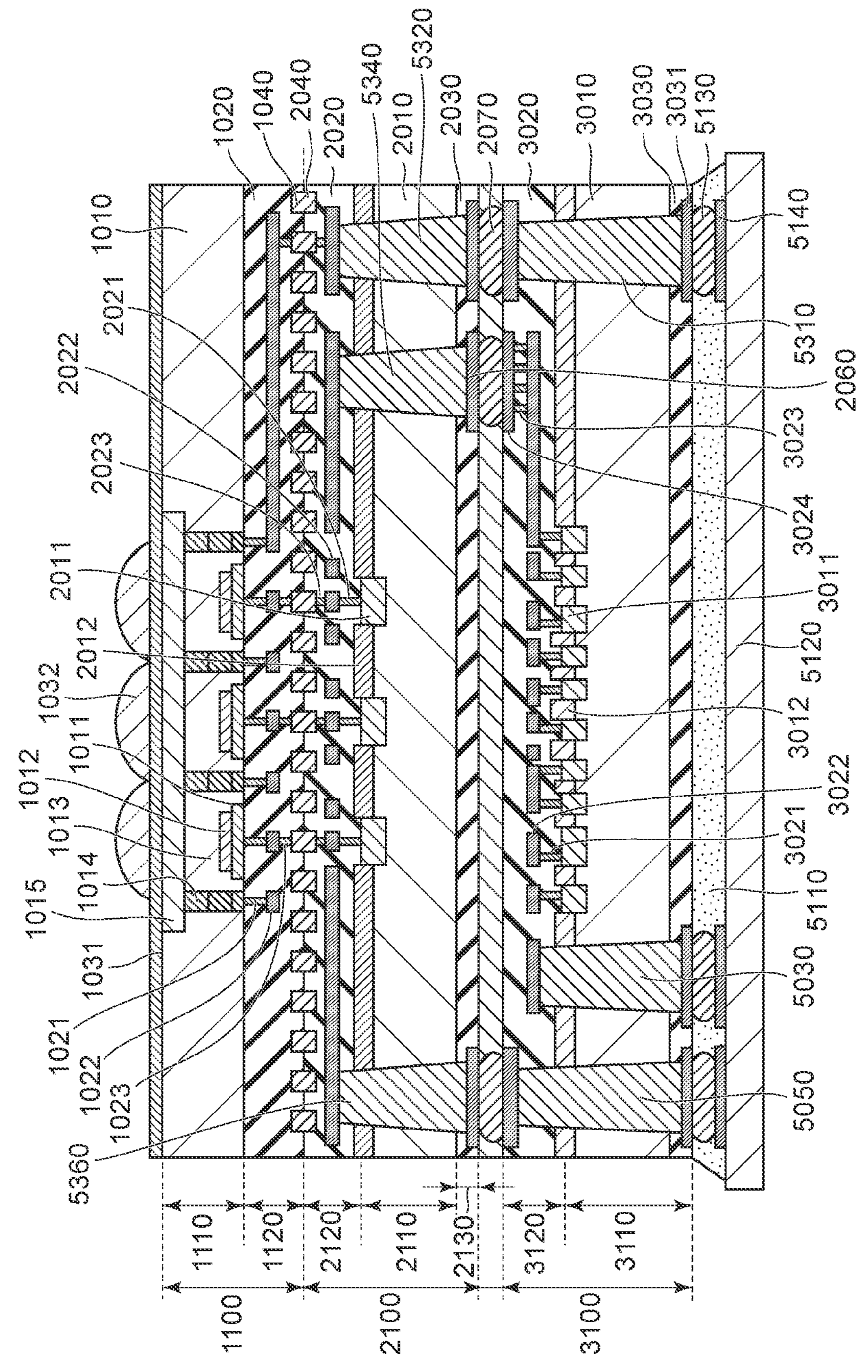
FIG. 20 is a cross-sectional view of a photoelectric conversion apparatus according to an eighth embodiment.

An eighth embodiment is illustrated in FIG. 20. In the sixth embodiment, metal bonding is used for joining the second substrate and the third substrate together. The eighth embodiment is different therefrom in that micro bumps are used for joining the second substrate and the third substrate together.

As illustrated in FIG. 20, the wiring 3021 of the first via wiring and the wiring 3022 of the first wiring layer connected to it are provided in the wiring structure 3120 of the third substrate. In addition, wiring 3023 of the second via wiring connected to the wiring 3022, and wiring 3024 of the second wiring layer connected to the wiring 3023, are provided. On the other hand, in the wiring structure 2120 of the second substrate, wiring 2060 connected to the TSV wiring 5340 is provided, and the wiring 2060 of the second substrate is electrically connected to the wiring 3024 of the third substrate via a micro bump 2070. The micro bump is formed using Cu bump bonding based on solid-phase diffusion or using micro bump bonding based on solder melting. An organic filling material is put into a gap between the micro bumps 2070.

Ninth Embodiment

Figure 21:
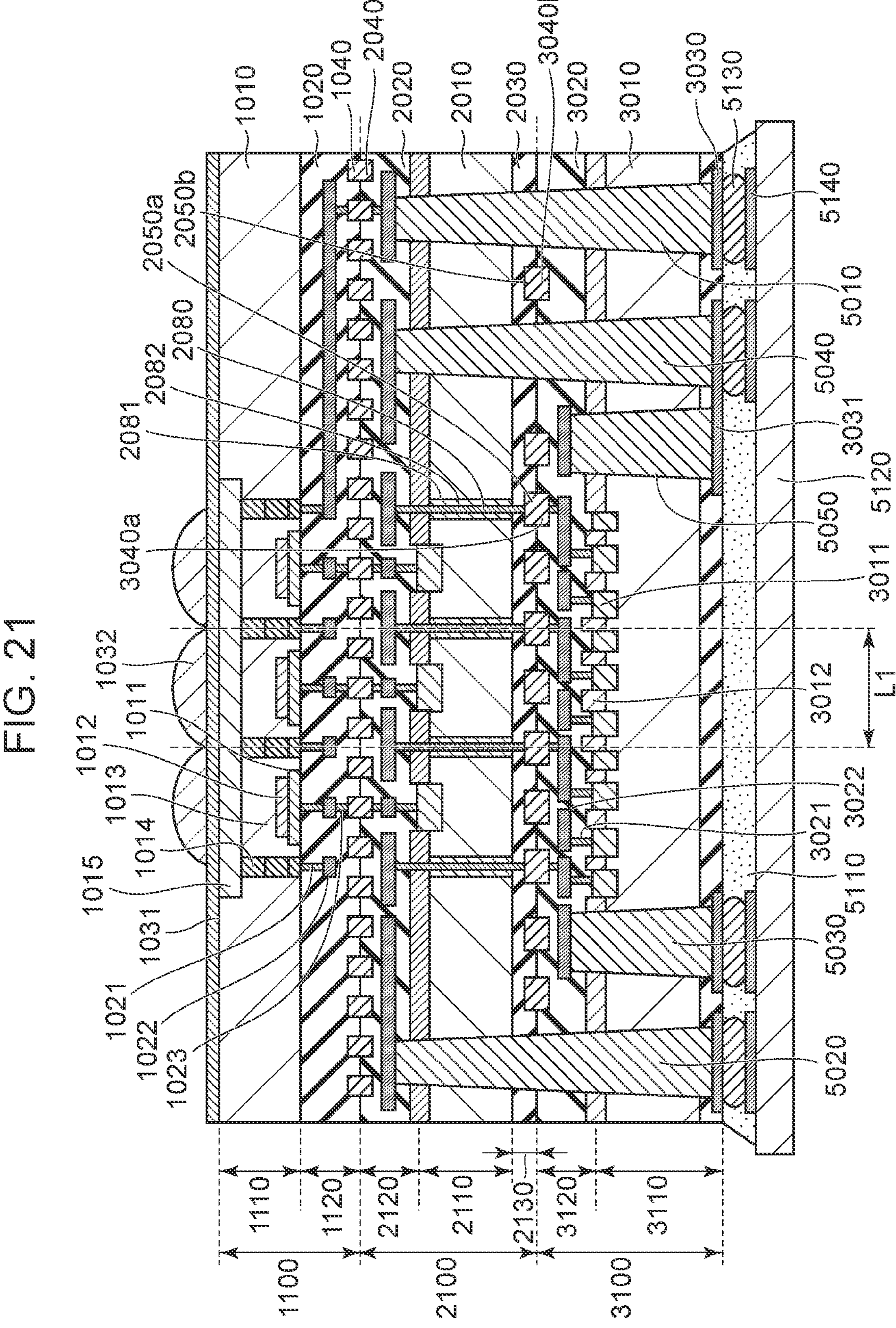
FIG. 21 is a cross-sectional view of a photoelectric conversion apparatus according to a ninth embodiment.

A ninth embodiment is illustrated in FIG. 21. In the first embodiment, TSV wiring is used for inputting a signal outputted from the second substrate into the third substrate. The ninth embodiment is different therefrom in that metal bonding is used for this purpose.

As illustrated in FIG. 21, an output from a circuit provided in the second substrate 2100 is inputted into a circuit provided in the third substrate 3100 via wiring 2080. A trench structure 2081 going deep through the semiconductor layer 2010 of the second substrate, that is, a DTI (Deep Trench Isolation) structure, is formed in the second substrate 2100. The inside of the trench structure 2081 is filled with an insulating material 2082 so as to avoid electric connection between the wiring 2080 and the semiconductor layer 2010 of the second substrate.

In FIG. 21, it is assumed that a circuit corresponding to each of pixels is provided in the second substrate 2100, and it is shown that an output from the circuit corresponding to each of the pixels is inputted into a circuit of the third substrate. In this case, the wiring 2080 is provided correspondingly for each of the pixels, and the wiring 2080 is connected via the junction portion 2050*a* of the second substrate and the junction portion 3040*a* of the third substrate, etc. for the input to the circuit of the third substrate 3100. The circuit of the third substrate 3100 is also provided correspondingly for each of the pixels. That is, in the example illustrated in FIG. 18, a photoelectric conversion unit is electrically connected on a pixel-by-pixel basis via metal bonding to a circuit of the second substrate 2100 to which a signal is inputted from the photoelectric conversion unit. In addition, a circuit of the second substrate 2100 configured to output a signal to a circuit of the third substrate 3100 is electrically connected on a pixel-by-pixel basis via metal bonding to the circuit of the third substrate 3100.

In FIG. 21, a distance between pieces of wiring 2080 located next to each other is denoted as L1. In a case where there exist a plurality of distances each between pieces of wiring 2080 located next to each other, L1 denotes a shortest distance. When P denotes a pitch between pixels, a relation of 0.8 P<L1<1.2 P is met. Preferably, a relation of 0.9 P<L1<1.1 P is met.

A distance between pieces of contact wiring 1021 connected to the first semiconductor region 1011 may be defined as the pitch P. That is, a distance between first contact wiring 1021 connected to the first semiconductor region 1011 of a first pixel and second contact wiring 1021 connected to the first semiconductor region 1011 of a second pixel located next to the first pixel may be defined as the pitch P.

In FIG. 21, the TSV wiring 5040 and 5050 for electric connection between the second substrate 2100 and the third substrate 3100 are provided. In FIG. 10 according to the first embodiment, the TSV wiring 5040, 5050 is wiring for inputting, into the third substrate 3100, signals outputted from the second substrate 2100. In the present embodiment, the pieces of wiring 2080 are used for inputting, into the third substrate 3100, signals outputted from the second substrate 2100; therefore, the TSV wiring 5040 and 5050 may be omitted.

On the other hand, the circuits provided in the second substrate 2100 and the circuits provided in the third substrate 3100 might share power wiring for applying a drive voltage or ground wiring. In this case, a common potential may be supplied to the circuits provided in the second substrate 2100 and the circuits provided in the third substrate 3100 by using the TSV wiring 5040 and 5050 illustrated in FIG. 21. Alternatively, a common potential may be supplied to the circuits provided in the second substrate 2100 and the circuits provided in the third substrate 3100 by using metal bonding wiring that includes the junction portion 2050*b* of the second substrate and the junction portion 3040*b* of the third substrate.

The circuits of the second substrate 2100 provided correspondingly for the respective pixels may be in a layout of translational symmetry when viewed in plan. Alternatively, the circuits of the second substrate 2100 provided correspondingly for the respective pixels may be in a line-symmetric (mirror-symmetric) layout when viewed in plan. In a case where a mirror-symmetric layout is adopted, it is easy to share a part of functions or members by a first circuit of the second substrate 2100 corresponding to a first pixel and a second circuit of the second substrate 2100 corresponding to a second pixel, thereby achieving a smaller space. For example, it is possible to adopt a common well of MOS transistors constituting the first circuit and the second circuit. By this means, it is possible to reduce the area size of the circuits provided in the second substrate 2100. In particular, in a case where the photoelectric conversion units are provided at a narrow pitch, it is possible to avoid a case where the photoelectric conversion units cannot be provided at a narrow pitch due to limitation by the size of the area occupied by the circuits of the second substrate 2100.

In addition, the circuits of the third substrate 3100 provided correspondingly for the respective pixels may be in a layout of translational symmetry or in a line-symmetric (mirror-symmetric) layout when viewed in plan. In the latter case, it is possible to enjoy the above-described benefits.

As described above, FIG. 21 discloses an example in which the circuits of the second substrate 2100 configured to output signals to the circuits of the third substrate 3100, and the circuits of the third substrate 3100, are provided individually for the pixels. However, even in a case where circuits of the second substrate 2100 to which signals are inputted from the photoelectric conversion units are provided on a pixel-by-pixel basis, circuits configured to perform subsequent signal processing might be provided on a plurality-of-pixels-by-plurality-of-pixels basis. That is, one signal processing circuit of the second substrate 2100 is provided for each pixel block. In this case, it follows that a circuit of the second substrate 2100 configured to output a signal to a circuit of the third substrate 3100 is electrically connected not for each of the pixels but for each pixel block via metal bonding to the circuit of the third substrate 3100. Specifically, it follows that the wiring 2080 is provided not for each of the pixels but for each pixel block. In this case, the number of pieces of metal bonding via which the first substrate 1100 and the second substrate 2100 are bonded to each other is greater than the number of pieces of metal bonding via which the second substrate 2100 and the third substrate 3100 are bonded to each other.

Tenth Embodiment

Figure 22:
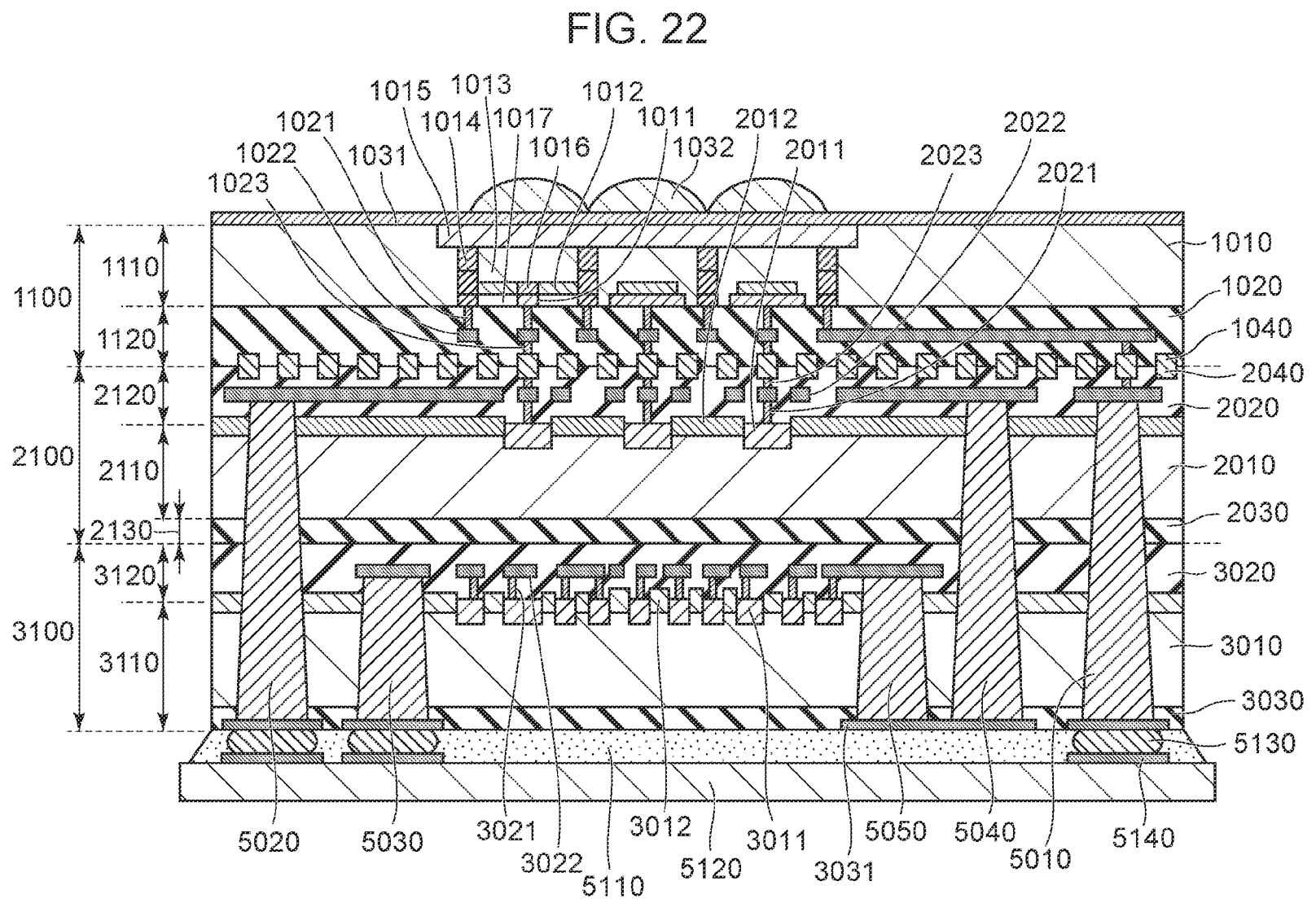

A tenth embodiment is illustrated in FIG. 22. The pixel structure of the photoelectric conversion unit according to the tenth embodiment is different from that of the first embodiment in that it has a smaller avalanche multiplication region.

In FIG. 22, the width (the length in the horizontal direction of the figure) of the first semiconductor region 1011 of the first conductivity type is less than the width of the first semiconductor region 1011 illustrated in FIG. 10. Moreover, though not illustrated, in a plan view, the area size of the first semiconductor region 1011 illustrated in FIG. 19 is smaller than the area size of the first semiconductor region 1011 illustrated in FIG. 10.

Moreover, in a plan view, a sixth semiconductor region 1016 is provided at a position where it overlaps with the first semiconductor region 1011 of the first conductivity type. The sixth semiconductor region 1016 may be either of the first conductivity type or of the second conductivity type. The sixth semiconductor region 1016 is configured such that a potential in relation to signal charges is lower than at the second semiconductor region 1012. For example, if the sixth semiconductor region 1016 is of the first conductivity type, the impurity concentration of the sixth semiconductor region 1016 is lower than the impurity concentration of the first semiconductor region 1011.

Because of the potential structure described above, charges generated at the third semiconductor region 1013 are easier to be collected to the sixth semiconductor region 1016 than the second semiconductor region 1012. The collected signal charges are multiplied at the avalanche multiplication region formed between the sixth semiconductor region 1016 and the first semiconductor region 1011.

Furthermore, a seventh semiconductor region 1017 is provided on both sides next to the first semiconductor region 1011 of the first conductivity type. The conductivity type of the seventh semiconductor region 1017 may be either the first conductivity type or the second conductivity type. For example, if the seventh semiconductor region 1017 is of the first conductivity type, the impurity concentration of the seventh semiconductor region 1017 of the first conductivity type is lower than the impurity concentration of the first semiconductor region 1011. If the seventh semiconductor region 1017 is of the second conductivity type, the impurity concentration of the seventh semiconductor region 1017 is lower than the impurity concentration of the fourth semiconductor region 1014 of the second conductivity type.

With the above-described relationship in impurity concentration, it is possible to reduce the possibility that an avalanche multiplication region will be formed between the first semiconductor region 1011 and the seventh semiconductor region 1017.

Since the present embodiment includes the above-described structure, it is possible to efficiently gather charges generated at the third semiconductor region 1013 and give rise to avalanche multiplication; therefore, it is easier to increase the sensitivity of the photoelectric conversion units. Moreover, since the width or area size of the first semiconductor region 1011 is smaller than in the first embodiment, it is possible to make the avalanche multiplication region smaller; therefore, it is possible to reduce the value of DCR (Dark Count Rate).

Eleventh Embodiment

Figure 23:
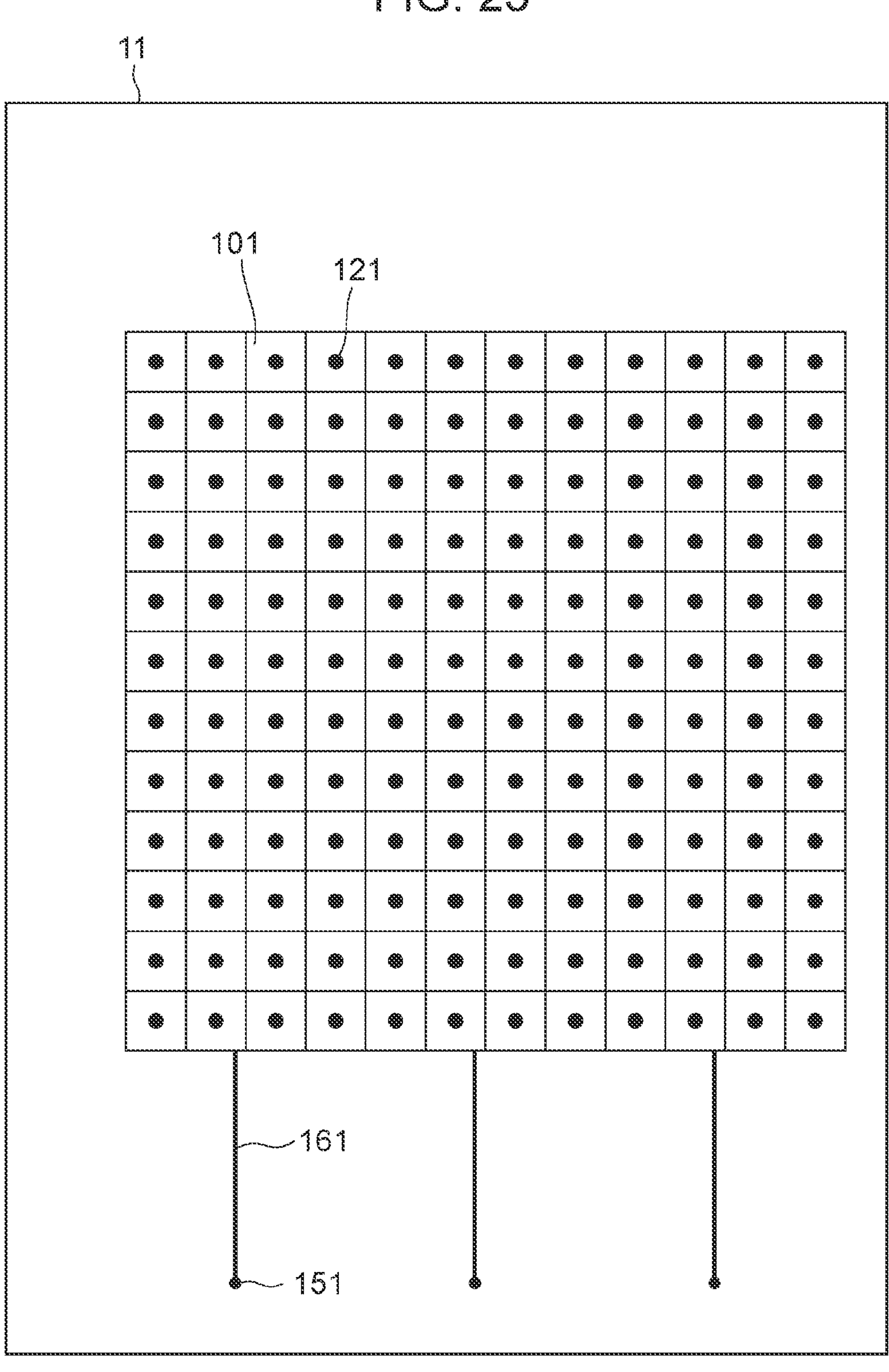
FIG. 23 is a schematic view of an electric connection relationship between the first substrate and the second substrate according to an eleventh embodiment.
Figure 24:
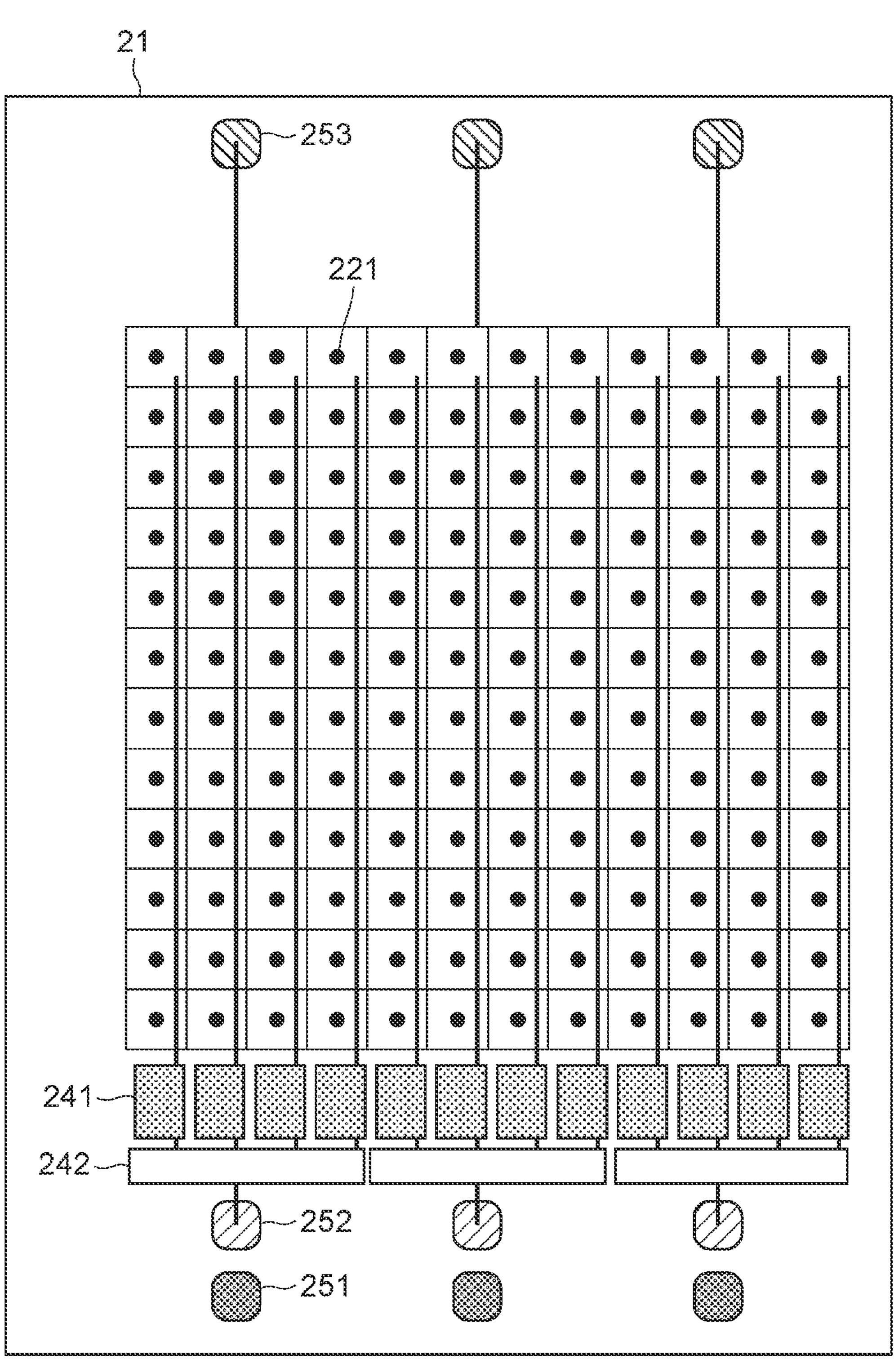
FIG. 24 is a schematic view of an electric connection relationship between the second substrate and the third substrate according to the eleventh embodiment.
Figure 25:
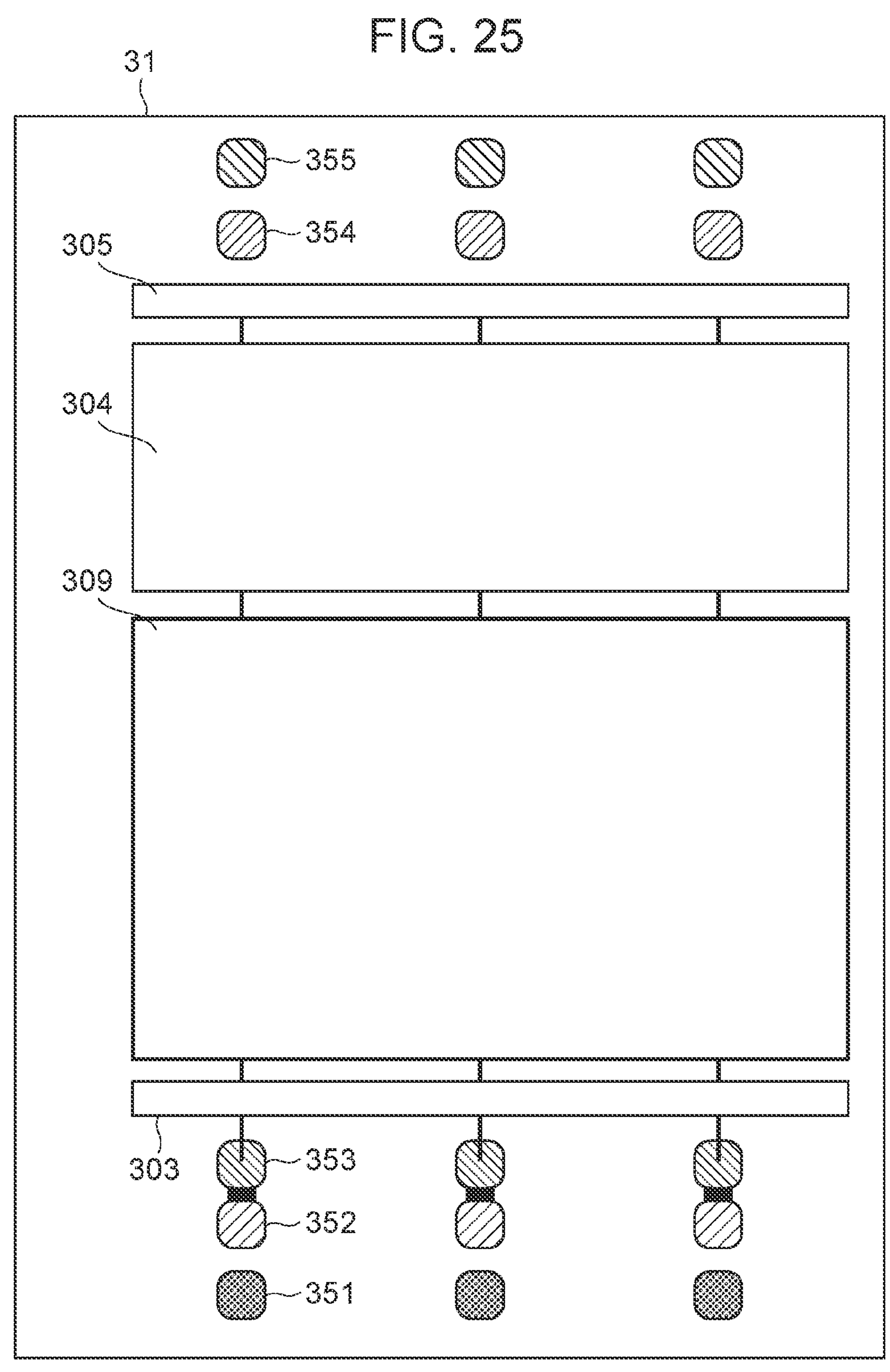
FIG. 25 is a schematic view of an electric connection relationship between the third substrate and another substrate, etc. according to the eleventh embodiment.

An eleventh embodiment is illustrated in FIGS. 23 to 25. FIGS. 1 to 6 and 10 described earlier in the first embodiment apply to the structure of the eleventh embodiment, too. The eleventh embodiment is different from the first embodiment, in which a processing circuit is provided for each pixel block, in that a processing circuit is provided for each pixel column.

FIG. 23 schematically illustrates an electric connection relationship between the first substrate 1100 and the second substrate 2100 in a plan view. The difference from FIG. 7 lies in that the concept of a pixel block is not illustrated therein.

FIG. 24 schematically illustrates an electric connection relationship between the second substrate 2100 and the third substrate 3100 in a plan view. In FIG. 8, the circuit 241 is provided correspondingly for each of blocks, whereas, in FIG. 24, the circuit 241 is provided correspondingly for each of pixel columns. Moreover, in FIG. 8, the circuit 241 is provided at an area overlapping with the pixel area, whereas, in FIG. 24, the circuit 241 is provided at an area not overlapping with the pixel area. That is, in FIG. 24, the circuits 241 are provided at a peripheral area located outside the pixel area. The circuit 241 is, for example, a TDC circuit. With this structure, since heat propagation from the plurality of photoelectric conversion units and heat propagation from the TDC circuit do not interfere with each other, it is possible to suppress heat propagation between the first substrate 1100 and the second substrate 2100. This makes it possible to operate the photoelectric conversion apparatus 100 stably.

The pixel circuit area, at which the pixel circuits configured to process signals from the photoelectric conversion units are provided two-dimensionally, is provided in the second substrate 2100. If the TDC circuits are provided in the pixel area, the size of an area occupied by the pixel circuits will be limited. For realizing sophisticated functions of the pixel circuits, the size of the area occupied by the pixel circuits needs to be large. Therefore, in order to achieve sophisticated functions of the pixel circuits, the TDC circuits are provided at the peripheral area located outside the pixel area. For example, if use as a ToF system is assumed, it is conceivable to provide external-light removing circuits individually for the respective pixels. Providing the TDC circuits at the peripheral area makes it possible to arrange the external-light removing circuits as pixel circuits at the pixel area of the second substrate 2100. This makes it possible to achieve sophisticated functions of the pixel circuits.

Moreover, preferably, the circuit 241 (e.g., TDC circuit) should be disposed at a distance of 2 μm or greater between the circuit 241 and, among the pixel circuits, the one located closest to the circuit 241 in a plan view. Since, in a plan view, the distance between the circuit 241 and the pixel area where the photoelectric conversion units are arranged increases, the distance between the circuit 241 of the second substrate 2100 and the pixel area of the first substrate 1100 also increases. Consequently, even if the pixel area of the first substrate 1100 generates heat, it is possible to reduce the influence of the heat on the TDC circuit. Conversely, even if the TDC circuit of the second substrate 2100 generates heat, it is possible to reduce the influence of the heat on the photoelectric conversion units included in the pixel area of the first substrate 1100.

FIG. 25 schematically illustrates an electric connection relationship between the third substrate 3100 and the outside of the semiconductor device, the second substrate 2100, and the first substrate 1100 in a plan view. The difference from FIG. 9 lies in that the memory 301 is not provided in the third substrate 3100. In FIG. 25, a third signal processing unit 309 is provided instead. That is, signals outputted from the second substrate 2100 are processed by the third substrate 3100 without going through a memory. With this structure, it is possible to make the size of an area where the signal processing unit is provided larger and perform processing with a heavier load than in the first embodiment. For example, it is possible to install a trained model for performing computation with a heavier load.

Twelfth Embodiment

A twelfth embodiment is illustrated in FIGS. 26 to 29. The twelfth embodiment is different from the first embodiment in that the processing result of the signal processing unit provided in the third substrate is fed back to the control circuit unit of the second substrate to realize a photoelectric conversion apparatus that achieves high precision or sophisticated functions.

Figure 26:
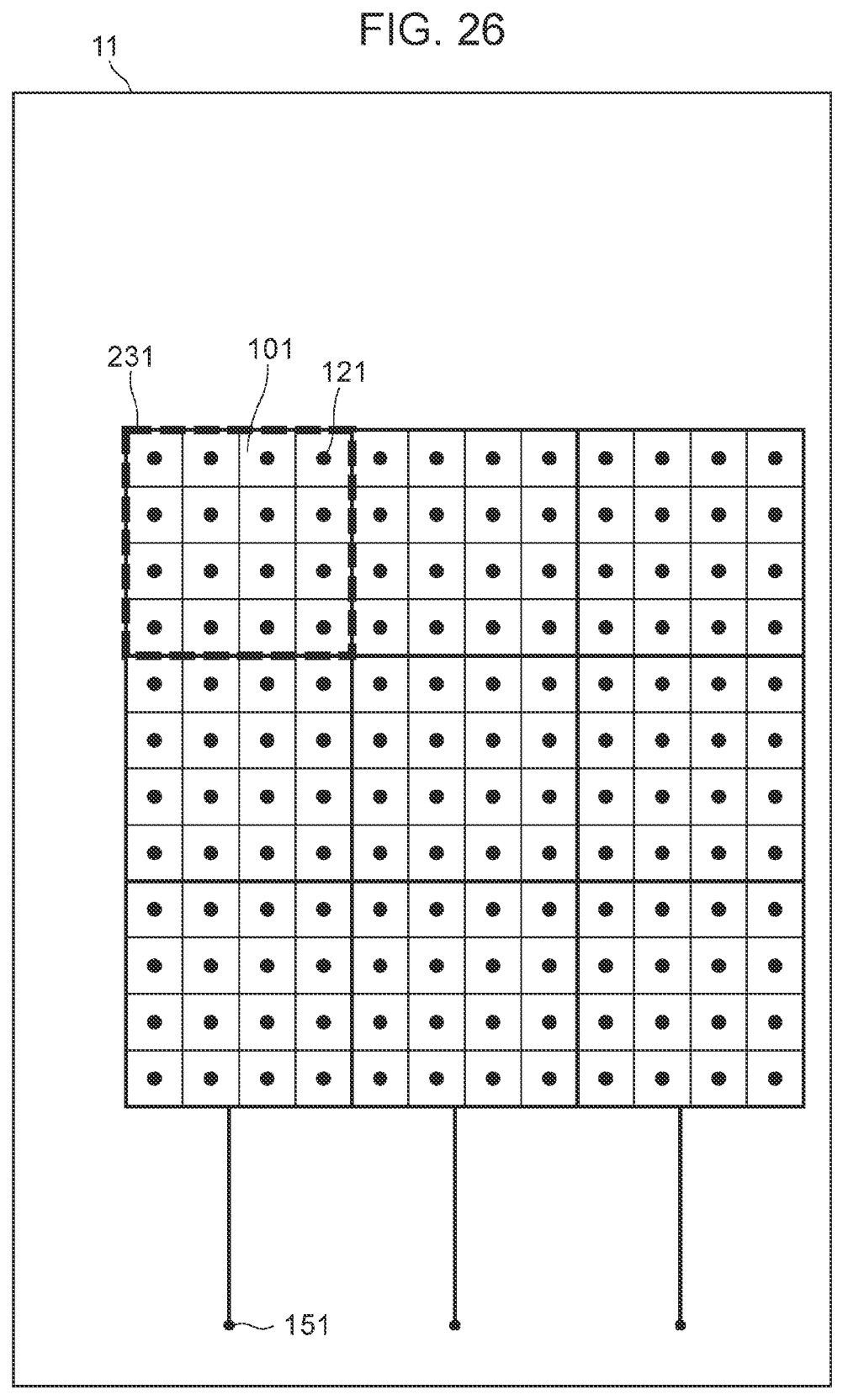

FIG. 26 schematically illustrates an electric connection relationship between the first substrate 1100 and the second substrate 2100 in a plan view. The reference numeral 231 denotes a unit (a block) in which a predetermined circuit provided on the second substrate is shared by a plurality of pixels 101.

Figure 27:
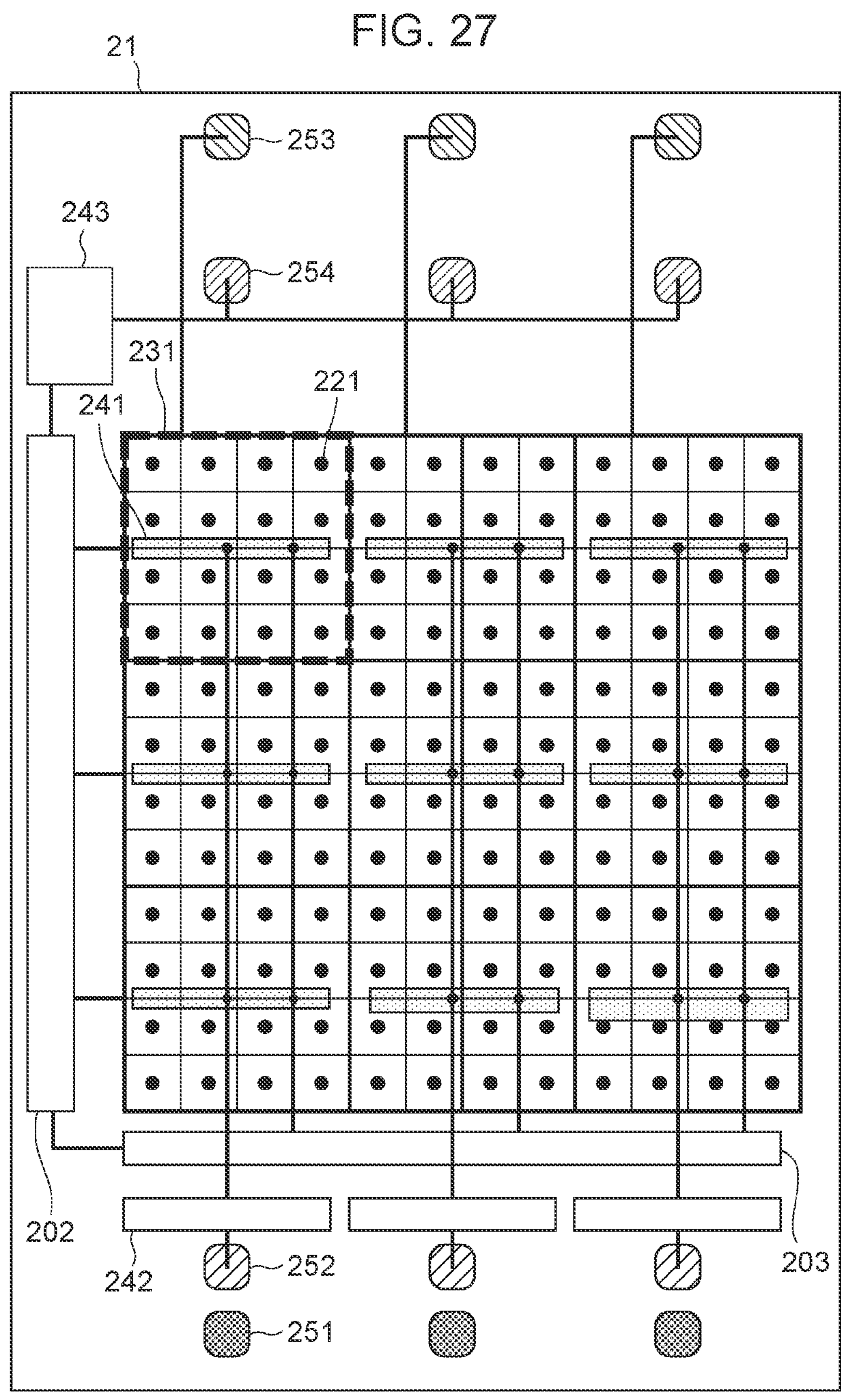
FIG. 27 is a schematic view of an electric connection relationship between the second substrate and the third substrate according to the twelfth embodiment.

FIG. 27 schematically illustrates an electric connection relationship between the second substrate 2100 and the third substrate 3100 in a plan view. In FIG. 27, the vertical scanning circuit unit 202 and the horizontal scanning circuit unit 203 (they may be collectively referred to as "scanning circuit unit"), which are omitted in FIG. 8 described earlier in the first embodiment, are illustrated. Moreover, a control unit 243 for controlling the scanning circuit unit 202, 203 or other circuits is provided. FIG. 27 illustrates an example in which the control unit 243 controls the scanning circuit unit 202, 203. In the example illustrated in FIG. 27, a control line is provided from the scanning circuit unit 202, 203 to the pixel circuit unit on a block-by-block basis; however, the control line may be provided on a pixel-by-pixel basis.

Figure 29:
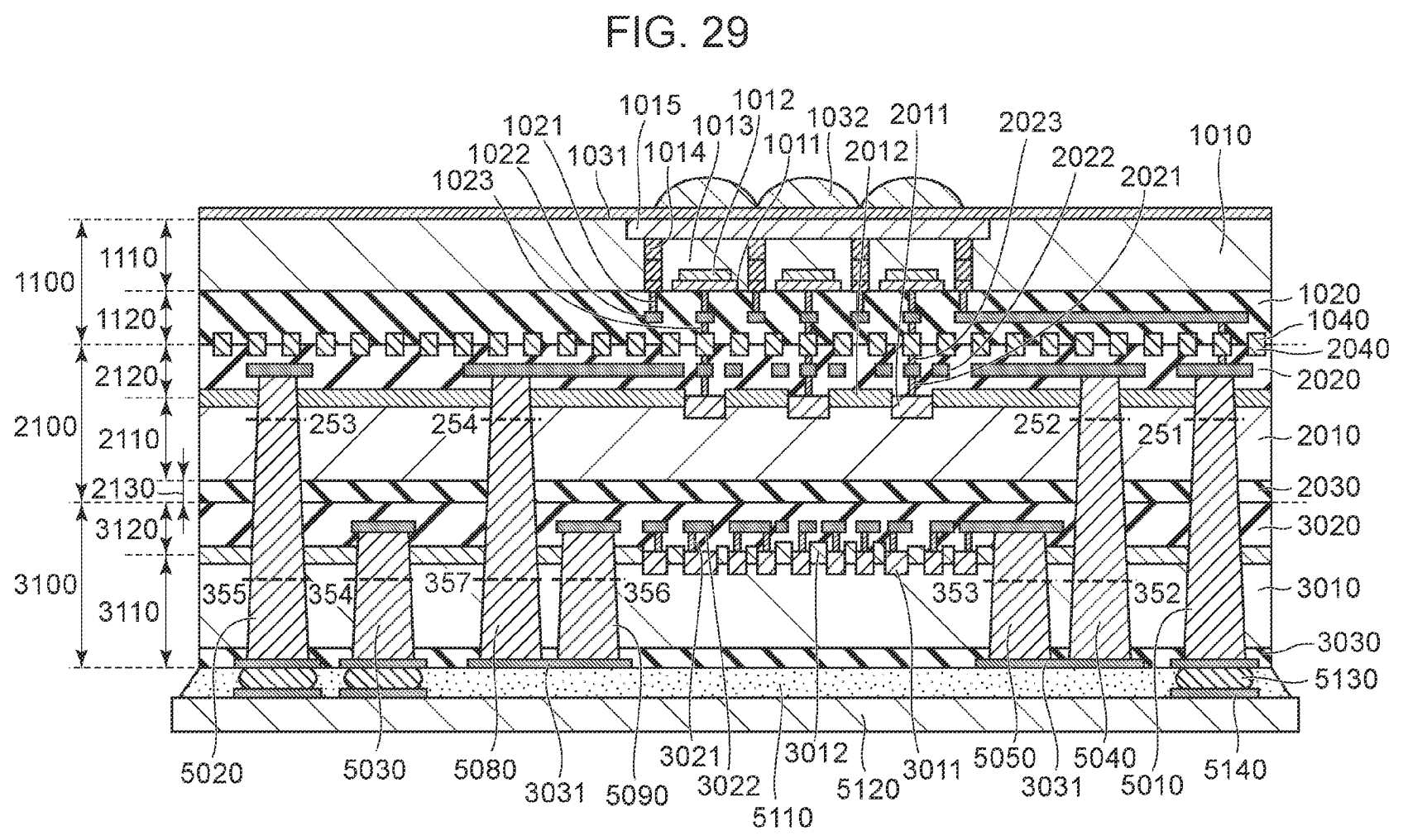

TSV wiring 254 (TSV wiring 5080 illustrated in FIG. 29) is wiring for sending the processing result of the signal processing unit provided in the third substrate 3100 to the control unit 243 provided in the second substrate 2100. Specifically, as illustrated in FIG. 29, the processing result of the signal processing unit of the third substrate 3100 is inputted into the control unit 243 via TSV wiring 5090, the wiring 3031, and the TSV wiring 5080 (the TSV wiring 254 illustrated in FIG. 27).

The control unit 243 is capable of performing various kinds of control.

For example, it is possible to perform exposure control to make exposure time different from one pixel block to another. Specifically, in the pixel area, a pixel block that detects a larger number of photons (a first pixel block) and a pixel block that detects a smaller number of photons (a second pixel block) could exist when compared per unit time. In this case, the control unit 243 is capable of performing control to make the exposure time of the second pixel block longer than the exposure time of the first pixel block. By this means, it is possible to widen a dynamic range. For example, based on the count value of each pixel block acquired in the preceding frame, which is the processing result of the signal processing unit of the third substrate 3100, the control unit 243 is capable of controlling the exposure time of said each pixel block. The exposure time may be controlled based on whether or not to apply a reverse bias to the photoelectric conversion unit, for the purpose of performing avalanche multiplication, or based on whether or not to count pulses corresponding to photons by a counter.

As another example, when the photoelectric conversion apparatus disclosed herein is applied to a system that ensures safety or security (e.g., a surveillance camera), there exist needs for performing image capturing at a low resolution before an event occurs and performing image capturing at a high resolution after the event occurs. This is because the power consumption of an avalanche diode is large due to applying of a high voltage and thus because performing image capturing at a low resolution before an event occurs makes it possible to reduce such power consumption of the avalanche diode. In view of this, the signal processing unit of the third substrate 3100 may determine whether an event occurs or not, and, based on the result of this determination, the control unit 243 may perform control of switching from a low resolution mode to a high resolution mode. Specifically, for example, it is possible to achieve a low resolution mode by applying a reverse bias to one pixel only among pixels of a two-times-two matrix, four pixels in total, to acquire a photon. Then, upon detecting event occurrence, the control unit 243 performs control for photon acquisition using all of the pixels of the two-times-two matrix. Whether an event occurs or not may be determined using the second signal processing unit 305 that has a trained model having been created through machine learning. The event is detection of a suspicious person or a suspicious object, detection of persons or objects the number of which is greater than a predetermined number, collision prediction of a mobile body, or the like. Though a reduction in power consumption is achieved by switching of the photoelectric conversion unit in the above description, a reduction in power consumption may be achieved by switching whether or not to perform counting by the counter.

As another example, information about a region of interest (ROI) only may be acquired. For example, when there is a detection target object whose partial region only is of interest, performing photoelectric conversion for the other regions thereof is a waste in power consumption. To avoid such wasteful consumption, the control unit 243 performs control to acquire information about the region of interest. Specifically, the signal processing unit of the third substrate 3100 determines the region of interest of the detection target object, and the control unit 243 performs control to perform photoelectric conversion for the region of interest and not to perform photoelectric conversion for the regions other than the region of interest. By this means, it is possible to reduce power consumption. Alternatively, the control unit 243 may perform control not to count photons by the counter for regions other than the region of interest and to count photons by the counter for the region of interest. Also in this case, it is possible to reduce power consumption by stopping unnecessary counting.

Figure 28:
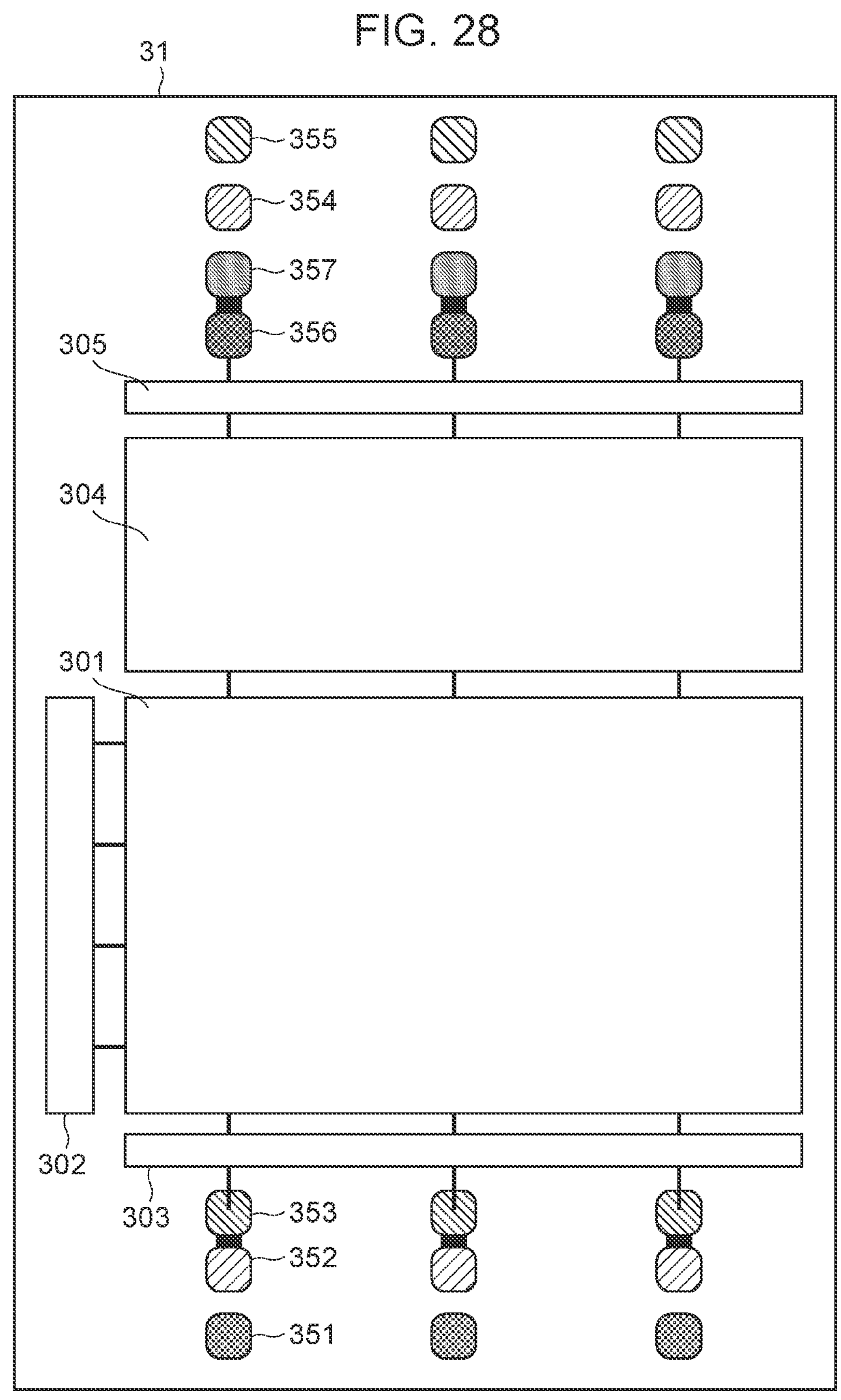
FIG. 28 is a schematic view of an electric connection relationship between the third substrate and another substrate, etc. according to the twelfth embodiment.

FIG. 28 schematically illustrates an electric connection relationship between the third substrate 3100 and the outside of the semiconductor device, the second substrate 2100, and the first substrate 1100 in a plan view. The difference from FIG. 9 described earlier in the first embodiment lies in that TSV wiring 356 (the TSV wiring 5090 illustrated in FIG. 26) and TSV wiring 357 (the TSV wiring 5080 illustrated in FIG. 26) are illustrated in this figure. These pieces of TSV wiring are used for sending the processing result of the signal processing unit provided in the third substrate 3100 to the control unit 243 provided in the second substrate 2100.

Thirteenth Embodiment

Figure 30:
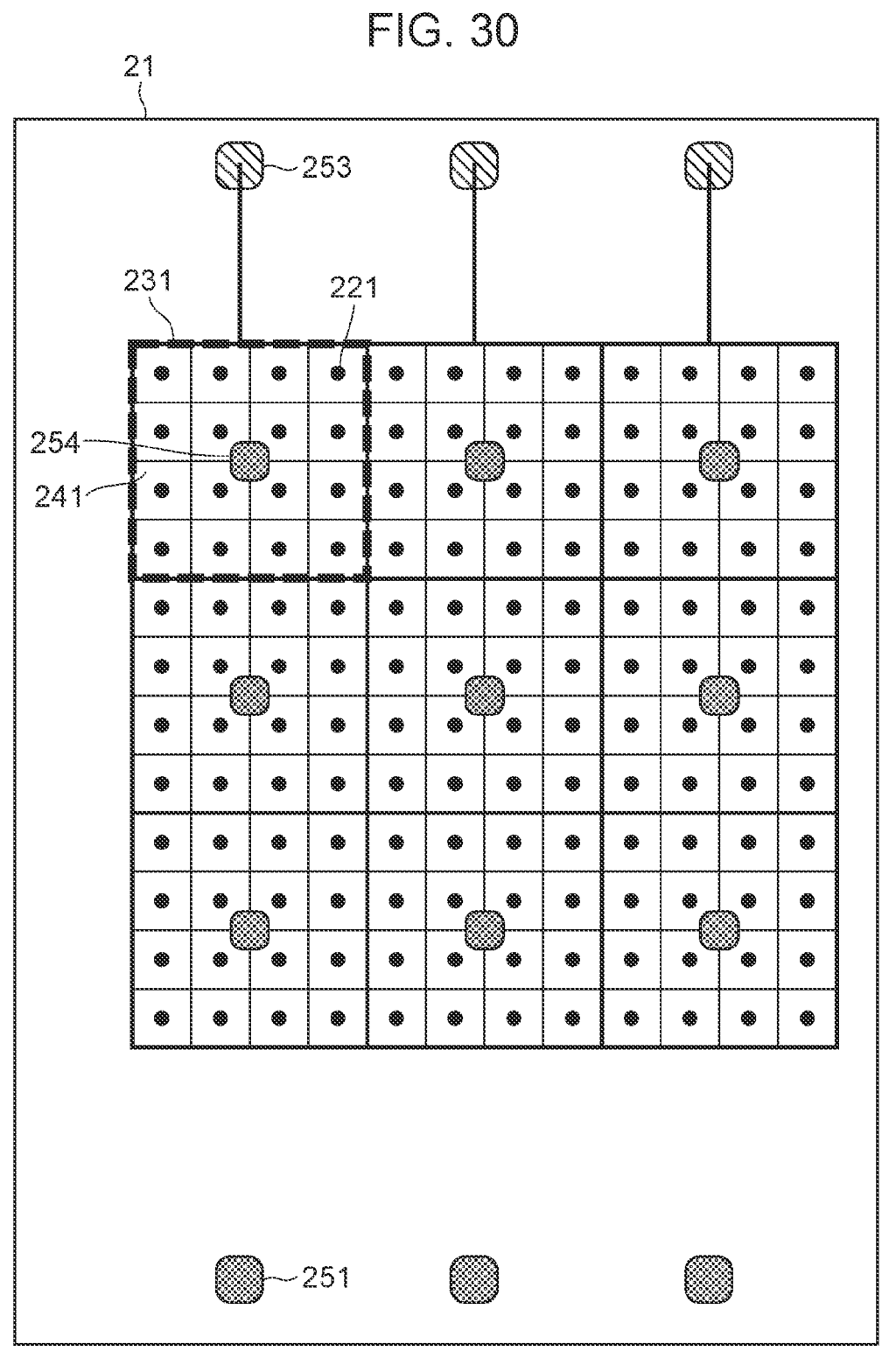
Figure 31:
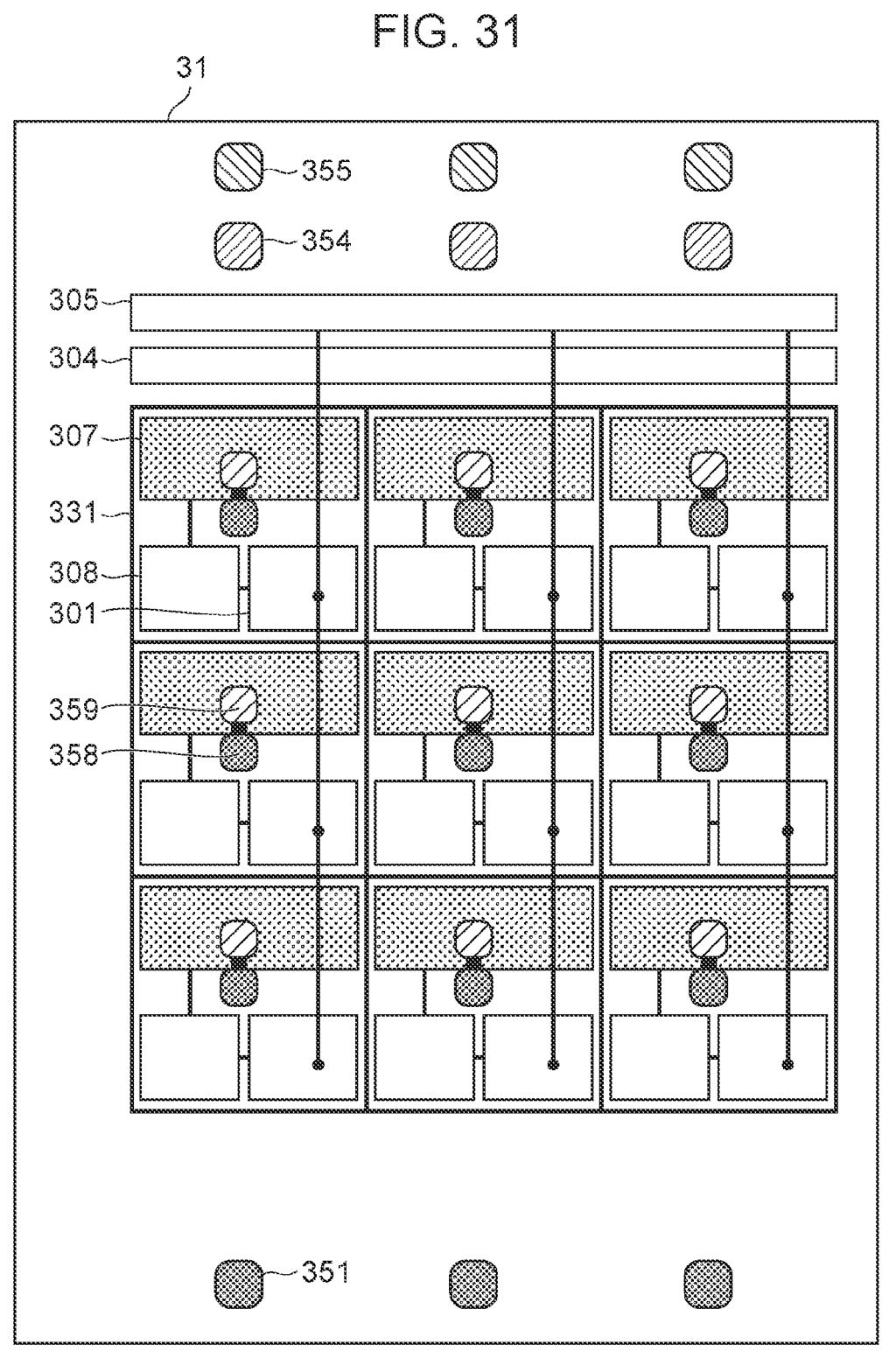
Figure 32:
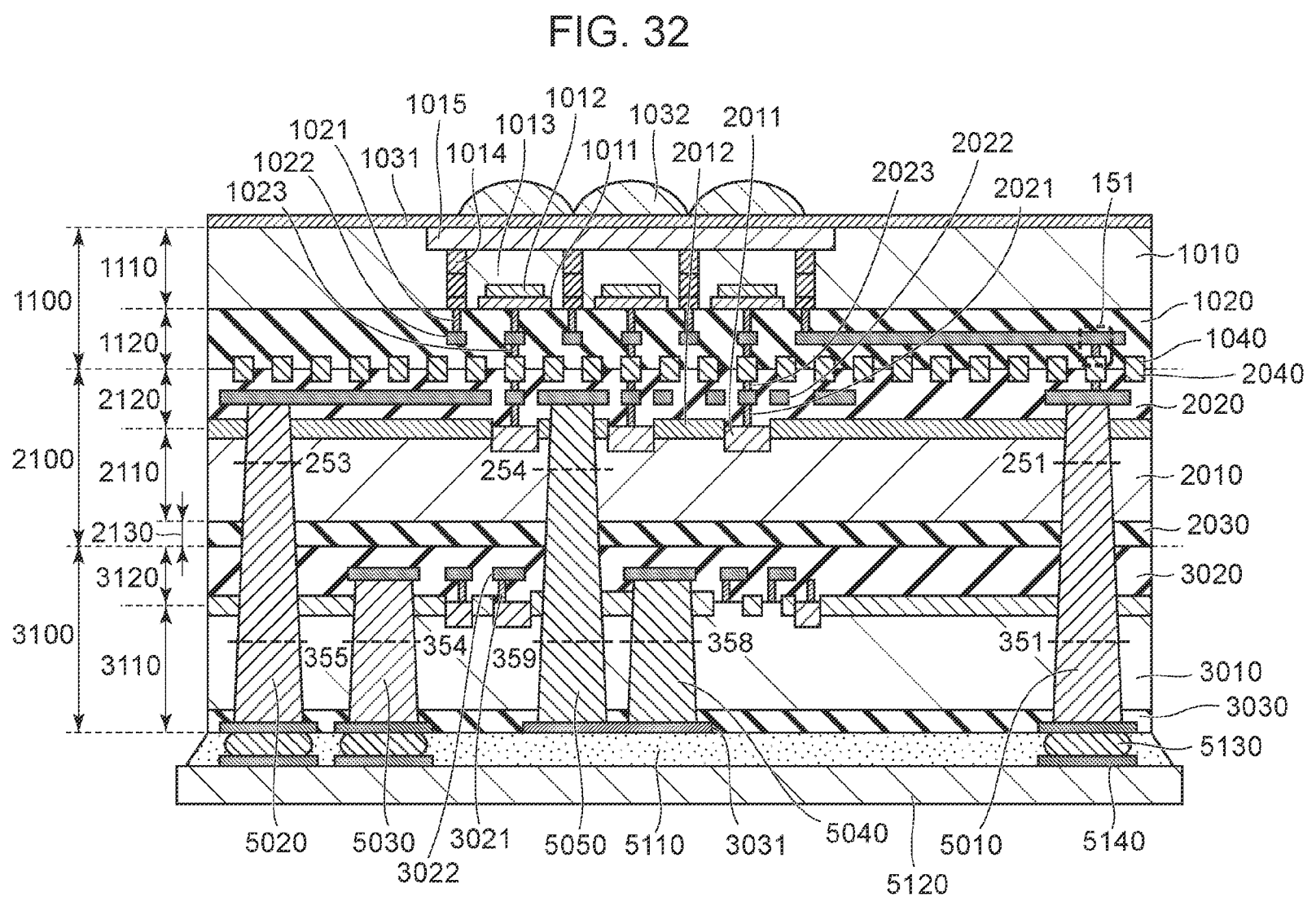

A thirteenth embodiment is illustrated in FIGS. 30 to 32. The thirteenth embodiment is different from the first embodiment in that circuits (for example, TDC circuits) are provided in the third substrate. In the thirteenth embodiment, the electric connection relationship of the first substrate 1100 is the same as that of FIG. 26; therefore, a reference is made thereto.

FIG. 30 schematically illustrates an electric connection relationship, etc. between the second substrate 2100 and the third substrate 3100 in a plan view. The control circuit units 302 and 303 are omitted. The TSV wiring 254 is provided at the center of each of the blocks 231. The TSV wiring 254 (the TSV wiring 5040 illustrated in FIG. 32) is wiring for inputting the output of the second substrate 2100 into the third substrate 3100.

FIG. 31 schematically illustrates an electric connection relationship between the second substrate 2100 and the third substrate 3100 in a plan view. In the third substrate 3100, a plurality of signal processing blocks 331 is provided correspondingly for the plurality of blocks 231 of the first substrate 1100 and the second substrate 2100.

Specifically, in the thirteenth embodiment, a circuit 307 corresponding to the circuit 241 of the first embodiment is provided for each signal processing block. The circuit 307 is, for example, a TDC circuit. For example, in a case where it is difficult to arrange the TDC circuits 307 in the second substrate 2100 due to an increase in circuit scale of other circuits arranged in the second substrate 2100, it is possible to provide the TDC circuits 307 in the third substrate 3100 as in the present embodiment.

Moreover, in a case where the photoelectric conversion apparatus 100 is used as an imaging photoelectric conversion apparatus, it is possible to provide the counter circuits 213 in both the second substrate 2100 and the third substrate 3100. This is because, in an APD, a counter is provided for each of pixels and, therefore, the scale of circuits constituting the counters is large, the area occupied in the second substrate 2100 is also large. Moreover, in the thirteenth embodiment, a DFE 308 corresponding to the DFE 242 of the first embodiment is provided in each of the signal processing blocks 331.

Furthermore, in the thirteenth embodiment, the memory 301 is provided in each of the signal processing blocks 331.

In FIG. 31, the output from the memory 301 provided in each of the signal processing blocks is inputted into the first signal processing unit 304, and the output from the first signal processing unit 304 is inputted into the second signal processing unit 305.

As described above, in the thirteenth embodiment, each signal processing block is provided for the corresponding one of pixel blocks, and signal processing can be performed at the circuits 307 (for example, TDC circuits) concurrently; therefore, it is possible to perform high-speed signal processing.

The first signal processing unit 304 and the second signal processing unit 305 may be provided inside each signal processing block. The first signal processing unit 304 may be provided inside each signal processing block, and the second signal processing unit 305 may be, as illustrated in FIG. 31, provided outside an area where the signal processing blocks are arranged.

Fourteenth Embodiment

A fourteenth embodiment is illustrated in FIGS. 33 to 38. The same numerals will be assigned to members that are the same as those in the first embodiment, and an explanation thereof will be omitted. The fourteenth embodiment is different from the first embodiment in that a fourth substrate 4100 is stacked in addition to the first substrate 1100, the second substrate 2100, and the third substrate 3100.

Figure 33:
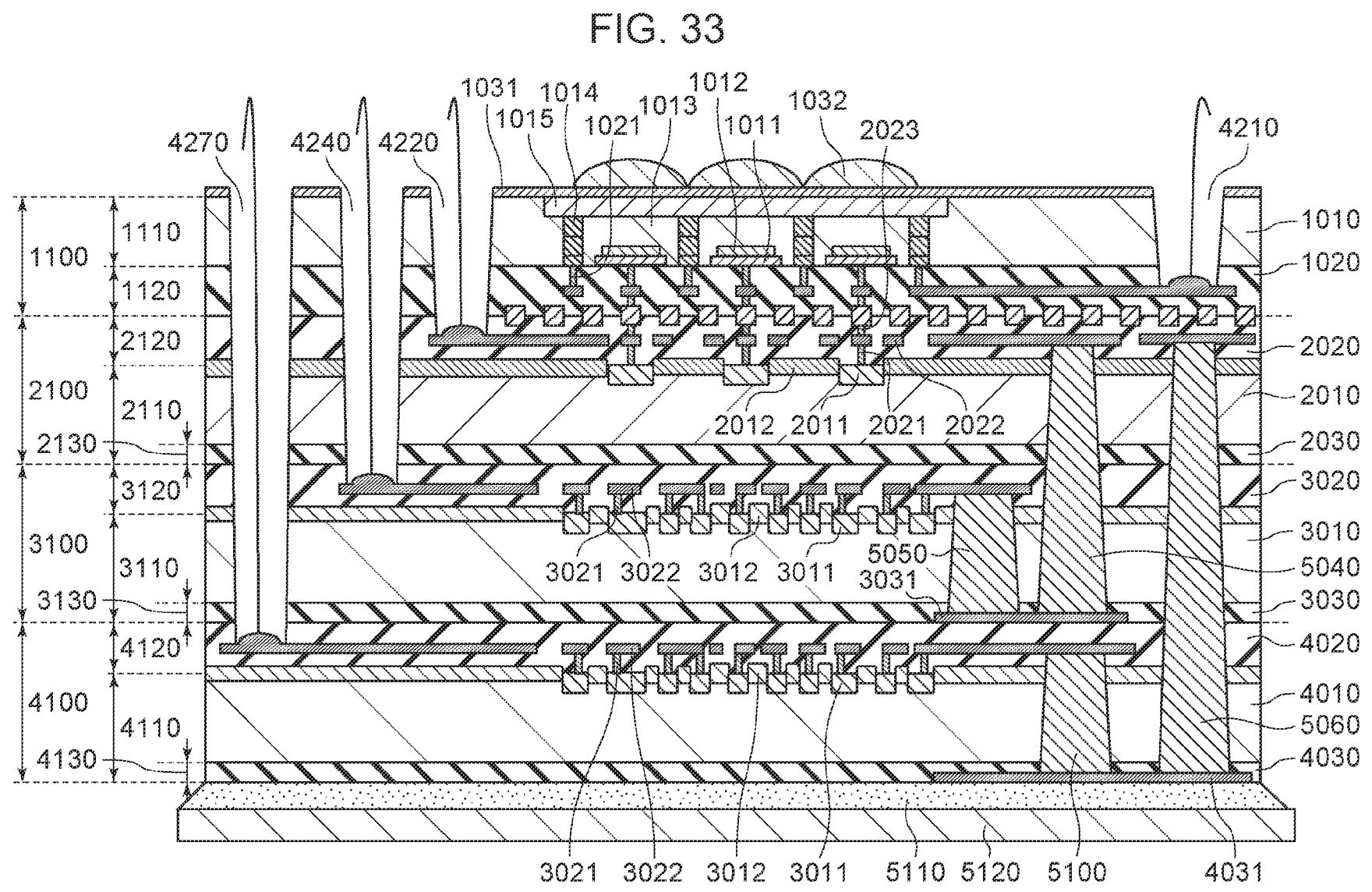

In the structure illustrated in FIG. 33, an electrode which is electrically connected to the outside and via which a drive voltage is supplied to circuits of the fourth substrate 4100 is provided in a wiring structure 4120 of the fourth substrate. Each electrode via which a drive voltage is supplied to circuits of the corresponding one of the first to third substrates is provided in the wiring structure of the corresponding one of the first to third substrates. Specifically, the electrode 4210 for the first substrate is provided in the wiring structure of the first substrate, the electrode 4220 for the second substrate is provided in the wiring structure of the second substrate, the electrode 4240 for the third substrate is provided in the wiring structure of the third substrate, and an electrode 4270 for the fourth substrate is provided in the wiring structure of the fourth substrate.

Moreover, each of electric connection between the second substrate 2100 and the third substrate 3100 and electric connection between the third substrate 3100 and the fourth substrate 4100 is provided by TSV wiring. Specifically, the second substrate is connected to the wiring 3031 of the wiring layer of the third substrate via a TSV wiring 5040, and the wiring 3031 is connected to the third substrate via a TSV wiring 5050. The first substrate is connected to wiring 4031 of the wiring layer of the fourth substrate via a TSV wiring 5060, and the wiring 4031 is connected to the fourth substrate via a TSV wiring 5100.

With this structure, it is possible to make the wiring from the electrode via which the drive voltage is supplied from the outside to the circuits provided in each substrate shorter, and it is possible to reduce the possibility of a delay in circuit operation due to a signal propagation delay. Moreover, it is possible to supply from each electrode a drive voltage suited for elements arranged in the corresponding substrate.

Figure 34:
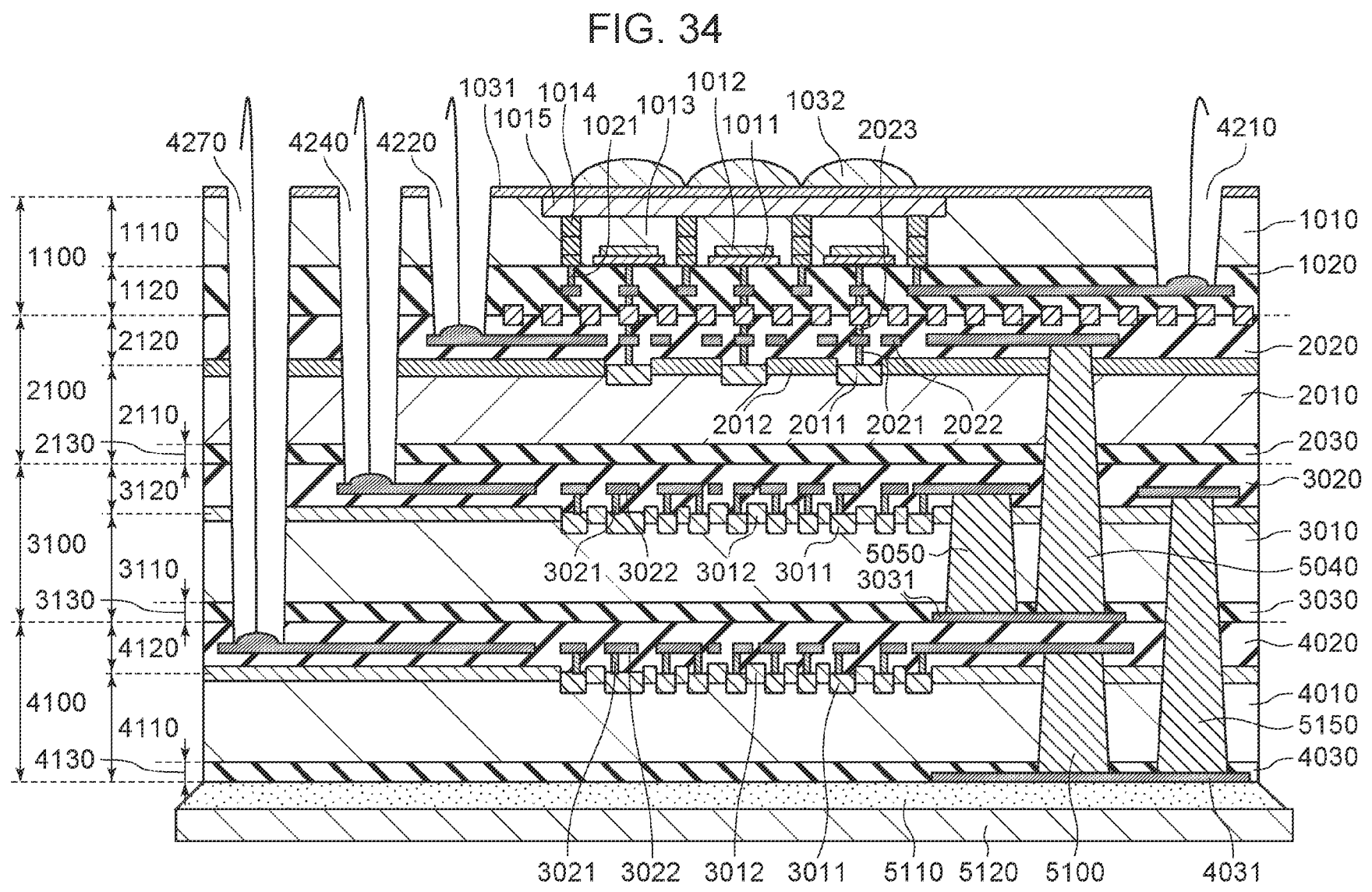

In the structure illustrated in FIG. 34, although electrodes via which a drive voltage is supplied to circuits of the respective substrates are provided in the wiring structure of the respective substrates similarly to FIG. 33, there is a difference from FIG. 33 in that each of connection between the second substrate 2100 and the third substrate 3100 and connection between the third substrate 3100 and the fourth substrate 4100 is provided by TSV wiring. Specifically, the third substrate is connected to the wiring 4031 of the wiring layer of the fourth substrate via a TSV wiring 5150, and the wiring 4031 is connected to the fourth substrate via a TSV wiring 5100.

Figure 35:
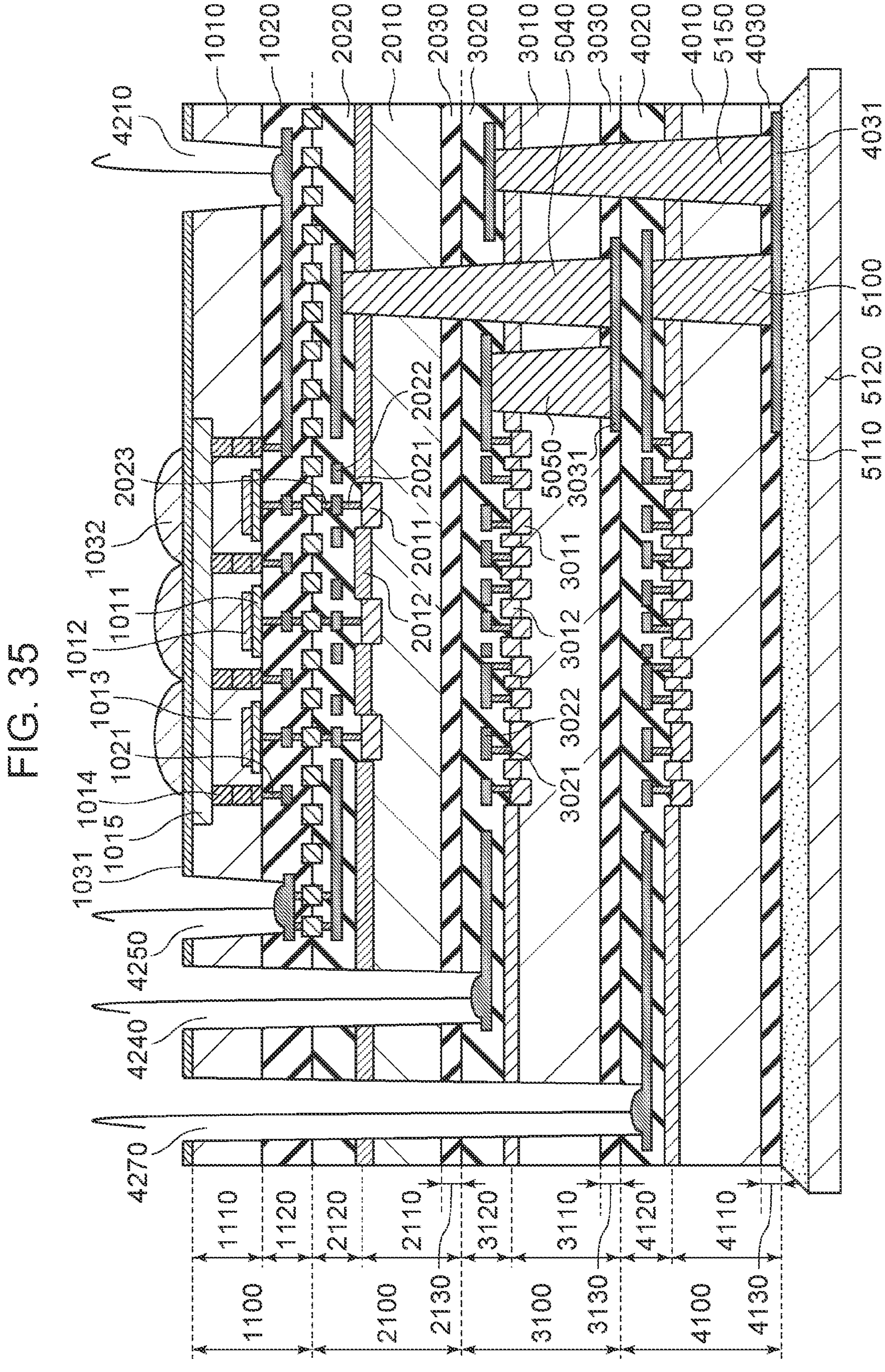
FIG. 35 is a cross-sectional view of a photoelectric conversion apparatus according to the fourteenth embodiment.

In the structure illustrated in FIG. 35, in each of the first substrate 1100, the third substrate 3100, and the fourth substrate 4100, an electrode via which a drive voltage is supplied to circuits of said substrate is provided. This structure is the same as the structure illustrated in FIG. 34 in that each of the connection between the second substrate 2100 and the third substrate 3100 and the connection between the third substrate 3100 and the fourth substrate 4100 is provided by TSV wiring. The electrode 4250 is provided in the first substrate 1100. The electric connection between the first substrate 1100 and the second substrate 2100 is provided by the joining of the junction portion 1040 of the first substrate and the junction portion 2040 of the second substrate to each other.

Figure 36:
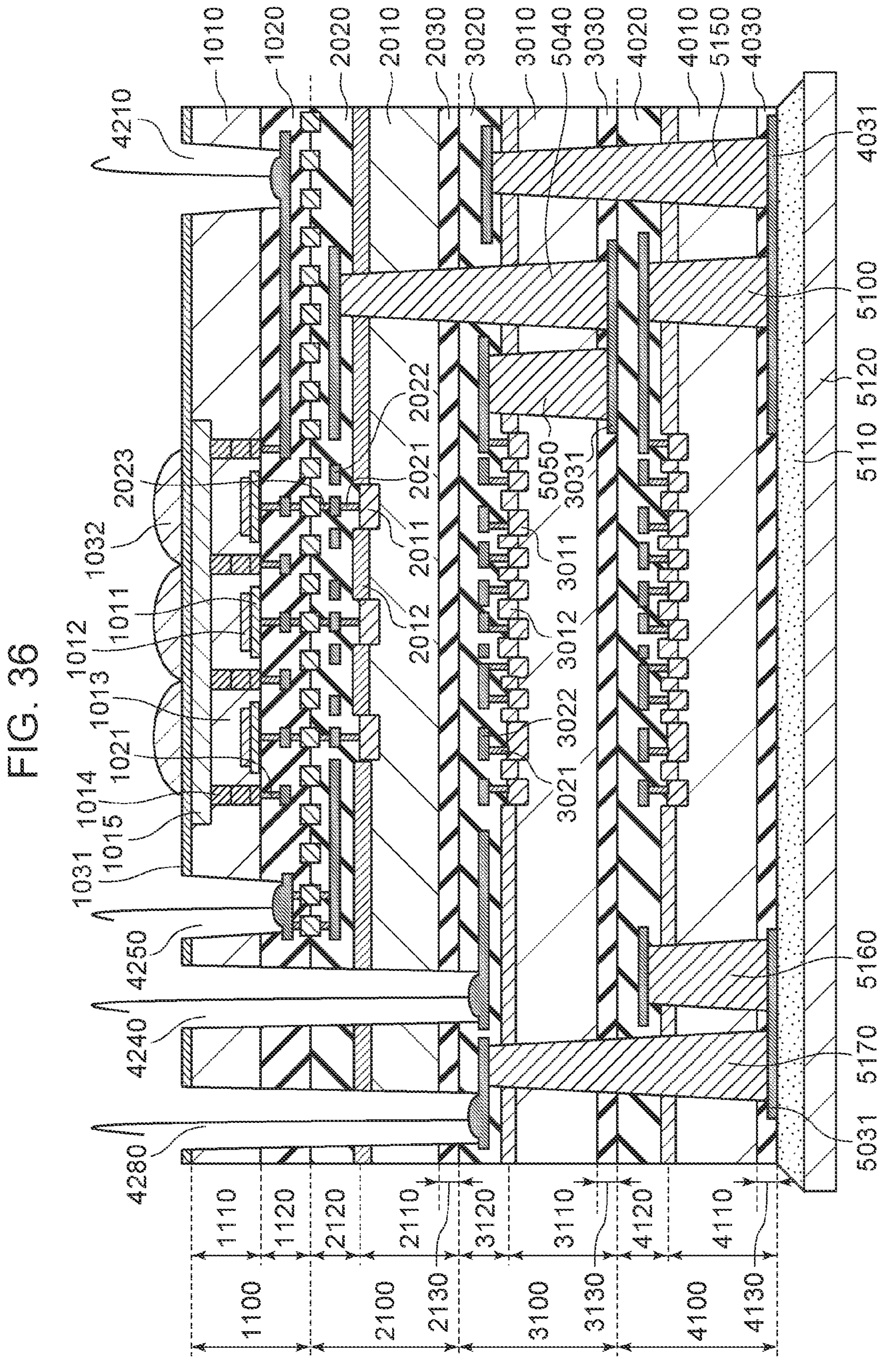
FIG. 36 is a cross-sectional view of a photoelectric conversion apparatus according to the fourteenth embodiment.

In the structure illustrated in FIG. 36, in each of the first substrate 1100 and the third substrate 3100, an electrode via which a drive voltage is supplied to circuits of said substrate is provided. The first substrate 1100 and the second substrate 2100 are electrically connected to each other by the joining of the junction portion 1040 of the first substrate and the junction portion 2040 of the second substrate to each other. The third substrate 3100 and the fourth substrate 4100 are electrically connected to each other via TSV wiring. The electrode 4210 and the electrode 4250 are provided in such a way as to be in contact with the same wiring layer of the wiring structure 1120 of the first substrate. In addition, the electrode 4240 and an electrode 4280 are provided in such a way as to be in contact with the same wiring layer of the wiring structure 3120 of the third substrate. Therefore, the depth of a pad opening formed when forming the electrode 4210 is substantially the same as that for the electrode 4250, or the depth of a pad opening formed when forming the electrode 4240 is substantially the same as that for the electrode 4270. Therefore, this structure makes it easier to execute the process of the wiring step.

Figure 37:
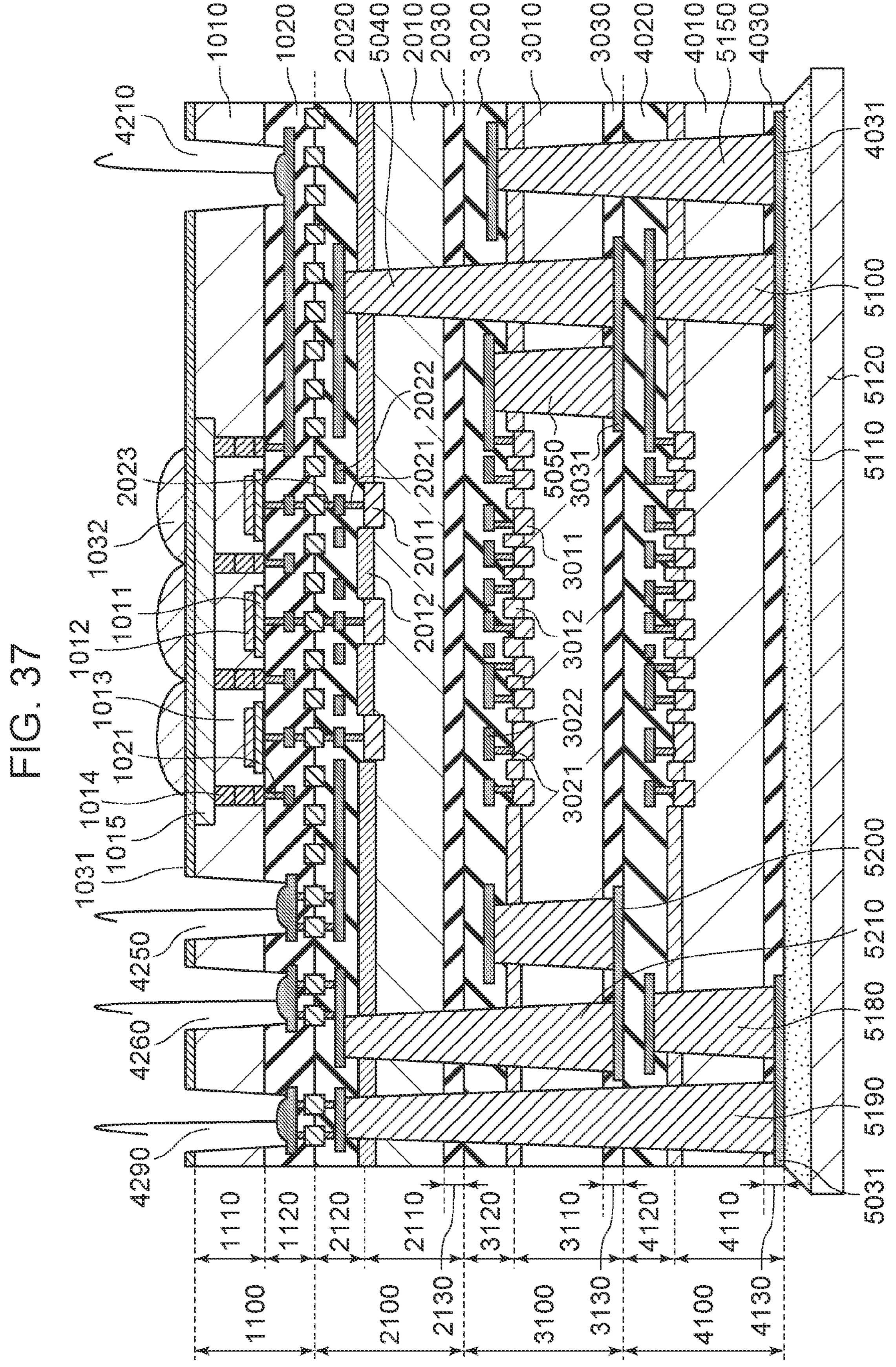
FIG. 37 is a cross-sectional view of a photoelectric conversion apparatus according to the fourteenth embodiment.

In the structure illustrated in FIG. 37, an electrode via which a drive voltage is supplied to circuits of the first substrate 1100 is provided in the first substrate 1100. The first substrate 1100 and the second substrate 2100 are electrically connected to each other by the joining of the junction portion 1040 of the first substrate and the junction portion 2040 of the second substrate to each other. The second substrate 2100 and the third substrate 3100 are electrically connected to each other via TSV wiring, and the second substrate 2100 and the fourth substrate 4100 are electrically connected to each other via TSV wiring.

That is, the electrode 4210, the electrode 4250, the electrode 4260, and an electrode 4290 are provided in such a way as to be in contact with the same wiring layer of the wiring structure 1120 of the first substrate. Therefore, pad openings formed when forming the respective electrodes have substantially the same depth. Moreover, this structure makes it unnecessary to provide a deep pad opening going from the first substrate 1100 to the wiring of the fourth substrate 4100 and thus makes it easier to execute the process of the wiring step.

Figure 38:
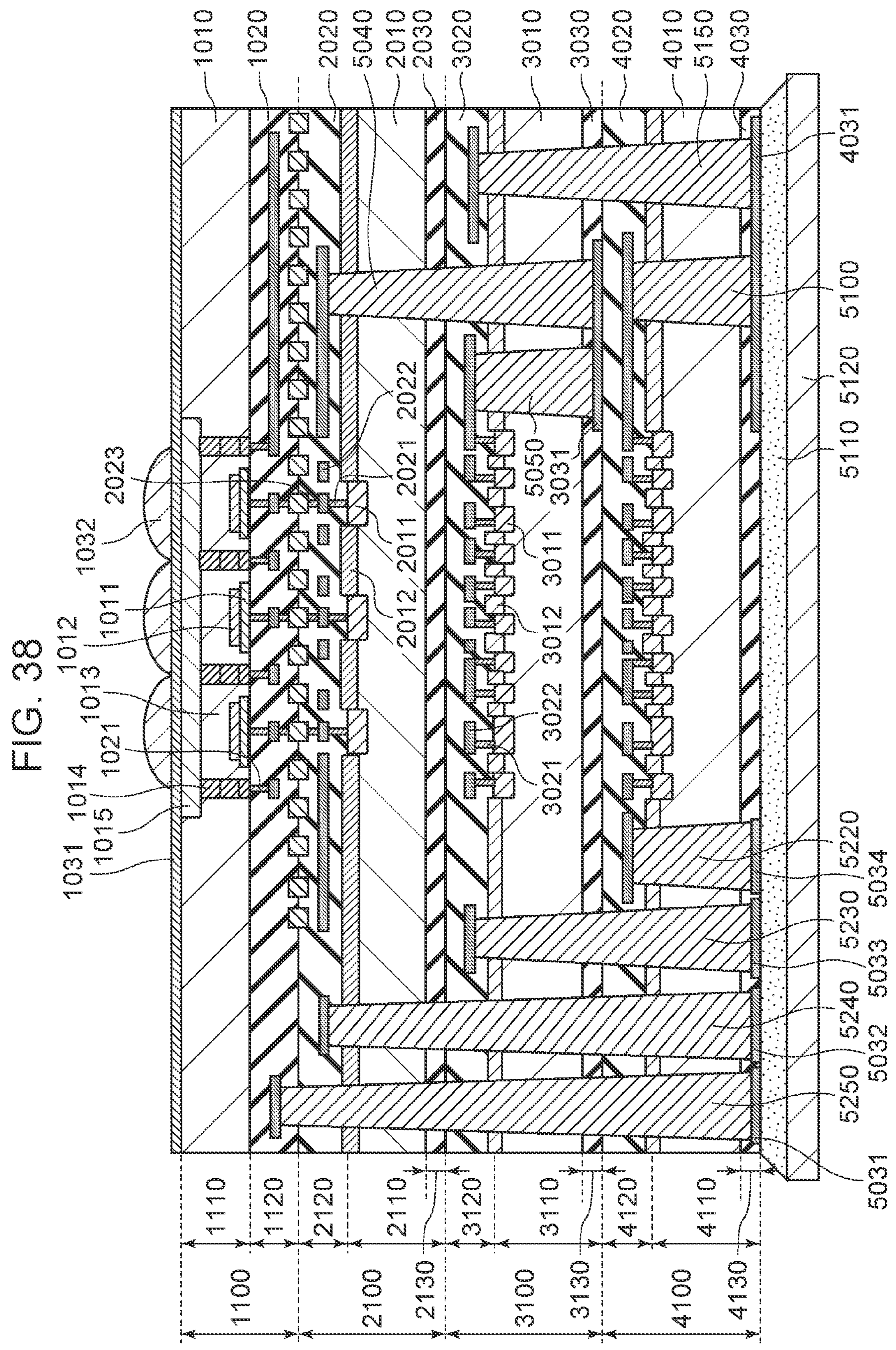
FIG. 38 is a cross-sectional view of a photoelectric conversion apparatus according to the fourteenth embodiment.

In the structure illustrated in FIG. 38, TSV wiring is connected to each of the first to fourth substrates. Wiring of the first substrate 1100 is connected to wiring 5031 of the wiring layer of the fourth substrate via a TSV wiring 5250, and wiring of the second substrate 2100 is connected to wiring 5032 via a TSV wiring 5240. Wiring of the third substrate 3100 is connected to wiring 5033 via a TSV wiring 5230, and the fourth substrate 4100 is connected to wiring 5034 via a TSV wiring 5220. Since this structure makes it possible to provide all of connection terminals for connection to the outside on the surface side of the photoelectric conversion apparatus, an area allocated for arranging the terminals near the pixel area becomes smaller; therefore, space-saving area design of the photoelectric conversion apparatus can be expected.

Fifteenth Embodiment

Figure 39:
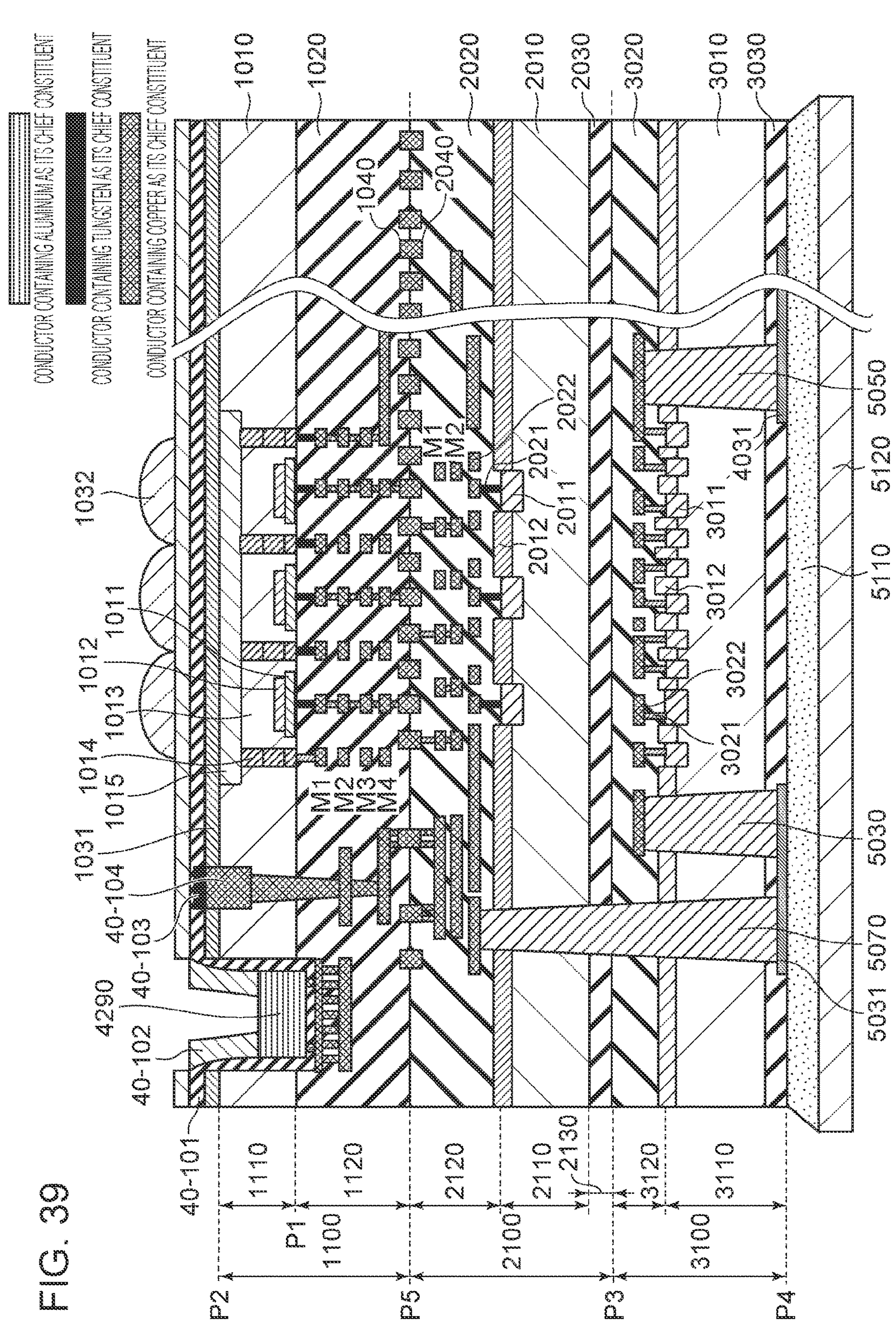
FIG. 39 is a cross-sectional view of a photoelectric conversion apparatus according to a fifteenth embodiment.

FIG. 39 is a cross-sectional view of a photoelectric conversion apparatus according to a fifteenth embodiment. The same numerals will be assigned to members that are the same as those in the first embodiment, and an explanation thereof will be omitted. A main point of modification in the fifteenth embodiment from the structure of the first embodiment lies in the structure of a pad electrode 4290.

The wiring structure 1120 includes a first wiring layer M1, a second wiring layer M2, a third wiring layer M3, a fourth wiring layer M4, and the junction portion 1040 of the first substrate. The wiring structure 2120 includes the first wiring layer M1, the second wiring layer M2, and the junction portion 2040 of the second substrate. Each of the wiring layers is so-called copper wiring. Each of the wiring layers may have, for example, a mesh structure in a plan view. That is, wires arranged in a certain direction in a plan view and wires intersecting with them constitute a net-like wiring layer.

In the wiring structure 1120 and the wiring structure 2120, the first wiring layer includes a conductor pattern that contains copper as its chief constituent. The conductor pattern of the first wiring layer has a single damascene structure. A contact is provided for electric connection between the first wiring layer and the semiconductor layer 1110. The contact is a conductor pattern that contains tungsten as its chief constituent. The second, third wiring layer includes a conductor pattern that contains copper as its chief constituent. The conductor pattern of the second, third wiring layer has a dual damascene structure and includes a portion that functions as wiring and a portion that functions as via. The structure of the fourth wiring layer is the same as that of the second, third wiring layer.

The pad electrode 4290 is a conductor pattern that contains aluminum as its chief constituent. The pad electrode 4290 is provided not in the wiring structure but in an opening of the semiconductor layer 1110. In the illustrated structure, the pad electrode 4290 has an exposed surface between a second plane P2 and a first plane P1. However, the exposed surface of the pad electrode may be located on the second plane P2.

How to form the structure of the present embodiment will now be described briefly. A pad opening is formed through the semiconductor layer 1110 in such a way as to expose a part of the wiring layer M1 of the wiring structure 1120. Then, an insulator 40-101 is formed in such a way as to cover the second plane P2 of the semiconductor layer 1110 and the pad opening. An opening to serve as via of the pad electrode 4290 is formed in the insulator 40-101. After a conductive film to serve as the pad electrode 4290 is formed, an unnecessary portion of the conductive film is removed such that a desired pattern is obtained. Then, after an insulator 40-102 is formed, an opening for exposing the pad electrode 4290 is formed. The structure of the present embodiment can be formed in this way.

A through-hole electrode 40-104 may be provided from the second-plane P2 side. The through-hole electrode 40-104 may be made of a conductor whose chief constituent is copper and may have a barrier metal between the semiconductor layer 1110 and the conductor.

A conductor 40-103 is provided on the through-hole electrode 40-104. The conductor 40-103 may be provided as a common conductor shared with another through-hole electrode and may have a function of reducing conductor diffusion of the through-hole electrode 40-104.

The material and structure of each wiring layer of the wiring structure 1120, 2120 is not limited to the disclosed example; for example, it may further include a conductor layer between the wiring layer and the semiconductor layer. The contact may have a two-tiered stack contact structure.

Sixteenth Embodiment

Figure 40:
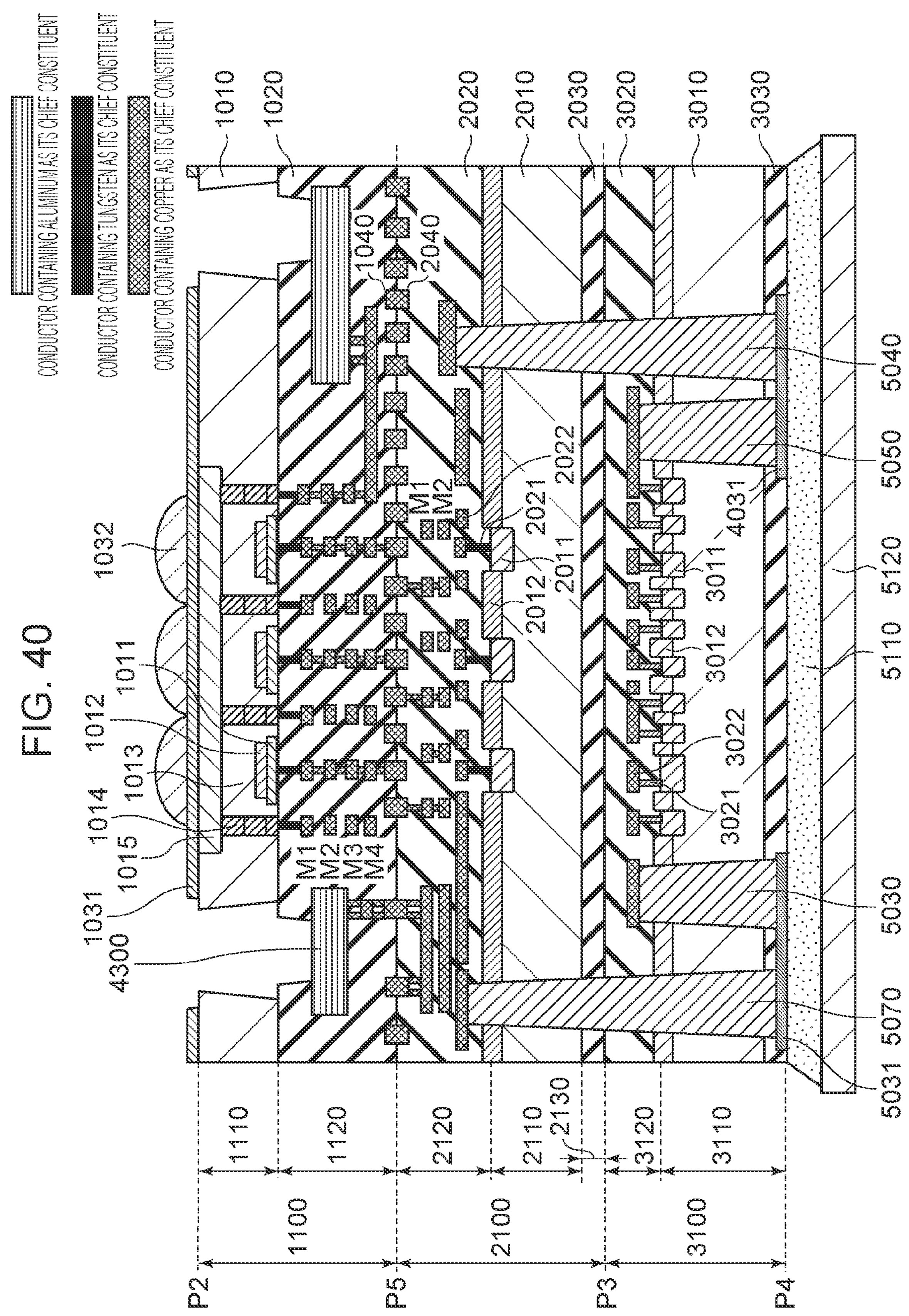
FIG. 40 is a cross-sectional view of a photoelectric conversion apparatus according to a sixteenth embodiment.

FIG. 40 is a cross-sectional view of a photoelectric conversion apparatus according to a sixteenth embodiment. The same numerals will be assigned to members that are the same as those in the first embodiment, and an explanation thereof will be omitted. A main point of modification in the sixteenth embodiment from the structure of the first embodiment lies in the structure of a pad electrode 4300.

The wiring structure 1120 includes a first wiring layer M1, a second wiring layer M2, a third wiring layer M3, a fourth wiring layer M4, and the junction portion 1040 of the first substrate. The wiring structure 2120 includes the first wiring layer M1, the second wiring layer M2, and the junction portion 2040 of the second substrate. Each of the wiring layers is so-called copper wiring.

In the wiring structure 1120 and the wiring structure 2120, the first wiring layer includes a conductor pattern that contains copper as its chief constituent. The conductor pattern of the first wiring layer has a single damascene structure. A contact is provided for electric connection between the first wiring layer and the semiconductor layer 1120. The contact is a conductor pattern that contains tungsten as its chief constituent. The second, third wiring layer includes a conductor pattern that contains copper as its chief constituent. The conductor pattern of the second, third wiring layer has a dual damascene structure and includes a portion that functions as wiring and a portion that functions as via. The structure of the fourth wiring layer is the same as that of the second, third wiring layer.

The pad electrode 4300 is a conductor pattern that contains aluminum as its chief constituent. The pad electrode 4300 is provided across the second wiring layer to the third wiring layer of the wiring structure 1120. For example, a portion that functions as via for connection between the first wiring layer and the second wiring layer and a portion that functions as wiring of the third wiring layer are included therein. The pad electrode 4300 is located between, for example, the second plane P2 and a fifth plane P5. The pad electrode 4300 can be provided between the second plane P2 and a fourth plane P4, or between the second plane P2 and the fifth plane P5. The pad electrode 4300 has a first surface and a second surface that is the opposite of the first surface. A part of the first surface is exposed through an opening of the semiconductor layer. The exposed portion of the pad electrode 4300 can function as a portion for connection to an external terminal, a so-called pad portion. The pad electrode 4300 is, at its second surface, connected to a plurality of conductors whose chief constituent is copper.

As another embodiment modified from the present embodiment, the pad electrode 4300 may have an electric connection portion at a non-exposed portion on its first-surface side. For example, the pad electrode 4300 may have via made of a conductor containing aluminum as its chief constituent and may be electrically connected through this via to a conductor located on the first-surface side and containing copper as its chief constituent. The pad electrode 4300 may be connected at its first surface to the first wiring layer of the wiring structure 1120 by means of a conductor containing tungsten as its chief constituent.

The pad electrode 4300 can be formed by, for example, after an insulator covering the third wiring layer is formed, removing a part of this insulator, forming a film containing aluminum as its chief constituent to serve as the pad electrode 4300, and then performing patterning. After copper wiring is formed, the pad electrode 4300 is formed; by this means, it is possible to form the pad electrode 4300 that has a large film thickness while keeping fine copper-wiring flatness.

Though a case where the pad electrode 4300 is included in the wiring structure 1120 has been disclosed in the present embodiment, it may be included in the wiring structure 2120. The position where the pad electrode is provided may be either in the wiring structure 1120 or in the wiring structure 2120 and is not limited. The material and structure of each wiring layer of the wiring structure 1120, 2120 is not limited to the disclosed example; for example, it may further include a conductor layer between the first wiring layer and the semiconductor layer. The contact may have a two-tiered stack contact structure.

The pad electrode having been described in the foregoing embodiments and the present embodiment is connected to the outside of the semiconductor device and is used for outputting signals generated inside the semiconductor device to the outside for receiving inputs of voltages supplied from the outside for driving circuits of the semiconductor device. Since external noise such as static electricity and a surge voltage also enter through the pad electrode, a protection circuit for protecting internal circuits may be provided in the neighborhood of the pad electrode. The protection circuit is, for example, a diode, a gate-grounded MOS, an RC trigger MOS, or a combination of these elements. The protection circuit may be provided at a region overlapping with the pad electrode in a plan view or may be provided in each substrate in accordance with voltages for driving elements provided in each of the stacked substrates or in accordance with a pad layout.

Seventeenth Embodiment

Figure 41:
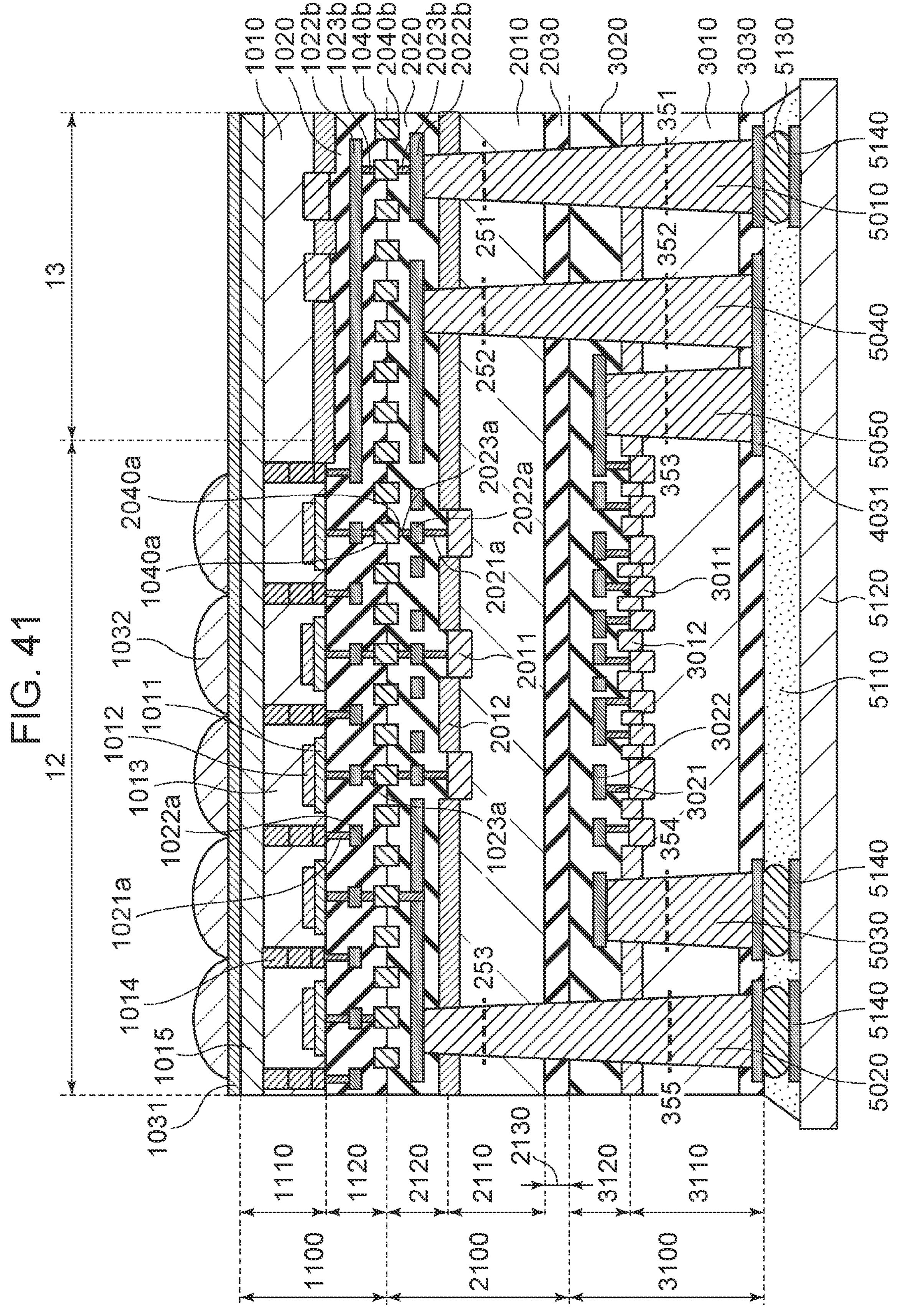
FIG. 41 is a cross-sectional view of a photoelectric conversion apparatus according to a seventeenth embodiment.

FIG. 41 is a cross-sectional view of a photoelectric conversion apparatus according to a seventeenth embodiment. The same numerals will be assigned to members that are the same as those in the first embodiment, and an explanation thereof will be omitted. A main point of modification in the seventeenth embodiment from the structure of the first embodiment lies in positions where pixels are arranged.

In the embodiments having been described above, TSV wiring is provided in a range in which it overlaps with the peripheral area 13 located outside the pixel area 12 in a plan view. However, for example, TSV wiring may be provided in a range in which it overlaps with the pixel area 12 in a plan view. In a photoelectric conversion apparatus according to the present embodiment, since at least three semiconductor substrates are stacked in layers, even at an area overlapping with TSV wiring in a plan view, the influence of voltages inputted/outputted via the TSV wiring on pixels is suppressed, resulting in efficient area use.

Pixels provided at an area overlapping with TSV wiring in a plan view are not limited to effective pixels configured to output signals based on photoelectric conversion. For example, the pixels may be OB pixels (Optical Black pixels) whose incident-surface side is covered by a light-shielding film so as not to allow light to enter, dummy pixels that are not connected to output lines and thus do not output signals, or the like. Dummy pixels are, for example, pixels provided between effective pixels and OB pixels so as to prevent oblique light from entering OB pixels. Even if this kind of pixels is affected by voltages inputted/outputted via TSV wiring, it has only a marginal influence on image quality; therefore, for efficient area use, dummy pixels can be arranged at an area overlapping with TSV wiring in a plan view.

Those provided at an area overlapping with TSV wiring in a plan view are not limited to photoelectric conversion elements such as pixels described above. For example, semiconductor elements such as transistors may be provided. Forming elements such as transistors in the semiconductor area 1110 makes it possible to enhance substrate flatness. The elements provided at an area overlapping with TSV wiring in a plan view may be, for example, protection elements having a function of the aforementioned protection circuit.

Eighteenth Embodiment

Figure 42:
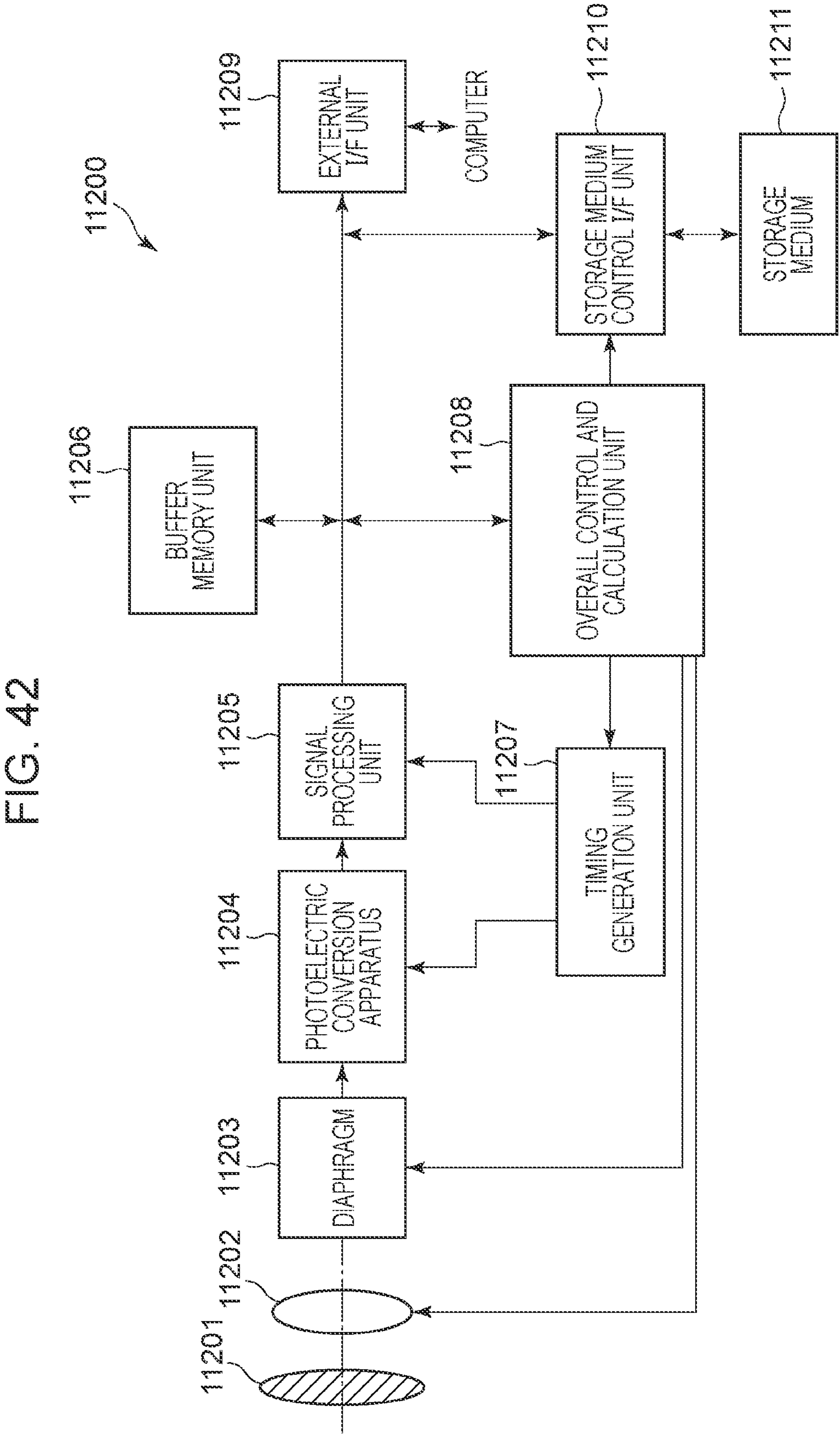
FIG. 42 is a function block diagram of a photoelectric conversion system according to an eighteenth embodiment.

FIG. 42 is a block diagram illustrating a configuration of a photoelectric conversion system 11200 according to the present embodiment. The photoelectric conversion system 11200 according to the present embodiment includes a photoelectric conversion apparatus 11204. The photoelectric conversion apparatus according to any of the foregoing embodiments can be applied to the photoelectric conversion apparatus 11204. The photoelectric conversion system 11200 can be used as, for example, an image capturing system. Specific examples of the image capturing system include a digital still camera, a digital camcorder, and a surveillance camera. In the example illustrated in FIG. 42, the photoelectric conversion system 11200 is a digital still camera.

The photoelectric conversion system 11200 illustrated in FIG. 42 includes the photoelectric conversion apparatus 11204 and a lens 11202 for forming an optical image of an object on the photoelectric conversion apparatus 11204. The photoelectric conversion system 11200 includes a diaphragm 11203 for making an amount of light that passes through the lens 11202 variable and a barrier 11201 for protecting the lens 11202. The lens 11202 and the diaphragm 11203 constitute an optical system for concentrating light onto the photoelectric conversion apparatus 11204.

The photoelectric conversion system 11200 includes a signal processing unit 11205 that processes an output signal outputted from the photoelectric conversion apparatus 11204. The signal processing unit 11205 performs operation for processing an input signal through various kinds of correction and compression, as needed, and outputting the processed signal. The photoelectric conversion system 11200 further includes a buffer memory unit 11206 for temporarily storing image data and an external interface unit (external I/F unit) 11209 for communicating with an external computer or the like. The photoelectric conversion system 11200 further includes a storage medium 11211 such as a semiconductor memory into or out of which captured image data is written or read and a storage medium control interface unit (storage medium control I/F unit) 11210 for writing into or reading out of the storage medium 11211. The storage medium 11211 may be built in the photoelectric conversion system 11200 or may be configured to be attachable and detachable. Communication from the storage medium control I/F unit 11210 to the storage medium 11211 and communication from the external I/F unit 11209 may be performed wirelessly.

The photoelectric conversion system 11200 further includes an overall control and calculation unit 11208 that performs various calculations and controls the entire digital still camera, and a timing generation unit 11207 that outputs various timing signals to the photoelectric conversion apparatus 11204 and to the signal processing unit 11205. The timing signals and so on may be externally inputted. It is sufficient as long as the photoelectric conversion system includes at least the photoelectric conversion apparatus 11204 and the signal processing unit 11205 that processes an output signal outputted from the photoelectric conversion apparatus 11204. The overall control and calculation unit 11208 and the timing generation unit 11207 may be configured to execute some or all of control functions of the photoelectric conversion apparatus 11204.

The photoelectric conversion apparatus 11204 outputs an image signal to the signal processing unit 11205. The signal processing unit 11205 performs predetermined signal processing on the image signal outputted from the photoelectric conversion apparatus 11204 and outputs image data. In addition, the signal processing unit 11205 generates an image using the image signal. The signal processing unit 11205 may perform range calculation for the signal outputted from the photoelectric conversion apparatus 11204. The signal processing unit 11205 and the timing generation unit 11207 may be mounted in the photoelectric conversion apparatus 11204. That is, the signal processing unit 11205 and the timing generation unit 11207 may be provided on the substrate on which pixels are arranged or may be provided on another substrate. Using a photoelectric conversion apparatus according to each of the foregoing embodiments to configure an image capturing system makes it possible to realize an image capturing system capable of obtaining an image with enhanced quality.

Nineteenth Embodiment

Figure 43:
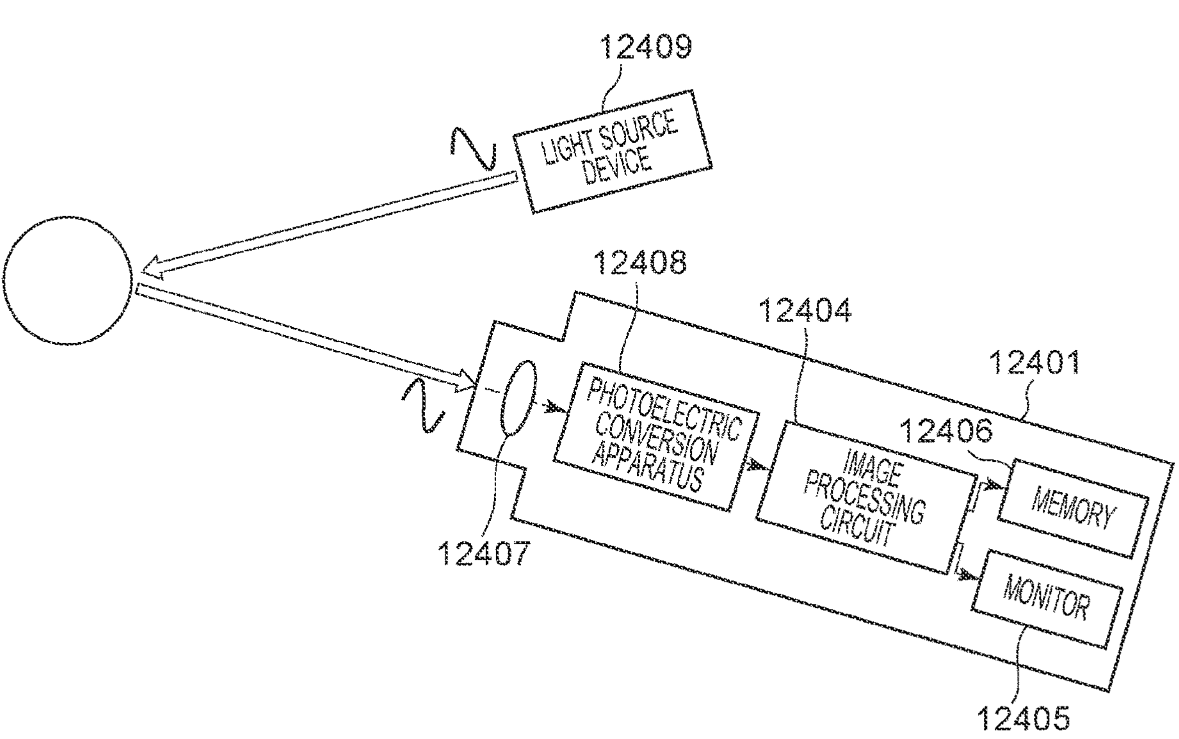
FIG. 43 is a function block diagram of a distance according to a nineteenth embodiment.

FIG. 43 is a block diagram illustrating an example of a configuration of a distance image sensor that is electronic equipment utilizing a photoelectric conversion apparatus described in the foregoing embodiments.

As illustrated in FIG. 43, a distance image sensor 12401 includes an optical system 12407 a photoelectric conversion apparatus 12408, an image processing circuit 12404, a monitor 12405, and a memory 12406. The distance image sensor 12401 is capable of obtaining a distance image that corresponds to a distance to an object by receiving light that is emitted toward the object from a light source device 12409 and is then reflected by the surface of the object (modulated light or pulsed light).

The optical system 12407 includes a single lens or a plurality of lenses, guides image light (incident light) from the object to the photoelectric conversion apparatus 12408, and forms an image on the light receiving surface (sensor portion) of the photoelectric conversion apparatus 12408.

The photoelectric conversion apparatus according to each of the foregoing embodiments can be applied to the photoelectric conversion apparatus 12408. A distance signal that indicates a distance calculated from a received-light signal outputted from the photoelectric conversion apparatus 12408 is supplied to the image processing circuit 12404.

The image processing circuit 12404 performs image processing for constructing a distance image on the basis of the distance signal supplied from the photoelectric conversion apparatus 12408. Then, the distance image (image data) obtained from the image processing is supplied to the monitor 12405 and displayed thereon or supplied to the memory 12406 and stored (recorded) therein.

In the distance image sensor 12401 having such a configuration, with the above-described photoelectric conversion apparatus, for example, it is possible to obtain a distance image that is more accurate due to an improvement in pixel characteristics.

Twentieth Embodiment

The technique according to the present disclosure (the present technique) can be applied to various products. For example, the technique according to the present disclosure may be applied to an endoscopic surgery system.

Figure 44:
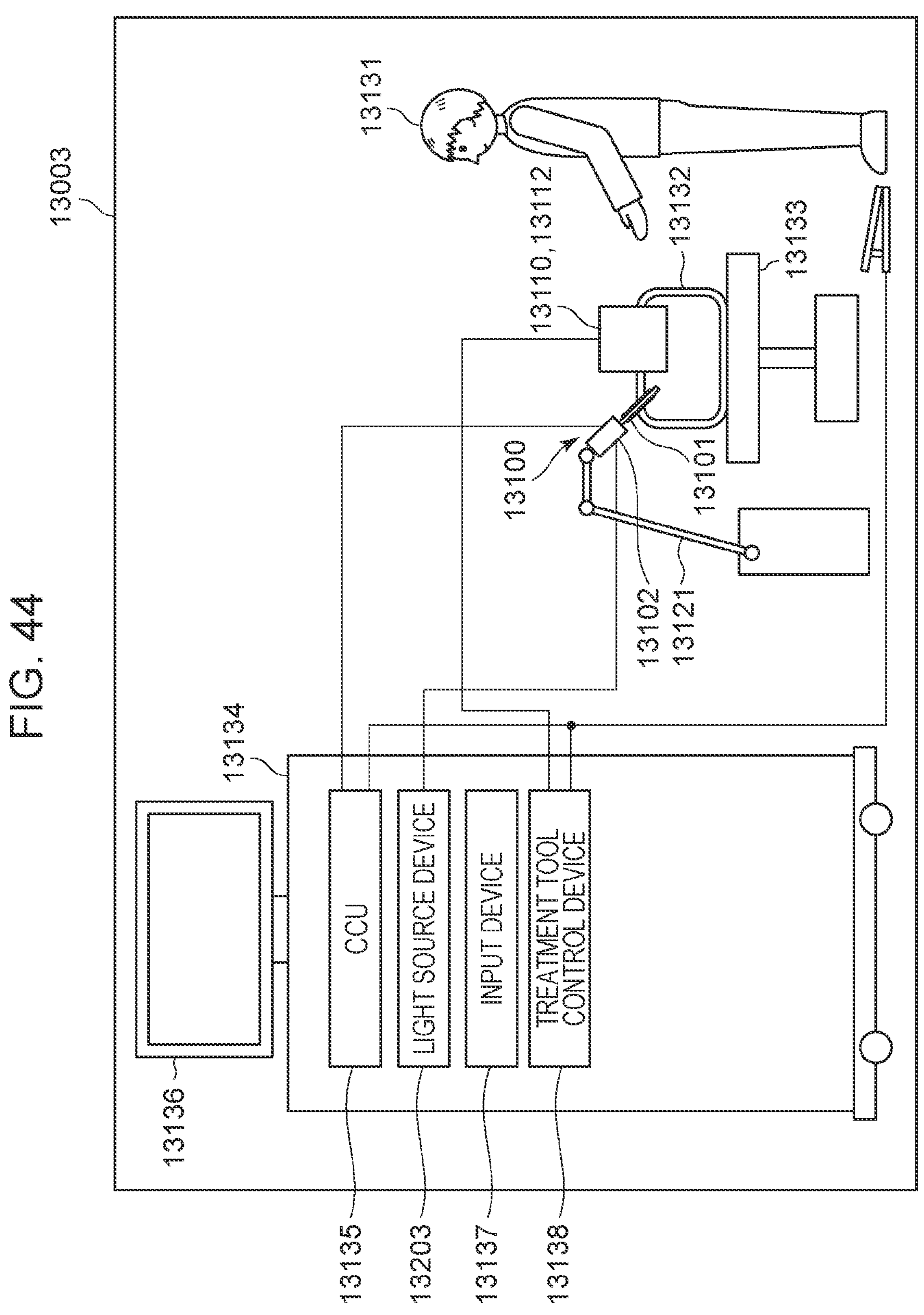
FIG. 44 is a function block diagram of endoscopic surgery according to a twentieth embodiment.

FIG. 44 is a diagram illustrating an example of a schematic configuration of an endoscopic surgery system to which the technique according to the present disclosure (the present technique) can be applied.

FIG. 44 illustrates a state where an operator (surgeon) 13131 uses an endoscopic surgery system 13003 to perform surgery on a patient 13132 lying on a patient's bed 13133. As illustrated therein, the endoscopic surgery system 13003 includes an endoscope 13100, a surgery tool 13110, and a cart 13134 on which various devices for endoscopic surgeries are installed.

The endoscope 13100 includes a barrel 13101, a part of which having a predetermined length from a head end is configured to be inserted into a body cavity of a patient 13132, and a camera head 13102 connected to a base end of the barrel 13101. In the illustrated example, the endoscope 13100 is configured as a so-called hard endoscope including the barrel 13101 having a hard structure. However, the endoscope 13100 may be configured as a so-called soft endoscope including a soft barrel.

An opening inlaid with an objective lens is provided in the head end of the barrel 13101. A light source device 13203 is connected to the endoscope 13100. Light generated by the light source device 13203 is guided to the head end of the barrel 13101 by a light guide extending inside the barrel 13101. This light is emitted toward the target of observation in the body cavity of the patient 13132 through the objective lens. The endoscope 13100 may be a direct-viewing endoscope, an oblique-viewing endoscope, or a side-viewing endoscope.

An optical system and a photoelectric conversion apparatus are provided inside the camera head 13102. Reflected light (observation light) coming from the target of observation is concentrated onto the photoelectric conversion apparatus by the optical system. The observation light is subjected to photoelectric conversion by the photoelectric conversion apparatus, and an electric signal corresponding to the observation light, that is, an image signal corresponding to an observation image, is generated. As the photoelectric conversion apparatus, the photoelectric conversion apparatus described in each of the foregoing embodiments can be used. The image signal is transmitted in the form of RAW data to a camera control unit (CCU) 13135.

The CCU 13135 is constituted by a central processing unit (CPU), a graphics processing unit (GPU), and so on and centrally controls operations of the endoscope 13100 and a display device 13136. Furthermore, the CCU 13135 receives the image signal from the camera head 13102 and performs various kinds of image processing such as, for example, development processing (de-mosaic processing) on the image signal for displaying an image based on the image signal.

The display device 13136 performs image display based on the image signal having been subjected to the image processing by the CCU 13135 under the control by the CCU 13135.

The light source device 13203 is formed of a light source such as, for example, a light-emitting diode (LED), and supplies illumination light for capturing an image of the surgery site or the like to the endoscope 13100.

An input device 13137 is an input interface for the endoscopic surgery system 13003. A user is able to input various kinds of information and instructions to the endoscopic surgery system 13003 via the input device 13137.

A treatment tool control device 13138 controls driving of an energy treatment tool 13112 used for tissue cauterization, incision, or blood vessel sealing.

The light source device 13203 configured to supply illumination light for capturing an image of the surgery site to the endoscope 13100 can be formed of a white light source that is formed of, for example, an LED, a laser light source, or a combination thereof. In a case where the white light source is formed of a combination of R, G, and B laser light sources, the output intensity and the output timing of each color (each wavelength) can be controlled with high precision and, therefore, it is possible to make a white balance adjustment of a captured image by the light source device 13203. In this case, laser beams from the respective R, G, and B laser light sources can be emitted to the target of observation in a time-divided manner, and driving of an imaging element of the camera head 13102 is controlled in synchronization with the emission timings; by this means, it is possible to capture images corresponding to R, G, and B in a time-divided manner. With this method, it is possible to obtain color images without providing a color filter to the imaging element.

Driving of the light source device 13203 may be controlled such that the intensity of output light changes at predetermined time intervals. Driving of the imaging element of the camera head 13102 is controlled in synchronization with the timing when the light intensity changes, thereby obtaining images in a time-divided manner, and, by combining these images, it is possible to generate a high-dynamic-range image free from blocked-up shadows or blown-out highlights.

The light source device 13203 may be configured to be able to supply light having a predetermined wavelength range corresponding to special-light observation. In special-light observation, for example, the wavelength dependency of light absorption in body tissues is used. Specifically, light in a band narrower than that of illumination light (that is, white light) for normal observation is emitted, and a high-contrast image of a predetermined tissue, such as a blood vessel on a mucous membrane surface, is captured. Alternatively, in special-light observation, fluorescent observation in which an image is obtained by using fluorescence generated in response to emission of excitation light may be performed. In fluorescent observation, it is possible to apply excitation light to a body tissue and observe fluorescence from the body tissue, locally inject a reagent such as indocyanine green (ICG) into a body tissue and apply excitation light corresponding to the fluorescence wavelength of the reagent to the body tissue to obtain a fluorescent image, and the like. The light source device 13203 can be configured to be able to supply narrow-band light and/or excitation light adapted for such special-light observation.

Twenty-First Embodiment

Figure 45A:
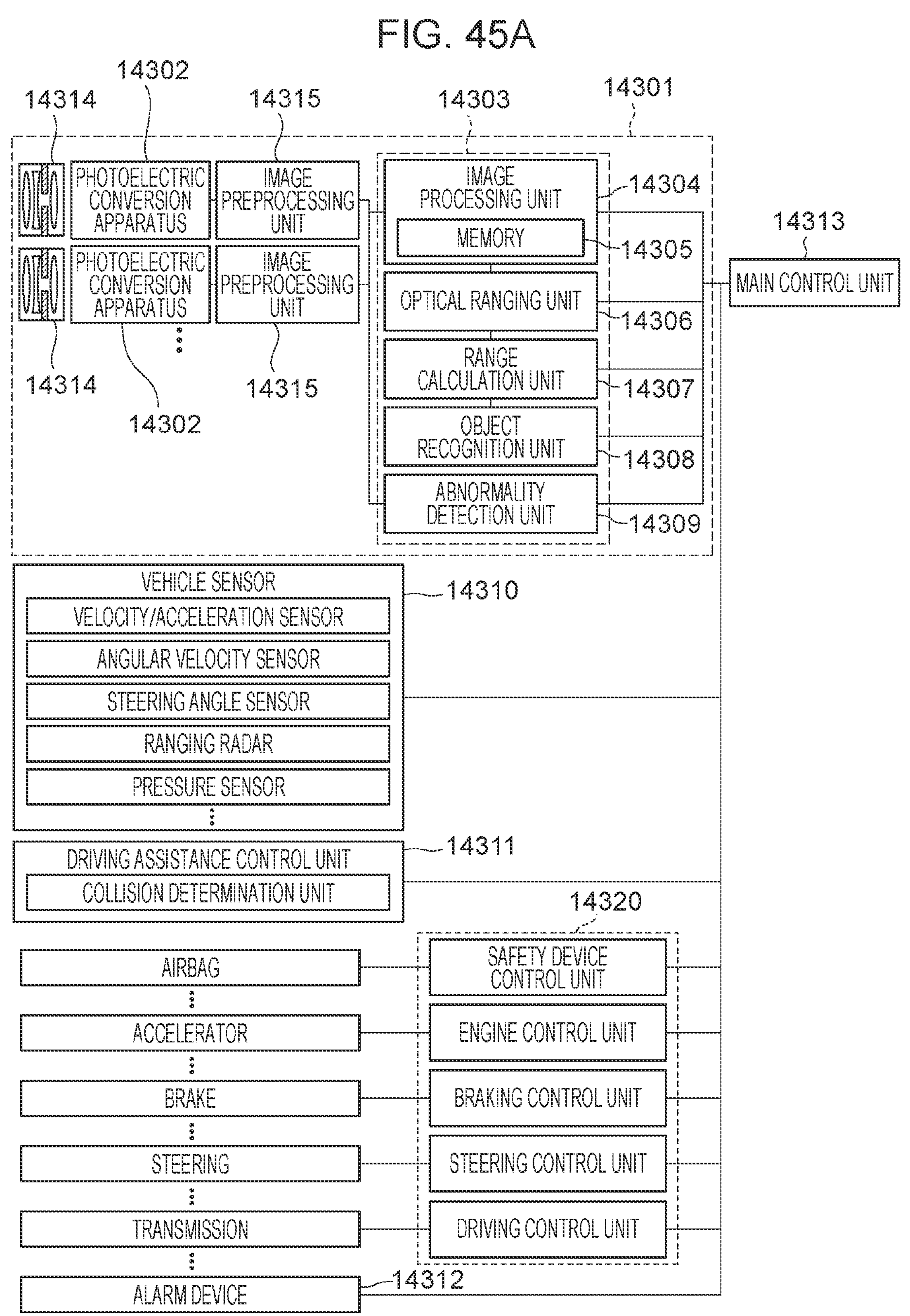
FIG. 45A is a diagram of a photoelectric conversion system and a mobile body according to a twenty-first embodiment.
Figure 45B:
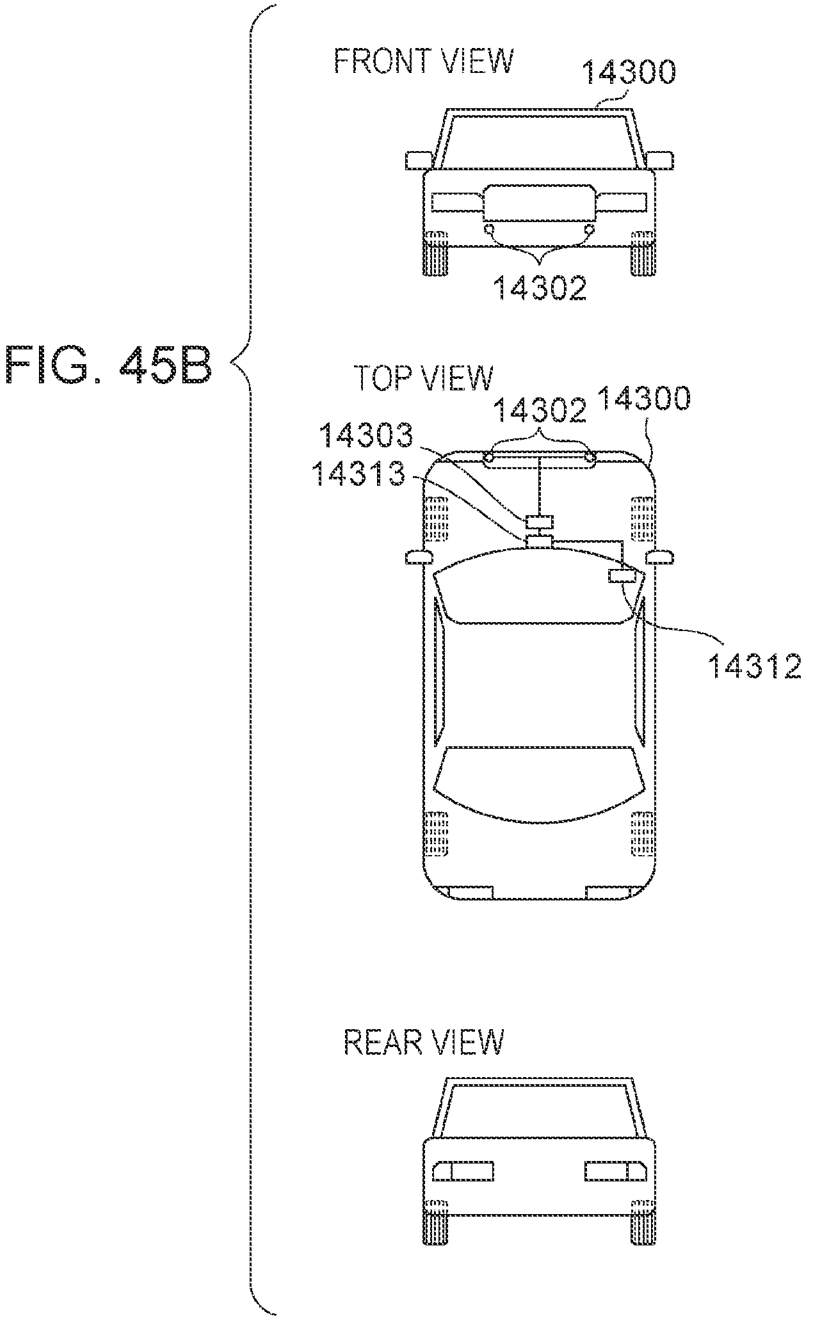
FIG. 45B is a diagram of the photoelectric conversion system and the mobile body according to the twenty-first embodiment.

A photoelectric conversion system and a mobile body according to the present embodiment will now be described with reference to FIGS. 45A and 45B and FIGS. 46A and 46B. FIGS. 45A and 45B are schematic diagrams illustrating an example of a configuration of a photoelectric conversion system and a mobile body according to the present embodiment. In the present embodiment, a vehicle-mounted camera is disclosed as an example of the photoelectric conversion system.

FIGS. 45A and 45B illustrate an example of a vehicle system and a photoelectric conversion system mounted in the vehicle system and configured to perform image capturing. A photoelectric conversion system 14301 includes photoelectric conversion apparatuses 14302, an image preprocessing unit 14315, an integrated circuit 14303, and an optical system 14314. The optical system 14314 forms an optical image of an object on the photoelectric conversion apparatus 14302. The photoelectric conversion apparatus 14302 converts the optical image of the object formed by the optical system 14314 into an electric signal. The photoelectric conversion apparatus 14302 is a photoelectric conversion apparatus according to any of the foregoing embodiments. The image preprocessing unit 14315 performs predetermined signal processing on the signal outputted from the photoelectric conversion apparatus 14302. The function of the image preprocessing unit 14315 may be integrated into the photoelectric conversion apparatus 14302. The photoelectric conversion system 14301 includes at least two sets of the optical system 14314, the photoelectric conversion apparatus 14302, and the image preprocessing unit 14315, and an output from the image preprocessing unit 14315 in each set is inputted to the integrated circuit 14303.

The integrated circuit 14303 is an integrated circuit for use in an image capturing system and includes an image processing unit 14304 including a memory 14305, an optical ranging unit 14306, a range calculation unit 14307, an object recognition unit 14308, and an abnormality detection unit 14309. The image processing unit 14304 performs image processing such as development processing and defect correction on the output signal from the image preprocessing unit 14315. The memory 14305 temporarily stores a captured image and stores the position of a defective imaging pixel. The optical ranging unit 14306 performs focusing on an object and performs ranging. The range calculation unit 14307 calculates range information from pieces of image data obtained by the plurality of photoelectric conversion apparatuses 14302. The object recognition unit 14308 recognizes objects such as cars, roads, signs, and persons. The abnormality detection unit 14309 issues an abnormality alarm to a main control unit 14313 when detecting an abnormality in the photoelectric conversion apparatus 14302.

The integrated circuit 14303 may be implemented as specifically-designed hardware, a software module, or a combination thereof. The integrated circuit may be formed of, for example, FPGA (Field Programmable Gate Array), an ASIC (Application Specific Integrated Circuit), or a combination thereof.

The main control unit 14313 centrally controls operations of the photoelectric conversion system 14301, vehicle sensors 14310, control units 14320, and the like. A method (conforming to, for example, the Control Area Network (CAN) standard) in which the main control unit 14313 is not included and the photoelectric conversion system 14301, the vehicle sensors 14310, and the control units 14320 individually have communication interfaces and individually transmit and receive control signals via a communication network can also be employed.

The integrated circuit 14303 has a function of transmitting a control signal and a set value to the photoelectric conversion apparatus 14302 in response to a control signal received from the main control unit 14313 or when commanded by a control unit included therein.

The photoelectric conversion system 14301 is connected to the vehicle sensors 14310 and can detect the traveling state of the own vehicle including a vehicle speed, a yaw rate, a steering angle, and the like, the state of an environment outside the own vehicle, and the states of others' vehicles and obstacles. The vehicle sensors 14310 are distance information obtainers that obtain information about a distance to a target object. The photoelectric conversion system 14301 is connected to a driving assistance control unit 14311 that provides various kinds of driving assistance including an automated steering function, an automated traveling function, a collision prevention function, and the like. Specifically, regarding a collision determination function, a collision with another vehicle or an obstacle is predicted and the occurrence of a collision is determined based on the results of detection by the photoelectric conversion system 14301 and the vehicle sensors 14310. By this means, control for avoiding a predicted collision is performed and a safety device is activated at the time of collision.

The photoelectric conversion system 14301 is connected also to an alarm device 14312 configured to, based on a result of determination by a collision determination unit, issue an alarm to the driver. For example, in a case where the possibility of a collision is considered to be high as the result of determination by the collision determination unit, the main control unit 14313 performs vehicle control to avoid the collision or reduce damage by, for example, applying the brakes, releasing the accelerator, or suppressing output of the engine. The alarm device 14312 alerts the user by, for example, sounding an alarm, displaying alarm information on a display screen of, for example, the car navigation system or the instrument panel, or vibrating the seatbelt or the steering wheel.

In the present embodiment, the photoelectric conversion system 14301 captures surrounding images of the vehicle, for example, forward images or rearward images. FIG. 45B illustrates an arrangement example of the photoelectric conversion system 14301 when the photoelectric conversion system 14301 captures images forward of the vehicle.

Two photoelectric conversion apparatuses 14302 are disposed on the front of a vehicle 14300. Specifically, the two photoelectric conversion apparatuses 14302 are disposed axisymmetric with respect to the center line going in the forward and rearward directions of the vehicle 14300 or the center line of the external shape thereof (for example, the vehicle width). This configuration is preferable for acquiring information about the distance between the vehicle 14300 and an object that is the target of capturing and determining the possibility of a collision. The photoelectric conversion apparatuses 14302 should preferably be disposed so as not to be obstructive to the driver's field of view when the driver sees the circumstances outside the vehicle 14300 from the driver's seat. The alarm device 14312 should preferably be disposed such that it is easily within the driver's field of view.

Although control for preventing a collision with another vehicle has been described in the present embodiment, other applications such as control for automated driving for following another vehicle or control for automated driving so as not to drift from the lane are also possible. Furthermore, the photoelectric conversion system 14301 is applicable not only to vehicles such as automobiles but also to other mobile bodies (mobile apparatuses) such as vessels, aircrafts, or industrial robots. In addition, the photoelectric conversion system 14301 is applicable not only to mobile bodies but also to a wide variety of devices that perform object recognition such as an intelligent transport system (ITS).

The photoelectric conversion apparatus according to the present invention may be configured to be able to obtain various types of information such as distance information.

Twenty-Second Embodiment

Figure 46A:
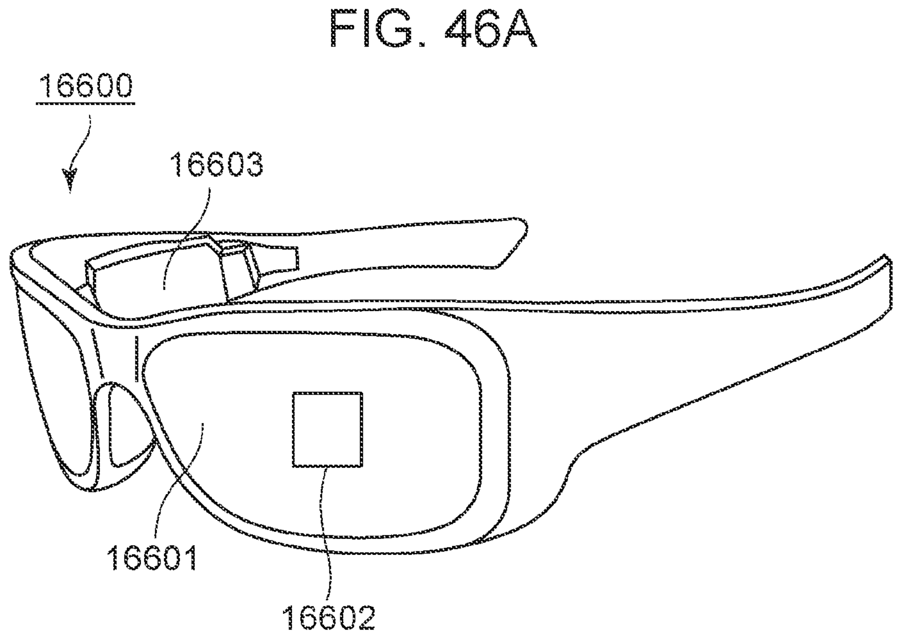
FIG. 46A is a function block diagram of endoscopic surgery according to a twenty-second embodiment.
Figure 46B:
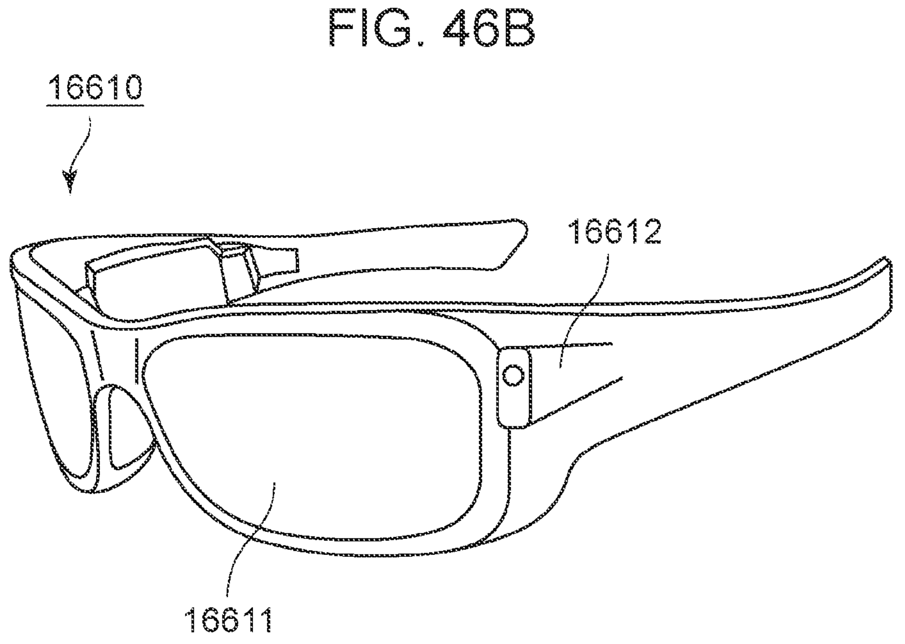
FIG. 46B is a function block diagram of endoscopic surgery according to the twenty-second embodiment.

FIGS. 46A and 46B illustrate eyewear 16600 (smart glasses) according to an application example. The eyewear 16600 includes a photoelectric conversion apparatus 16602. The photoelectric conversion apparatus 16602 is a photoelectric conversion apparatus according to each of the foregoing embodiment. A display device including a light emitting device such as an OLED or an LED may be provided on the back of a lens 16601. A single photoelectric conversion apparatus 16602, or a plurality thereof, may be provided. A combination of plural kinds of photoelectric conversion apparatuses may be used. The position where the photoelectric conversion apparatus 16602 is provided is not limited to the position illustrated in FIG. 46A.

The eyewear 16600 further includes a control device 16603. The control device 16603 functions as a power supply that supplies power to the photoelectric conversion apparatus 16602 and to the display device described above. The control device 16603 controls operations of the photoelectric conversion apparatus 16602 and the display device. An optical system for concentrating light onto the photoelectric conversion apparatus 16602 is formed in the lens 16601.

FIG. 46B illustrates eyewear 16610 (smart glasses) according to an application example. The eyewear 16610 includes a control device 16612. A photoelectric conversion apparatus corresponding to the photoelectric conversion apparatus 16602 and a display device are mounted in the control device 16612. The photoelectric conversion apparatus in the control device 16612, and an optical system for projecting light emitted from the display device, are formed in the lens 16611. An image is projected onto the lens 16611. The control device 16612 functions as a power supply that supplies power to the photoelectric conversion apparatus and the display device and controls operations of the photoelectric conversion apparatus and the display device. The control device 16612 may include a line-of-sight detection unit that detects the wearer's line of sight. To detect the line of sight, infrared rays may be used. An infrared emission unit emits an infrared ray to the eyeball of the user who is gazing at a display image. A captured image of the eyeball can be obtained by detecting reflected light coming from the eyeball irradiated with the emitted infrared ray by an image capturing unit that includes a light receiving element. A unit for reducing light coming from the infrared emission unit toward the display unit in a plan view is provided so as to suppress a decrease in image quality.

From the captured image of the eyeball obtained by performing capturing using the infrared ray, the user's line of sight toward the display image is detected. Any known method can be used for detecting the line of sight using the captured image of the eyeball. For example, a line-of-sight detection method based on a Purkinje image utilizing reflection of irradiation light at the cornea can be used.

More specifically, line-of-sight detection processing based on the pupil corneal reflection method is performed. By using the pupil corneal reflection method, and a line-of-sight vector that indicates the orientation (angle of rotation) of the eyeball is calculated based on an image of the pupil included in the captured image of the eyeball and based on the Purkinje image, thereby detecting the user's line of sight.

The display device according to the present embodiment may include a photoelectric conversion apparatus that includes a light receiving element, and a display image of the display device may be controlled based on the line-of-sight information of the user from the photoelectric conversion apparatus.

Specifically, on the display device, a first field-of-view region at which the user gazes and a second field-of-view region other than the first field-of-view region are determined based on line-of-sight information. The first field-of-view region and the second field-of-view region may be determined by a control device of the display device, or the regions determined by an external control device may be received. In the display region of the display device, the display resolution of the first field-of-view region may be controlled to be higher than the display resolution of the second field-of-view region. That is, the resolution of the second field-of-view region may be lower than that of the first field-of-view region.

The display region may include a first display region and a second display region different from the first display region, and a region having a higher degree of priority may be determined from among the first display region and the second display region on the basis of line-of-sight information. The first field-of-view region and the second field-of-view region may be determined by the control device of the display device, or the regions determined by an external control device may be received. The resolution of a region having a higher degree of priority may be controlled to be higher than the resolution of a region other than the region having a higher degree of priority. That is, a region having a relatively low degree of priority may have lower resolution.

AI may be used for determining the first field-of-view region and the region having a higher degree of priority. The AI may be a model configured to estimate the angle of the line of sight and the distance to the gazed target from the image of the eyeball while using the image of the eyeball and the actual viewing direction of the eyeball in the image as teacher data. The program of the AI may be installed in the display device, in the photoelectric conversion apparatus, or in an external device. In a case where it is installed in the external device, it is transmitted to the display device via communication.

In a case where display control is performed based on visual detection, the embodiment can be preferably applied to smart glasses that further includes a photoelectric conversion apparatus that captures an image of an external scene. Smart glasses are capable of real-time display of captured external information.

The present invention makes it possible to propose a specific configuration of a photoelectric conversion apparatus that includes three or more substrates including avalanche diodes.

Other Embodiments

Though embodiments have been described, the present invention shall not be construed to be limited to the embodiments, and various changes and modifications may be made. The embodiments may be applied to one another. That is, a part of one embodiment may be replaced with a part of another embodiment. A part of one embodiment and a part of another embodiment may be added together. A part of a certain embodiment may be omitted.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This patent application claims the benefit of priority based on Japanese Patent Application No. 2021-008439 filed on Jan. 22, 2021 and Japanese Patent Application No. 2022-000316 filed on Jan. 5, 2022. The content of the description and illustration thereof is incorporated herein by reference in its entirety.

The invention claimed is:

1. A photoelectric conversion apparatus, comprising:

a first substrate that includes a first semiconductor layer and a first wiring structure, the first semiconductor layer including a plurality of photoelectric conversion units;

a second substrate that includes a second semiconductor layer and a second wiring structure, the second semiconductor layer including a plurality of pixel circuits provided in such a way as to correspond to the plurality of photoelectric conversion units;

a third substrate that includes a third semiconductor layer and a third wiring structure, the third semiconductor layer including a signal processing circuit configured to process signals outputted from the plurality of pixel circuits;

first through-hole wiring going through the third semiconductor layer, wherein each of the plurality of photoelectric conversion units includes an avalanche diode, wherein the first substrate and the second substrate are stacked such that the first wiring structure and the second wiring structure are provided between the first semiconductor layer and the second semiconductor layer, and wherein the second substrate and the third substrate are stacked such that the third wiring structure is provided between the second semiconductor layer and the third semiconductor layer; and a pixel area where a plurality of pixels including the plurality of photoelectric conversion units is provided, wherein the first wiring structure includes a plurality of first junction portions, the second wiring structure includes a plurality of second junction portions, the plurality of first junction portions is joined to the plurality of second junction portions, respectively, thereby forming a plurality of metal junctions, and in a plan view, each of the plurality of metal junctions arranged in the pixel area is provided for corresponding one of the plurality of photoelectric conversion units.

2. The photoelectric conversion apparatus according to claim 1, further comprising:

second through-hole wiring going through the second semiconductor layer, wherein the second through-hole wiring is wiring for electric connection between wiring of the second wiring structure and wiring of the third wiring structure.

3. The photoelectric conversion apparatus according to claim 2, wherein the second through-hole wiring is wiring going through the third semiconductor layer.

4. The photoelectric conversion apparatus according to claim 2, wherein the second through-hole wiring is formed toward the third wiring structure from a surface of the third semiconductor layer that is opposite to a surface on which the third wiring structure is provided.

5. The photoelectric conversion apparatus according to claim 2, wherein the second through-hole wiring is wiring for inputting the signals outputted from the plurality of pixel circuits of the second substrate into the signal processing circuit of the third substrate.

6. The photoelectric conversion apparatus according to claim 2, wherein the second through-hole wiring is wiring for supplying a drive voltage to the plurality of pixel circuits of the second substrate and a drive voltage for the signal processing circuit of the third substrate.

7. The photoelectric conversion apparatus according to claim 1, further comprising:

third through-hole wiring going through the third semiconductor layer and the second semiconductor layer, wherein the third through-hole wiring is wiring for supplying a voltage to wiring of the second wiring structure.

8. The photoelectric conversion apparatus according to claim 7, further comprising:

fourth through-hole wiring going through the second semiconductor layer, wherein the fourth through-hole wiring is wiring for supplying a voltage to wiring of the third wiring structure, and the third through-hole wiring and the fourth through-hole wiring are not electrically connected to each other.

9. The photoelectric conversion apparatus according to claim 1, having:

a peripheral area provided between the pixel area and a chip edge portion of the photoelectric conversion apparatus.

10. The photoelectric conversion apparatus according to claim 1, wherein the second wiring structure includes a plurality of third junction portions, the third wiring structure includes a plurality of fourth junction portions, and the plurality of third junction portions is joined to the plurality of fourth junction portions respectively, thereby forming a plurality of metal junctions.

11. The photoelectric conversion apparatus according to claim 10, wherein at least one of the plurality of third junction portions is electrically connected to wiring of the first wiring structure via third through-hole wiring going through the second semiconductor layer, and an insulator is provided between the third through-hole wiring and the second semiconductor layer.

12. A photoelectric conversion system, comprising:

the photoelectric conversion apparatus according to claim 1; and a signal processing unit configured to process a signal outputted from the photoelectric conversion apparatus.

13. A mobile body, comprising:

the photoelectric conversion apparatus according to claim 1;

a distance information acquirer configured to obtain information about a distance to a target object from ranging information that is based on the signal outputted from the photoelectric conversion apparatus; and a controller configured to, based on the distance information, control the mobile body.

14. A photoelectric conversion apparatus comprising:

a first substrate that includes a first semiconductor layer and a first wiring structure, the first semiconductor layer including a plurality of photoelectric conversion units;

a second substrate that includes a second semiconductor layer and a second wiring structure, the second semiconductor layer including a plurality of pixel circuits provided in such a way as to correspond to the plurality of photoelectric conversion units;

a third substrate that includes a third semiconductor layer and a third wiring structure, the third semiconductor layer including a signal processing circuit configured to process signals outputted from the plurality of pixel circuits; and first through-hole wiring going through the third semiconductor layer, wherein each of the plurality of photoelectric conversion units includes an avalanche diode, wherein the first substrate and the second substrate are stacked such that the first wiring structure and the second wiring structure are provided between the first semiconductor layer and the second semiconductor layer, wherein the second substrate and the third substrate are stacked such that the third wiring structure is provided between the second semiconductor layer and the third semiconductor layer; and wherein a first connection number, which is a number of pieces of wiring for connecting wiring of the first wiring structure and wiring of the second wiring structure by way of a junction surface of the first substrate and the second substrate, is greater than a second connection number, which is a number of pieces of wiring for connecting wiring of the second wiring structure and wiring of the third wiring structure by way of a junction surface of the second substrate and the third substrate; and a pixel area where the plurality of photoelectric conversion units is provided, wherein in the pixel area, the first connection number is greater than the second connection number.

15. A photoelectric conversion apparatus comprising:

a first substrate that includes a first semiconductor layer and a first wiring structure, the first semiconductor layer including a plurality of photoelectric conversion units;

a second substrate that includes a second semiconductor layer and a second wiring structure, the second semiconductor layer including a plurality of pixel circuits provided in such a way as to correspond to the plurality of photoelectric conversion units;

a third substrate that includes a third semiconductor layer and a third wiring structure, the third semiconductor layer including a signal processing circuit configured to process signals outputted from the plurality of pixel circuits;

first through-hole wiring going through the third semiconductor layer; and a time measurement circuit, wherein each of the plurality of photoelectric conversion units includes an avalanche diode, the first substrate and the second substrate are stacked such that the first wiring structure and the second wiring structure are provided between the first semiconductor layer and the second semiconductor layer, the second substrate and the third substrate are stacked such that the third wiring structure is provided between the second semiconductor layer and the third semiconductor layer, the time measurement circuit is provided in the second substrate, and the time measurement circuit is shared by the plurality of photoelectric conversion units.

16. The photoelectric conversion apparatus according to claim 15, wherein in a plan view, the time measurement circuit shared by the plurality of photoelectric conversion units overlaps with at least a part of the plurality of photoelectric conversion units sharing the time measurement circuit.

* * * * *